(12) United States Patent
Iijima et al.

(10) Patent No.: US 6,664,157 B2
(45) Date of Patent: Dec. 16, 2003

(54) SEMICONDUCTOR INTEGRATED CIRCUIT DEVICE AND THE METHOD OF PRODUCING THE SAME

(75) Inventors: Shinpei Iijima, Akishima (JP); Yoshitaka Nakamura, Ome (JP); Masahiko Hiratani, Akishima (JP); Yuichi Matsui, Kokubunji (JP); Naruhiko Nakanishi, Hachiouji (JP)

(73) Assignee: Hitachi, Ltd., Tokyo (JP)

( * ) Notice: Subject to any disclaimer, the term of this patent is extended or adjusted under 35 U.S.C. 154(b) by 145 days.

(21) Appl. No.: 09/775,547

(22) Filed: Feb. 5, 2001

(65) Prior Publication Data

US 2001/0038114 A1 Nov. 8, 2001

(30) Foreign Application Priority Data

Feb. 4, 2000 (JP) .......................... 2000-027998

(51) Int. Cl.$^7$ .......................... H01L 21/8242
(52) U.S. Cl. .................. 438/238; 438/240; 438/313
(58) Field of Search ................ 438/330, 238, 438/313, 240, 241, 328, 253, 622, 666, 791, 631, 624; 257/303, 304, 301, 310, 295, 751

(56) References Cited

U.S. PATENT DOCUMENTS 6,423,593 B1 * 7/2002 Yamamoto et al. ......... 438/240

OTHER PUBLICATIONS

"Applied Physics", Japanese Academy of Applied Physics, vol. 65, No. 11, Nov. 10, 1996, pp. 1111–1112.

* cited by examiner

Primary Examiner—Roy Potter
(74) Attorney, Agent, or Firm—Antonelli, Terry, Stout & Kraus, LLP

(57) ABSTRACT

Plug electrodes of silicon are formed so as to be buried in through holes in a first insulating film, the plug electrodes being electrically connected to the source and drain regions of a MISFET on the main surface of a semiconductor substrate. Then, a second insulating film is deposited thereon and holes are formed therein such that the plug electrodes of silicon are exposed. A barrier film is formed on the surfaces of the silicon plugs, and in the holes a dielectric is formed to form lower electrodes of the capacitor elements and an upper electrode therefor.

32 Claims, 50 Drawing Sheets

SEMICONDUCTOR INTEGRATED CIRCUIT DEVICE AND THE METHOD OF PRODUCING THE SAME

BACKGROUND OF THE INVENTION

The present invention relates to a semiconductor integrated circuit device and to a method of producing the same. More specifically, the invention relates to technology that can be effectively applied to a semiconductor integrated circuit device having a DRAM (dynamic random access memory).

Memory cells in a DRAM are generally arranged at intersecting points of plural word lines and plural bit lines that are arranged in the form of a matrix on a main surface of a semiconductor substrate. Each memory cell is constituted by a MISFET (metal insulator semiconductor field-effect transistor) that selects it and a data-accumulating capacitor element (capacitor) connected in series with the MISFET.

The MISFET for selecting the memory cell is formed in an active-region surrounded by a device isolation region, and it is constituted chiefly by a gate oxide film, a gate electrode formed integrally with a word line, and a pair of semiconductor regions forming a source and a drain. Two MISFETs are usually formed in one active region, and the source and drain (semiconductor regions) of one of the two MISFETs are shared at the central portion of the active region. A bit line is arranged on the MISFET and is electrically connected to the semiconductor regions that are shared. The capacitor is arranged on the MISFET and is electrically connected to the other source and drain.

In a DRAM having a capacitor-over-bit-line (COB) structure in which the capacitor is arranged on the bit line, the lower electrode (accumulator electrode) of the capacitor arranged on the bit line is formed to have a cylindrical shape, and a capacitor insulating film and an upper electrode (plate electrode) are formed on the lower electrode. The lower electrode is formed to have a cylindrical shape to increase the surface area thereof, in an attempt to compensate for a reduction in the electric charge (Cs) accumulated in the capacitor caused by the fact that the memory cell is finely formed. In the memory cell having a COB structure as described above, the capacitor must be constructed to have a three-dimensional structure to a conspicuous degree from the standpoint of maintaining reliable operation as a semiconductor memory device.

Even by constructing the capacitor to have a three-dimensional structure, a difficulty can be expected in maintaining the required capacitance (accumulated electric charge) in modern integrated semiconductor devices and, particularly, in the DRAMs produced after those corresponding to 256 Mbits (megabits).

A study has been made of the use of a highly dielectric material (ferroelectric material), such as tantalum oxide ($Ta_2O_5$), STO ($SrTiO_3$) or BST ($Ba_xSr_{1-x}TiO_3$), as an insulating film for a capacitor, as described in "Applied Physics", Vol. 65, No. 11, published by Japanese Academy of Applied Physics, Nov. 10, 1996, pp. 1111–1112. $Ta_2O_5$ has a specific inductive capacity of as high as about 40, and STO and BST have specific inductive capacities that are very high, such as about 200 to 500. By using these films having high specific inductive capacities, therefore, it becomes easy to realize a large capacity compared to use of the traditionally used silicon oxide film and silicon nitride film. In particular, STO and BST exhibit high dielectric constants, and a greatly increased capacity can be expected.

The lower electrode of the capacitor is connected to the source and drain of the MISFET through a plug, and a reaction-preventing layer is formed for preventing the reaction of ruthenium forming the lower electrode with a plug material (silicon).

SUMMARY OF THE INVENTION

When a DRAM having the above structure is highly densely integrated, however, there occurs a problem of deviation in matching relative to an underlying silicon plug at the time of patterning the lower electrode of the capacitor. That is, in the highly dense DRAMs produced after the 256-megabit DRAM, the size of the silicon plug in the transverse direction is nearly equal to the size of the lower electrode in the transverse direction. In such a dimensional region, the pattern of the lower electrode is deviated relative to the underlying pattern (silicon plug) at the time of effecting the patterning for forming the lower electrode, relying upon photolithography. Due to this deviation in matching, the plug member is partly exposed. The presence of the exposed portion permits the dielectric (capacitor-insulating film) to come into direct contact with the plug member, whereby a leakage current increases, making it no longer possible to accomplish a desired insulation property,. This will be described in further detail with reference to FIGS. 60($a$) to 62($c$).

FIGS. 58($a$) to 58($c$) illustrate the case of a dimensional balance in a DRAM developed before the 64-M DRAM. In this case, there is a margin in the size of the lower electrode relative to the size of the plug, so that some degree of deviation in matching causes no problem. A ruthenium film 402 is formed on the whole surface of an Si plug 401, and a photoresist film 403 is patterned by photolithography (FIG. 58($a$)). Here, the photoresist film 403 is formed such that it is deviated by a distance d from an ideal patterning position (indicated by dotted lines). The ruthenium film 402 is machined by anisotropic dry-etching to form a lower electrode 404 of ruthenium (FIG. 58($b$)). The photoresist film 403 is removed, a dielectric film 405 is formed (FIG. 58($c$)), and, then, an upper ruthenium electrode is formed. Here, the size of the lower electrode 404 has a margin relative to the plug 401. Therefore, the Si plug 401 is not exposed in machining the ruthenium film 402 to form the lower electrode 404.

Referring to FIGS. 59($a$) and 59($b$), on the other hand, when the size of the plug becomes close to the size of the lower electrode, a deviation in matching occurs, which is a problem to be solved by this invention. The Si plug 407 is formed at a predetermined position in the insulating film 406, and a lower ruthenium electrode 408 is formed in the same manner as in FIG. 59($a$). Here, the lower electrode 408 is formed such that it is deviated by a distance d from an ideal pattern position (indicated by dotted lines). The size of the lower electrode 408 is equal to the size of the plug 407; and, hence, the Si plug 407 is partly exposed due to a deviation in matching by the distance d (portion indicated by an arrow A in FIG. 59($a$)). A dielectric film 409 formed in this state (FIG. 59($b$)) is brought into direct contact with the Si plug 407 (portion in the circle B in FIG. 59($b$)), and the dielectric strength of the dielectric film 409 decreases at the portion B, whereby a leakage current increases, making it no longer possible to maintain the memory function.

FIGS. 60($a$) to 60($c$) illustrate a case where a silicide film is provided to prevent a thermal reaction between ruthenium, used as the lower electrode, and the Si plug. After an Si plug 411 is formed in a predetermined region of the insulating film 410, a silicide film 412 is formed on the surface thereof, and a ruthenium film 413 is formed on the whole surface thereof (FIG. 60(*a*)). The ruthenium film 413 is machined by the method mentioned above to form a lower electrode 414 (FIG. 60(*b*)). In this case, too, deviation occurs in the matching by a distance d, and the Si plug 411 is partly exposed (portion indicated by an arrow A in FIG. 60(*b*)). That is, the silicide film 412, too, is etched at the time of machining the ruthenium film 413, and the Si plug 411 is partly exposed. A dielectric film 415 that is formed in this state comes into direct contact with the Si plug 411 at a portion indicated by circle B in FIG. 60(*c*). Therefore, the leakage current inevitably increases and it becomes difficult to maintain a normal memory function.

It is therefore an object of this invention to provide a semiconductor integrated circuit device having a structure in which a dielectric (capacitor-insulating film) that is subsequently formed does not come into contact with the underlying plug even when the lower electrode of the capacitor is formed such that it is deviated from the underlying plug, and a method of producing the same.

Another object of this invention is to maintain a desired capacity by forming the lower electrode using ruthenium in a three-dimensional form, by increasing the surface area of the capacitor and by increasing the dielectric constant of the capacitor-insulating film.

A further object of this invention is to form a capacitor-insulating film in plural layers, to increase the life of the capacitor before it is broken down, to decrease drop-out bits of the memory cells and to enhance the reliability of the semiconductor integrated circuit device.

The above and other objects as well as novel features of the invention will become obvious from the description provided in this specification and from the accompanying drawings.

Briefly described below are representative examples of the features of the present invention is disclosed in this application.

The above problem is solved by forming an underlying silicon plug, first covering the whole surface thereof with an insulating film, forming an opening in the insulating film so as to make a connection to the silicon plug, and then forming a silicide film in a self-aligned manner on only the surface of the plug that is exposed in the bottom of the opening.

The opening, i.e., the side wall in the opening, is used as a capacitor region. Upon controlling the thickness of the insulating film forming the opening, therefore, the height of the capacitor is maintained, and, hence, the area of the capacitor can be increased. By using ruthenium as the lower electrode, further, the dielectric constant of the dielectric is not decreased and a desired capacity is maintained.

By using ruthenium as the lower electrode and silicon as the plug, a reaction takes place between the ruthenium and the silicon during heat treatment to form ruthenium silicide. The volume expands while the silicide is being formed causing the shape of the capacitor to become abnormal. The abnormal shape could become a cause of an increase in the leakage current through the dielectric (capacitor-insulating film) Therefore, the silicide film is at least formed prior to forming the dielectric.

Further, a very thin oxide film is formed on the surface of the ruthenium silicide, after the silicide film is formed, but prior to forming the lower electrode of ruthenium. The thin oxide film works to suppress the silicide reaction from reaching the lower electrode. Despite the fact that the heat treatment is effected for crystallizing and reforming the dielectric after the dielectric has been formed, the shape of the capacitor does not become abnormal, and an increase in the leakage current through the capacitor-insulating film (dielectric) is avoided.

The dielectric can be selected from tantalum oxide, titanium oxide, barium strontium titanate, barium titanate and strontium titanate, and can be used in the form of a single-layer film or a laminated-layer film of at least one material, or a laminated-layer film of different materials. In the case of the single-layer film, the leakage current of the capacitor may not finally be suppressed at the time when the semiconductor integrated circuit device is completed. It is therefore desirable to employ a laminated-layer structure from the standpoint of maintaining reliability.

In accordance with this invention, the capacitor must have a three-dimensional structure such that the height of the lower electrode is larger than the size thereof in the transverse direction. When a dielectric is formed to have such a three-dimensional lower electrode structure, the condition must be so selected that the film is formed while maintaining a uniform thickness even on the top of the three-dimensional structure and on the bottom thereof. The film is formed by the CVD method. When the above material is formed by the CVD method, an organometallic compound is used as the starting material. Though the film is formed over a temperature range of from about 350° C. to about 500° C., organic matters contained in the starting material are inevitably transferred into the film. Further, the dielectric film formed on the lower electrode over the above temperature range becomes amorphous. The impurities that are contained therein and the amorphous structure are detrimental to the stability of the capacitor. In particular, the stability very sensitively fluctuates depending upon the temperature and this makes it difficult to maintain the reliability of the semiconductor integrated circuit device. In order to stabilize the capacitor, the film that is formed is heat-treated so as to be crystallized. This can be accomplished at a temperature of roughly not higher than 750° C. though the temperature for crystallization differs depending upon the material of the dielectric and the material of the lower electrode. As the film is crystallized, organic impurities are mostly expelled out of the film. Besides, the film itself becomes dense and does not absorb impurities again even when it is left to stand, unlike that of the amorphous films. Through the crystallization, the capacitor exhibits greatly stabilized properties and does not lose stability even when it is heat-treated at about 400° C. in a step of forming wirings after the step of forming the capacitor.

Upon crystallizing the capacitor-insulating film (dielectric) as described above, the capacitor properties are stabilized and the capacitor insulating film exhibits an increased dielectric constant. The crystallization, however, is accompanied by the occurrence of a new problem, which is the formation of grain boundaries where the thickness of the film becomes smaller than that of other portions. As a result, the electric field is concentrated to a conspicuous degree at the grain boundaries and dielectric breakdown tends to occur. This results in a decrease in the long-term reliability required for the semiconductor integrated circuit devices and a decreased value as a product. This problem can be overcome if the film could be transformed into a single crystal instead of being polycrystallized which, however, is difficult to realize. This problem becomes more conspicuous when a thick dielectric of a single layer is crystallized. A decrease in the reliability caused by the grain boundaries can be advantageously prevented by forming the capacitor-insulating film to have a laminated-layer structure.

Basically, the grain boundaries may be disconnected among the films neighboring up and down by employing a multi-layer structure even though the grain boundaries may exist. in each film. It is further desired to crystallize thin films, layer by layer, and to stack them. The present inventors have observed the effect of laminated-layer structures of tantalum oxide, relying upon an electric breakdown light-emission method, and have discovered the fact that when the capacitor is formed by crystallizing a single layer having a predetermined thickness, the dielectric breakdown occurs at a given point at all times, but when the capacitor is formed by laminating thin crystallized films up to a predetermined thickness, the capacitor as a whole starts emitting light and the breakdown is concentrated at one point at a last point of breakdown. It is, therefore, obvious that the single-layer film contains many portions where the dielectric breakdown easily occurs, whereas the dielectric film of a multi-layer structure, for preventing the film from becoming thin at the grain boundaries, is very strong against dielectric breakdown. In order to draw out the above effect, further, it is very important to select the upper electrode that is formed on the dielectric in contact therewith and, hence, to select an electrode material that does not trigger a reaction with the dielectric and the conditions of formation.

In accordance with this invention, the upper electrode is formed of ruthenium by the CVD method. Further, titanium nitride can be used when at least tantalum oxide or titanium oxide is formed as the uppermost layer.

Constitutions of the invention will now be described.

The invention is concerned with a method of producing a semiconductor integrated circuit device having a semiconductor region on a main surface of a semiconductor substrate and having a capacitor element that includes a first electrode, a dielectric film and a second electrode in an upper layer on the main surface, comprising the steps of: forming the semiconductor region on the main surface of the semiconductor substrate; forming a first insulating film on the semiconductor region; forming a first electric conductor in the first insulating film; forming a second insulating film on the first insulating film; forming an opening in the second insulating film to expose part of the first electric conductor on the bottom of the opening; forming a barrier film on the surface of the first electric conductor in the opening; forming the first electrode in the opening so as to be electrically connected to the semiconductor region through the barrier film and the first electric conductor; forming the dielectric film on the first electrode; heat-treating the dielectric film in an oxidizing atmosphere; and forming the second electrode on the dielectric film. Here, the semiconductor region may be either a source region o-r a drain region of a MISFET formed on the main surface of the semiconductor substrate.

Further, the second insulating film is constituted by a first insulating film and a second insulating film formed on the first insulating film, and the step of forming the opening includes the steps of: etching the second insulating film under a condition where the rate of etching the second insulating film is larger than the rate of etching the first insulating film; and etching the first insulating film on the bottom in the opening formed in the second insulating film. In this case, the first insulating film is constituted by silicon nitride and the second insulating film is constituted by silicon oxide.

The first electric conductor is constituted by an electrically conducting film containing silicon, and provision is further made of a step of forming a silicide film on the first electric conductor exposed on the bottom in the opening. In this case, the step of forming the silicide film may include the steps of forming a metal film on the first electric conductor exposed on the bottom of the opening, and converting the metal film into a silicide through heat treatment. Further, the metal film is constituted by ruthenium, titanium or cobalt. or, the step of forming the barrier film may include the step of oxidizing the silicide film.

Further, the step of forming the first electric conductor may include the steps of forming an opening in the first insulating film, forming an electrically conducting connection member comprising silicon as a main component in the opening, and forming a silicide film on the electrically conducting connection member. In this case, the silicide film is constituted by ruthenium silicide, titanium silicide or cobalt silicide. Or, the step of forming the barrier film includes the step of oxidizing the surface of the first electric conductor exposed on the bottom of the opening.

Further, the step of forming the barrier film may include the step of forming the barrier film in the opening by a sputtering method or a CVD method. In this case, the barrier film is constituted by titanium nitride, tungsten nitride, tungsten nitride silicide, titanium nitride silicide or tantalum nitride silicide.

Further, the step of forming the first electrode may include the steps of forming a first metal film in the opening by a sputtering method, and forming a second metal film on the first metal film by a CVD method. In this case, the first and second metal films can be constituted by ruthenium or platinum. Or, in forming the first electrode, the thicknesses of the first and second metal films may be so adjusted as to reflect the shape of a dent of the opening such that the dent-remains in the upper surface thereof, and the dielectric film and the second electrode may be formed on the first electrode that includes an inner wall of the dent.

Provision is further made of the step of exposing the side walls of the first electrode by removing, by etching, the second insulating film surrounding the first electrode under a condition such that the rate of etching the second insulating film is larger than the rate of etching the first insulating film, and the dielectric film is formed even on the exposed side wall of the first electrode. Further, the step of forming the dielectric film includes the step of heat treatment for crystallizing the dielectric film.

Further, provision is made of the step of heat-treating the dielectric film in a nonoxidizing atmosphere prior to the step of heat-treating the dielectric film in an oxidizing atmosphere. In this case, the dielectric film is constituted by a tantalum oxide film, and the heat-treating temperature is in a range of from 500 to 750° C.

Further, the step of forming the dielectric film may include the steps of forming a tantalum oxide film on the first electrode, heat-treating the tantalum oxide film in a nonoxidizing atmosphere, and forming a second dielectric film on the tantalum oxide film after the heat treatment. In this case, the second dielectric film may be a tantalum oxide film or a barium strontium titanate film.

Further, the dielectric film is constituted by a laminate of plural dielectric films. Further, the dielectric film is constituted by a single-layer film or a plural-layer film of one kind or plural kinds selected from a tantalum oxide film, a titanium oxide film, a barium strontium titanate film, a barium titanate film, and a strontium titanate film. Further, the second electrode can be constituted by ruthenium or titanium nitride.

The invention is concerned with a method of producing a semiconductor integrated circuit device having a memory cell that includes a MISFET and a capacitor element on the main surface of a semiconductor substrate, comprising the steps of: forming a MISFET on the main surface of the semiconductor substrate; forming an electric conductor that electrically connects to the source and drain regions of the MISFET; forming an insulating film on the electric conductor; forming an opening in the insulating film; forming, in the opening, a lower electrode of the capacitor element having a first ruthenium film; forming, on the first ruthenium film, a dielectric film of the capacitor element having a tantalum oxide film; and forming, on the dielectric film, an upper electrode of the capacitor element having a second ruthenium film.

In this case, the step of forming the dielectric film of the capacitor element further includes the steps of heat treatment at 500 to 750° C. in a nonoxidizing atmosphere, and heat treatment at 500 to 700° C. in an oxidizing atmosphere or, the step of forming the dielectric film of the capacitor element includes the steps of: forming a first tantalum oxide film; heat-treating the first tantalum oxide film for crystallization; forming a second tantalum oxide film; and heat-treating the second tantalum oxide film in an oxidizing atmosphere.

The invention is concerned with a method of producing a semiconductor integrated circuit device having a memory cell that includes a MISFET and a capacitor element on the main surface of a semiconductor substrate, comprising the steps of: forming the MISFET on the main surface of the semiconductor substrate; forming a first insulating film on the MISFET; forming a first opening in the first insulating film; forming an electrically conducting connection member in the first opening; forming a second insulating film on the first insulating film; forming a second opening in the second insulating film, and forming an electrically conducting connection member on the bottom of the second opening; forming a barrier film in the second opening; forming a first metallic connection member on the barrier film in the second opening; forming a third insulating film on the second insulating film; forming a third opening in the third insulating film to expose the metallic connection member on the bottom of the third opening; forming a lower electrode in the third opening so as to be electrically connected to the source and drain regions of the MISFET through the metallic connection member, barrier film and electrically conducting connection member; forming a dielectric film on the lower electrode; heat-treating the dielectric film in an oxidizing atmosphere; and forming an upper electrode on the dielectric film.

The invention is concerned with a method of producing a semiconductor integrated circuit device having a semiconductor region and a capacitor element that includes a first electrode, a dielectric film and a second electrode on a main surface of a semiconductor substrate, comprising the steps of: forming the semiconductor region on the semiconductor substrate; forming a first insulating film on the semiconductor region; forming a first electric conductor in the first insulating film; forming a second insulating film on the first insulating film; forming an opening in the second insulating film to expose the first electric conductor on the bottom of the opening; forming a barrier film on the bottom of the opening; forming a first electrode in the opening so as to be electrically connected to the semiconductor region through the barrier film and the first electric conductor; forming a dielectric film on the first electrode in an oxidizing atmosphere; and forming a second electrode on the dielectric film.

A semiconductor integrated circuit device of this invention comprises a semiconductor region on the main surface of a semiconductor substrate, a first insulating film on the semiconductor region, a first electric conductor in the first insulating film, a second insulating film on the first insulating film, a first electrode formed in the second insulating film so as to be electrically connected to a portion of the first electric conductor, a second electrode opposed to the first electrode, and a dielectric film formed between the first electrode and the second electrode, wherein a metal silicide film is formed between the first electrode and the first electric conductor, and a barrier film is formed between the metal silicide film and the first electrode.

In this case, the metal silicide film is formed so as to be buried in the opening formed in the first insulating film. Or, the metal silicide film is formed on the surface of the first electric conductor which is self-aligned relative to the opening formed in the second insulating film and is positioned at the portion of the opening. Or, the metal silicide film may cover the bottom of the opening formed in the second insulating film.

Further, the barrier film may be formed so as to be self-aligned to the opening formed in the second insulating film, or it may be formed on the bottom only of the opening formed in the second insulating film.

Further, a semiconductor integrated circuit device of this invention comprises a semiconductor region on the main surface of a semiconductor substrate, a first insulating film on the semiconductor region, a first electric conductor in the first insulating film, a first electrode formed like a pole and which is electrically connected to a portion of the first electric conductor, a second electrode opposed to the first electrode, and a dielectric film formed between the first electrode and the second electrode, wherein a metal silicide film is formed between the first electrode and the first electric conductor, a barrier film is formed between the metal silicide film and the first electrode, the metal silicide film has either a first constitution in which it is formed so as to be buried in the opening formed in the first insulating film or a second constitution in which it is formed on the surface of the first electric conductor on a region where the first electrode and the first conductor are in contact with each other, and the barrier film has either a first constitution in which it is formed on a region where the first electrode and the first electric conductor are in contact with each other or a second constitution in which it is formed on the whole bottom surface of the first electric conductor.

In the case of the above semiconductor integrated circuit device, the metal silicide film may be any one of a ruthenium silicide (RuSi) film, a titanium silicide (TiSi) film or a cobalt silicide (CoSi) film, and the barrier film may be any one of a ruthenium silicide film, an oxide film of a titanium silicid6 film or a cobalt silicide film, or a titanium nitride (TiN) film, a tungsten nitride (WN) film, a tungsten nitride silicide (WNSi) film, a titanium nitride-silicide (TiNSi) film or a tantalum nitride silicide (TaNSi) film. Further, the. dielectric film may be a single-layer film or a plural-layer film of one kind or plural kinds selected from a tantalum oxide film, a titanium oxide film, a barium strontium titanate film, a barium titanate film and a strontium titanate film. Further, the second electrode may be constituted by ruthenium or titanium nitride.

Further, a semiconductor integrated circuit device of this invention comprises a semiconductor region on the main surface of a semiconductor substrate, a first insulating film on the semiconductor region, a first electric conductor in the first insulating film, a second insulating film on the first insulating film, a first electrode formed in the second insulating film so as to be electrically connected to a portion of the first electric conductor, a second electrode opposed to the first electrode, and a dielectric film formed between the first electrode and the second electrode, wherein a barrier film is formed between the first electrode and the first electric conductor, the barrier film being self-aligned to the opening formed in the second insulating film. In this case, the barrier film may be a silicon oxide film.

Further, a semiconductor integrated circuit device of this invention comprises a semiconductor region on the main surface of a semiconductor substrate, a first-insulating film on the semiconductor region, a first electric conductor in the first insulating film, a second insulating film on the first insulating film, a second electric conductor in the second insulating film, a first electrode electrically connected to a portion of the second electric conductor, a second electrode opposed to the first electrode, a dielectric film formed between the first electrode and the second electrode, wherein a metal silicide film is formed between the first electric conductor and the second electric conductor, the second electric conductor being formed of ruthenium. In this case, a barrier film may be formed between the metal silicide film and the second electrode.

Further, the metal silicide film may be any one of a ruthenium silicide (RuSi) film, a titanium silicide (TiSi) film or a cobalt silicide (CoSi) film, and the barrier film may be any one of a ruthenium silicide film, an oxide film of a titanium silicide or a cobalt silicide film, or a titanium nitride (TiN) film, a tungsten nitride (WN) film, a tungsten nitride silicide (WNSi) film, a titanium nitride silicide (TiNSi) film or a tantalum nitride silicide (TaNSi) film.

DETAILED DESCRIPTION OF THE PREFERRED EMBODIMENTS

Figure 1:
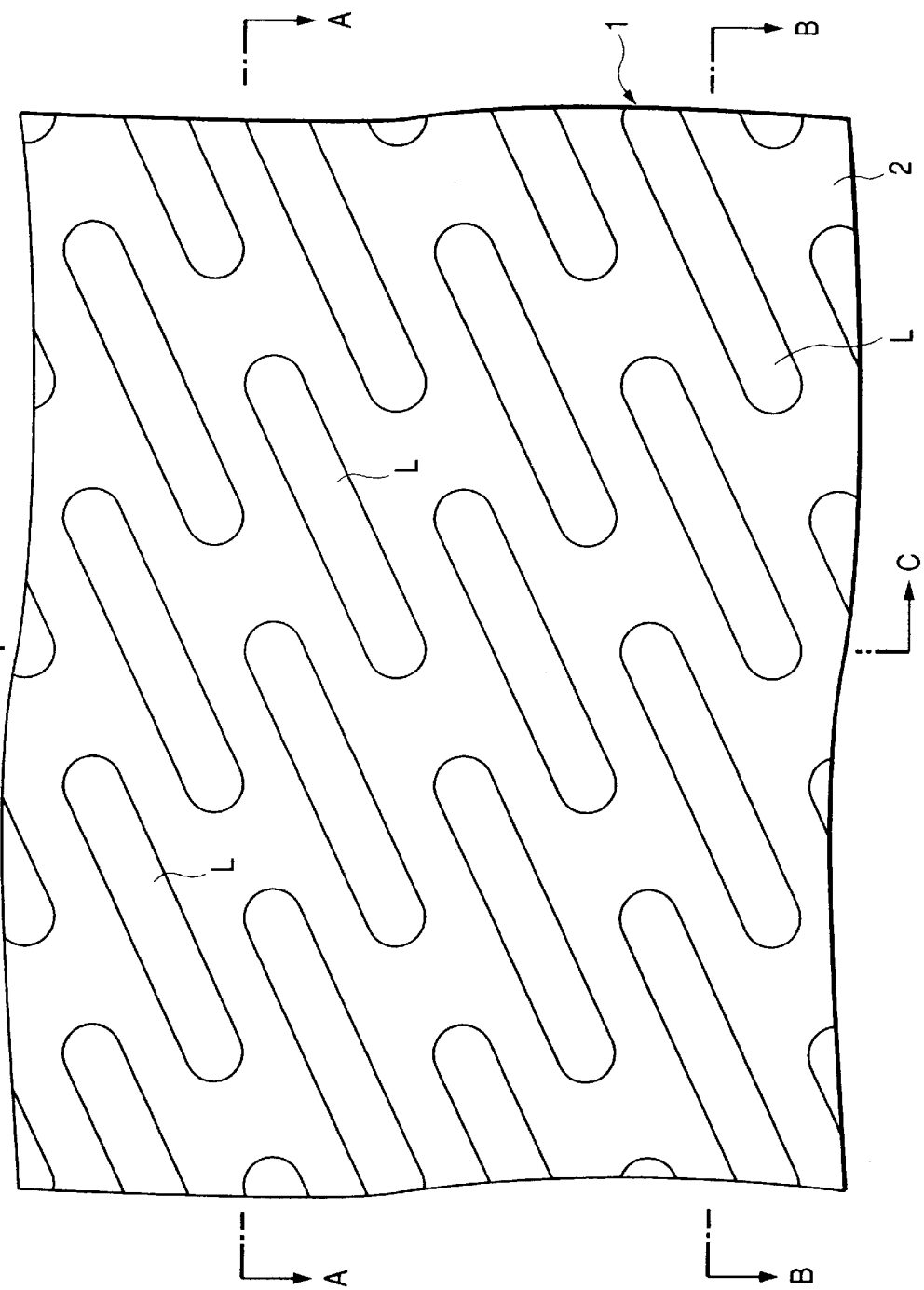
FIG. 1 is a plan view illustrating a step in the production of a DRAM according to an embodiment 1 of this invention in the order of steps.

Embodiments of the invention will now be described in detail with reference to the drawings. In the drawings illustrating the embodiments, members having the same function are denoted by the same reference numerals, but their description is not repeated.

Embodiment 1.

Figure 2:
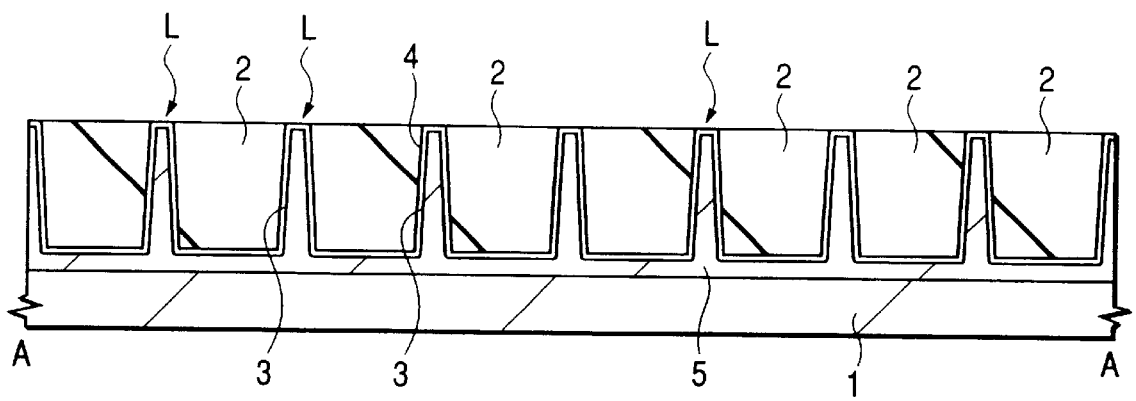
FIG. 2 is a sectional view illustrating a step in the production of the DRAM according to the embodiment 1 in the order of steps.
Figure 3:
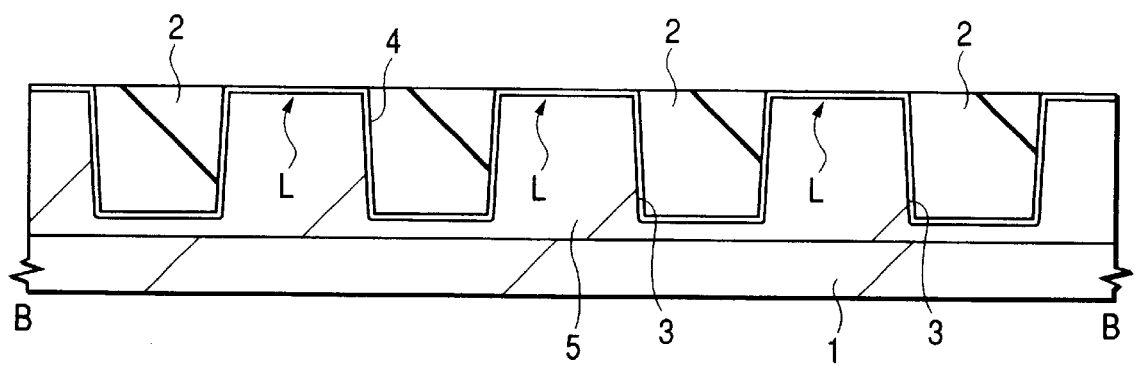
FIG. 3 is a sectional view illustrating a step in the production of the DRAM according to the embodiment 1 in the order of steps.
Figure 4:
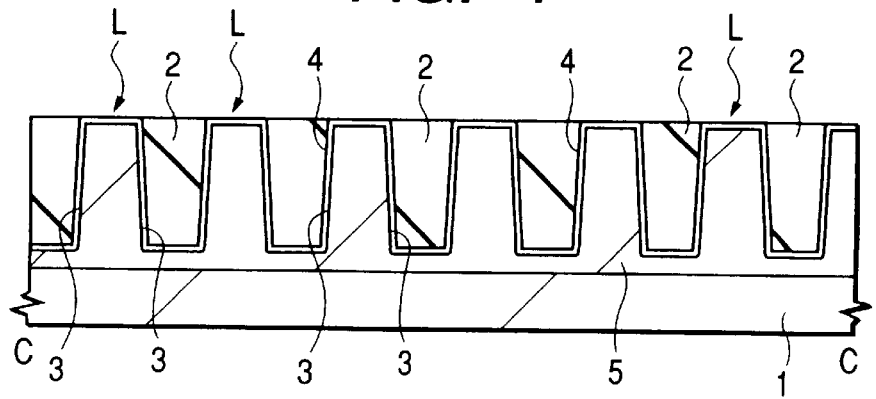
FIG. 4 is a sectional view illustrating a step in the production of the DRAM according to the embodiment 1 in the order of steps.

FIGS. 1 to 46 are plan views and sectional views illustrating steps in the production of a DRAM according to an embodiment 1 in the order of steps. In FIGS. 1 to 46, the plan views illustrate memory cell regions of the DRAM but omitting peripheral circuit regions. The sectional views are along the line A—A, line B—B and line C—C in the plan views. AA, BB and CC are indicated at the lower parts of the sectional views to indicate which cross-sections they are among the line A—A, line B—B and line C—C of the plan views. That is, FIG. 1 is a plan view, FIG. 2 is a sectional view taken along the line A—A in FIG. 1, FIG. 3 is a sectional view along the line B—B in FIG. 1, and FIG. 4 is a sectional view along the line C—C in FIG. 1. In the subsequent plan views and sectional views, whether they are plan views or sectional views and along which line they are, corresponds to the examples of FIGS. 1 to 4, but are not specifically indicated.

Referring, first, to FIGS. 1 to 4, element isolation regions 2 are formed in the main surface of a semiconductor substrate 1 to define active regions L where MISFET elements will be formed.

The semiconductor substrate 1 of a p-type single crystalline silicon having a resistivity of about 10 Ωcm is prepared, and element isolation regions 2 are formed in the main surface of the semiconductor substrate 1. Here, the semiconductor substrate 1 of single crystalline silicon is exemplified, though it is possible to use any one of an SOI (silicon-on-insulator) substrate having a single crystalline silicon layer on the surface thereof, a glass having a polycrystalline silicon film on the surface thereof and a dielectric substrate such as ceramics.

The element isolation regions 2 are formed by, for example, depositing a thin silicon oxide film (not shown) having a thickness of about 10 nm and a silicon nitride film (not shown) having a thickness of about 140 nm on the semiconductor substrate 1, and patterning the silicon nitride film and the silicon oxide film by using a photoresist film (not shown) as a mask. By using the thus patterned silicon nitride film as a mask, the semiconductor substrate 1 is dry-etched to form grooves having a depth of about 300 to 400 nm in the semiconductor substrate 1. In order to remove damaged layers formed on the inner walls of the grooves 3, a thin (about 10 nm thick) silicon oxide film 4 is formed on the inner walls of the grooves 3, and a silicon oxide film (TEOS oxide film, not shown) is deposited to a thickness of about 300 to 400 nm by, for example, a plasma CVD method by using ozone (03) and tetraethoxysilane (TEOS) as source gases. The TEOS oxide film is polished by a CMP method and is removed from the regions other than the grooves 3; i.e., the TEOS film is left in the grooves 3 to form element isolation regions 2. The active regions L surrounded by the element isolation regions 2 are not formed at right angles, or in parallel, with the word lines (gate electrodes) or the bit lines, as will be described later, but are so formed as to intersect them at a predetermined angle.

Next, the silicon oxide film and the silicon nitride film remaining on the surface of the semiconductor substrate 1 are removed by wet-etching by using, for example, hot phosphoric acid. Then, p-type impurities such as B (boron) ions are implanted into the memory array and into portions (regions where n-channel MISFETs are to be formed) of peripheral circuits to thereby form p-type wells S. Further, p-type and n-type wells can be formed in the peripheral circuit regions before or after the above step. Following the above ion implantation, impurities such as $BF_2$ (boron fluoride) ions are implanted to adjust the threshold voltage of the MISFETS. N-type impurities such as P (phosphorus) ions may be implanted into the semiconductor substrate 1 in the regions (memory array) where memory cells are to be formed ta form an n-type semiconductor region in a deep region. The n-type semiconductor region is formed for preventing the infiltration of noise from the input/output circuit or the like circuit into the p-type wells 5 in the memory array through the semiconductor substrate 1.

Figure 5:
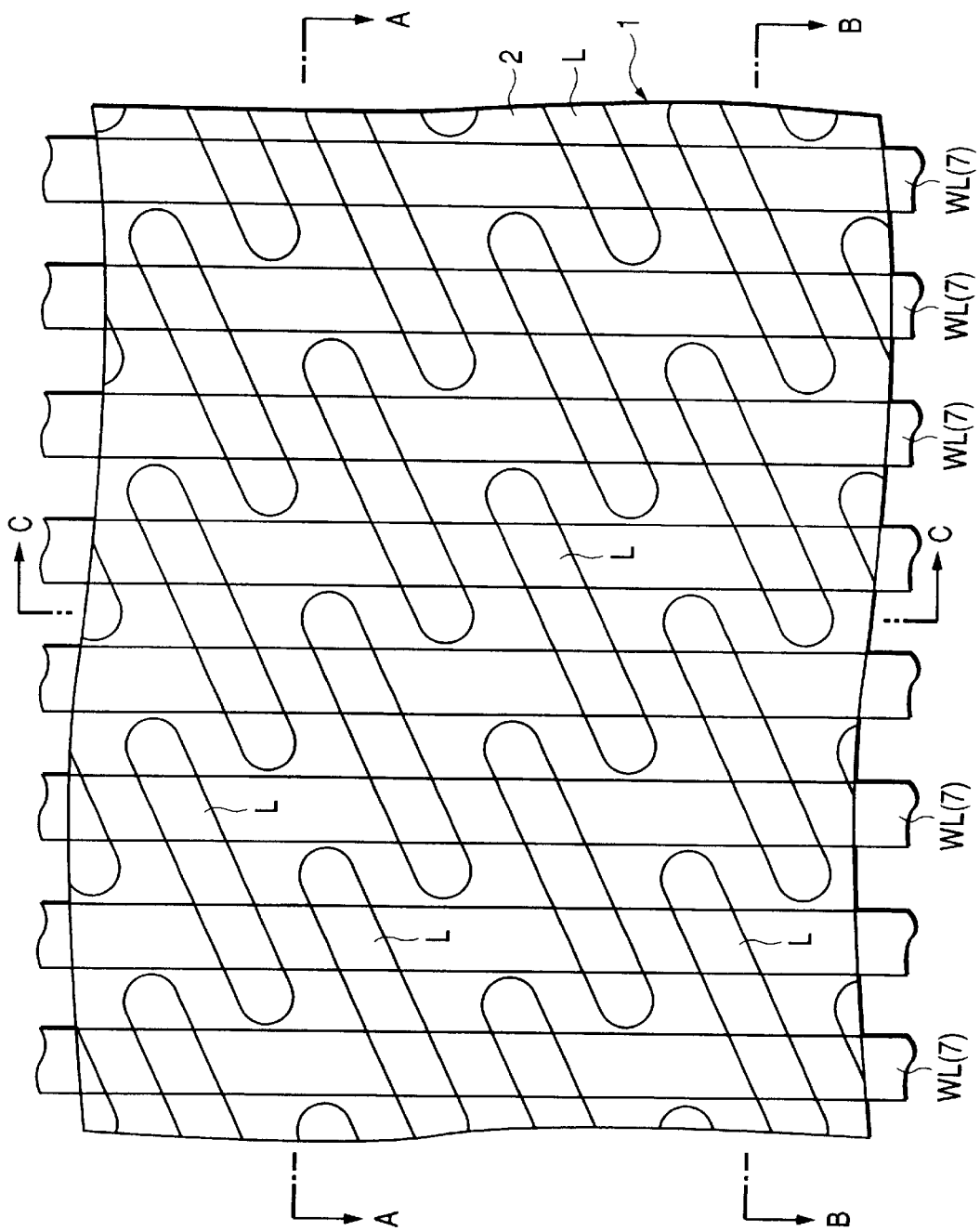
FIG. 5 is a plan view illustrating a step in the production of the DRAM according to the embodiment 1 in the order of steps.
Figure 6:
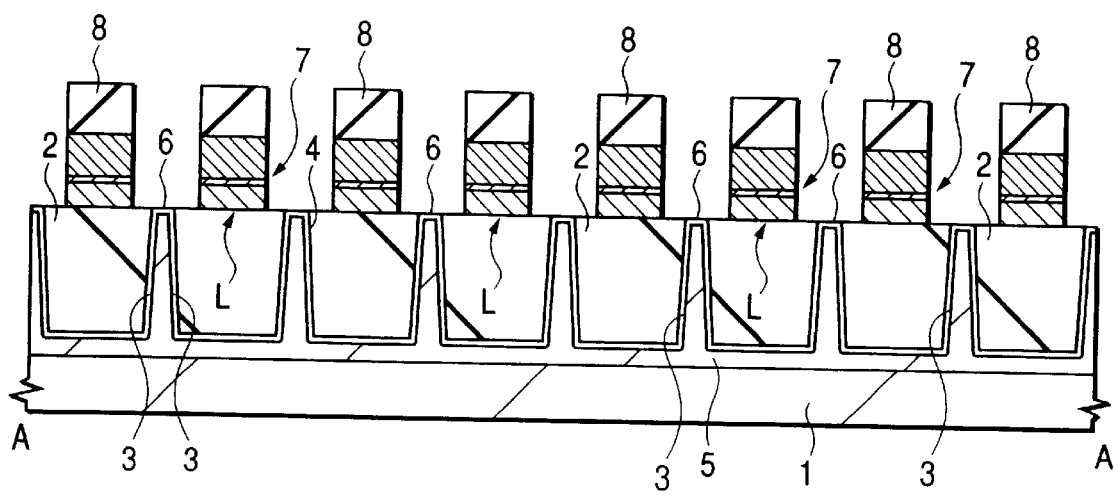
FIG. 6 is a sectional view illustrating a step in the production of the DRAM according to the embodiment 1 in the order of steps.
Figure 7:
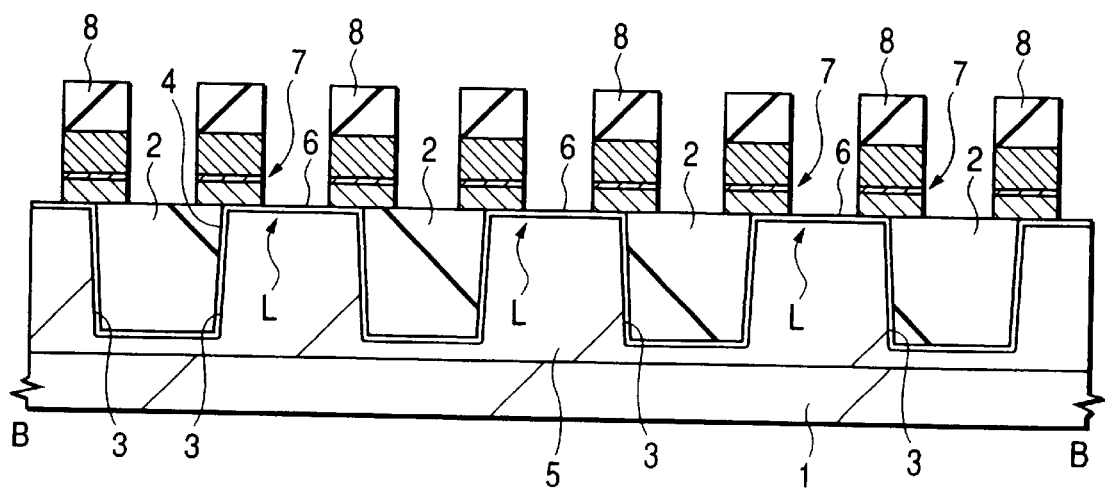
FIG. 7 is a sectional view illustrating a step in the production of the DRAM according to the embodiment 1 in the order of steps.

Next, the surface of the semiconductor substrate 1 is washed with a washing solution such as of HF (hydrofluoric acid). Then, as shown in FIGS. 5 to 7, word lines WL are formed that serve as gate electrodes of MISFETs Qs for selecting memory cells. In the peripheral circuit region, gate electrodes of MISFETs of peripheral circuits are formed through this step.

The semiconductor substrate 1 is wet-oxidized at about 850° C. to form a clean gate oxide film 6 maintaining a thickness of about 7 nm on the surfaces of the p-type wells 5, thereby to form gate electrodes, a cap-insulating film and a semiconductor region having a low impurity concentration.

Gate electrodes 7 are formed on the gate oxide film 6. The gate electrode 7 forms a portion of a MISFET for selecting a memory cell and is used as a word line WL in a region other than the active region. The gate electrode 7 (word line WL) has a width, i.e., has a gate length of a minimum size within an allowable range in which the threshold voltage can be maintained to be larger than a predetermined value while suppressing the short-channel effect of the MISFET for selecting the memory cell. Further, a gap between the neighboring gate electrodes 7 (word lines WL) has a minimum size determined by a limit of resolution of photolithography.

In this step, gate electrodes of MISFETs for peripheral circuits are formed in the peripheral circuit regions. The gate electrodes 7 (word lines WL) are formed by depositing a polycrystalline silicon film doped with n-type impurities such as P (phosphorus) to a thickness of about 70 nm on the semiconductor substrate 1 by a CVD method, depositing thereon, by sputtering, a WN (tungsten nitride) film to a thickness of about 50 nm and a W film to a thickness of about 100 nm, and further depositing thereon, by a CVD method, a silicon nitride film 8 to a thickness of about 150 nm, and patterning these films using a photoresist film as a mask. The patterned silicon nitride film 8 works as a cap-insulating film. The WN film works as a barrier layer that prevents the formation of a silicide layer of a high resistance on the interface between the W film and the polycrystalline silicon film due to the reaction of the W film and the polycrystalline silicon film at the time of heat treatment at a high temperature. As a barrier layer, a TiN (titanium nitride) film can be used in addition to a WN film.

Figure 8:
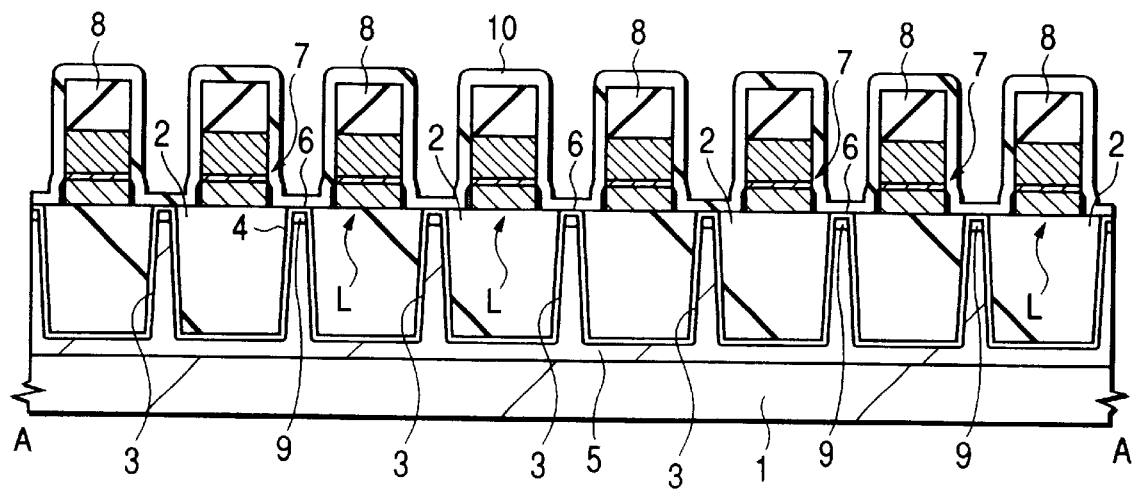
FIG. 8 is a sectional view illustrating a step in the production of producing the DRAM according to the embodiment 1 in the order of steps.
Figure 9:
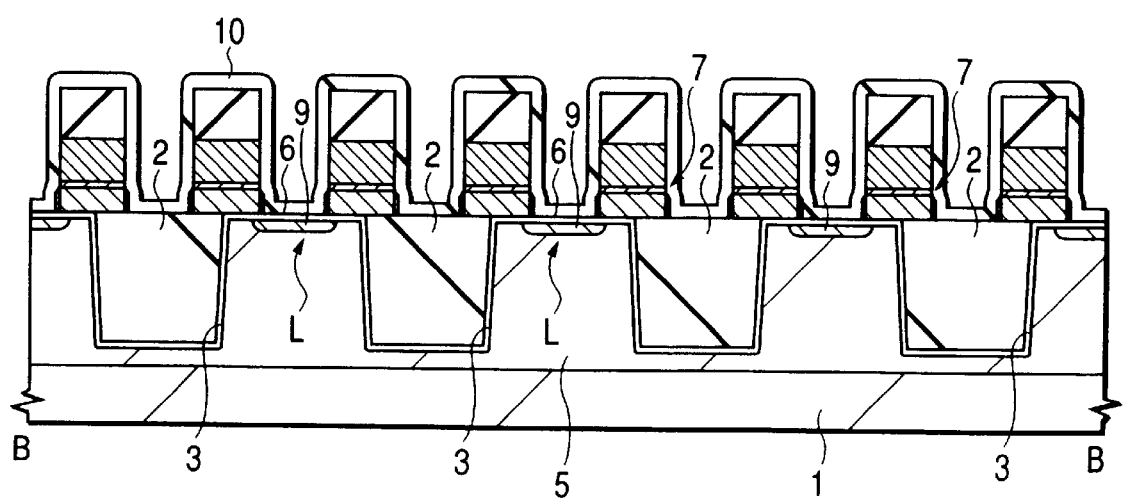
FIG. 9 is a sectional view illustrating a step in the production of the DRAM according to the embodiment 1 in the order of steps.

Next, the photoresist film is removed, and the dry-etching residue and the photoresist residue remaining on the surface of the semiconductor substrate 1 are removed by using an etching solution, such as hydrofluoric acid. Then, as shown in FIGS. 8 and 9, n-type impurities, such as P (phosphorus) ions, are implanted into the p-type wells 5 to form an n-type semiconductor region 9 in the p-type wells 5 on both sides of the gate electrodes 7. Thus, MISFETs Qs are formed for selecting memory cells in the memory array. Before or after this step, further, p-type or n-type impurity ions are injected into the peripheral circuit regions to form MISFETs of peripheral circuits.

Next, a silicon nitride film 10 is deposited to a thickness of about 50 to 100 nm on the semiconductor substrate 1 by the CVD method. The silicon nitride film 10 works as an etching stopper for preventing excess etching in forming connection holes that will be described later. The silicon nitride film 10 in the memory cell region is covered with a photoresist film, and the silicon nitride film 10 of the peripheral circuits is subjected to anisotropic etching thereby to form side wall spacers on the side walls of the gate electrodes of the peripheral circuits. Thereafter, a semiconductor region of a high concentration is formed in the n-type wells and in the p-type wells in the peripheral circuit regions, whereby p-channel MISFETs Qp and n-channel MISFETs Qn having an LDD (lightly doped drain) structure are formed in the peripheral circuit regions.

Referring next to FIGS. 10 to 13, on the semiconductor substrate 1 there is deposited, for example, an SOG (spin on glass) film or a TEOS oxide film, or a silicon oxide film 11 of a laminate thereof. The silicon oxide film 11 is then polished by the CMP method to flatten the surface thereof. A thin silicon oxide film having a thickness of about 100 nm may be deposited on the silicon oxide film 11 in order to repair fine scars on the surface of the silicon oxide film 11 caused by polishing by the CMP method.

Figure 10:
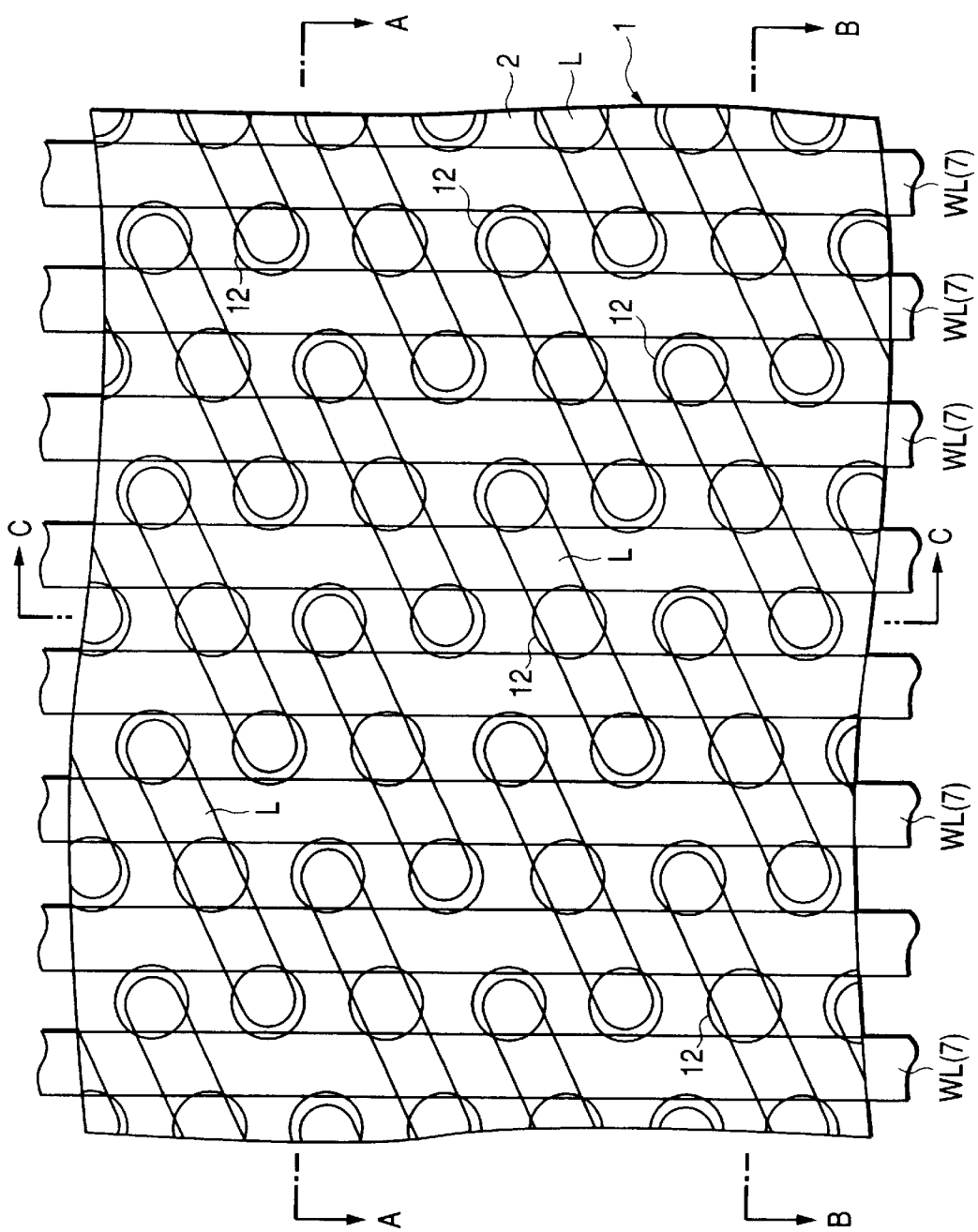
FIG. 10 is a plan view illustrating a step in the production of the DRAM according to the embodiment 1 in the order of steps.
Figure 11:
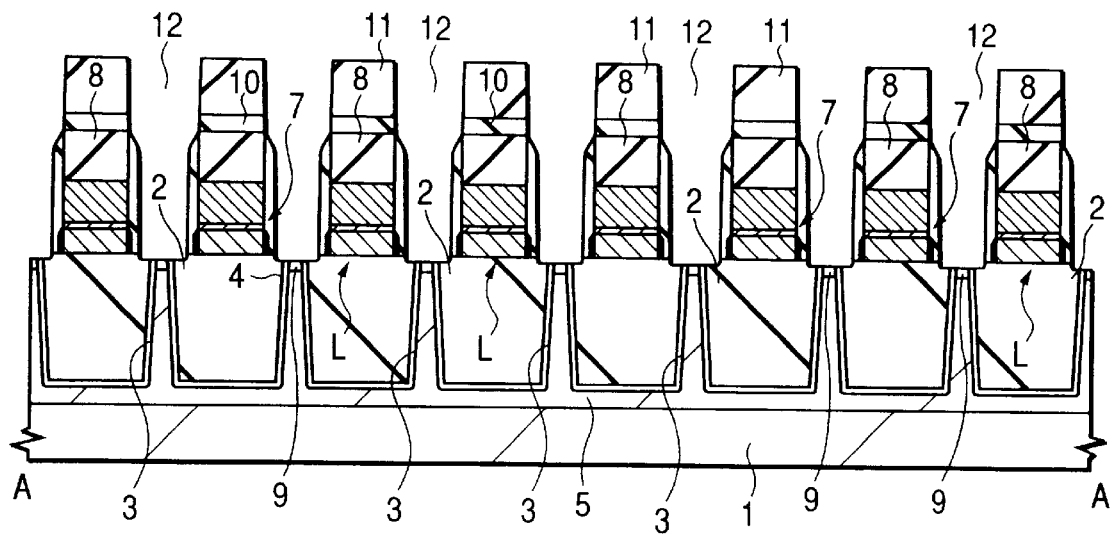
FIG. 11 is a sectional view illustrating a step in the production of the DRAM according to the embodiment 1 in the order of steps.
Figure 12:
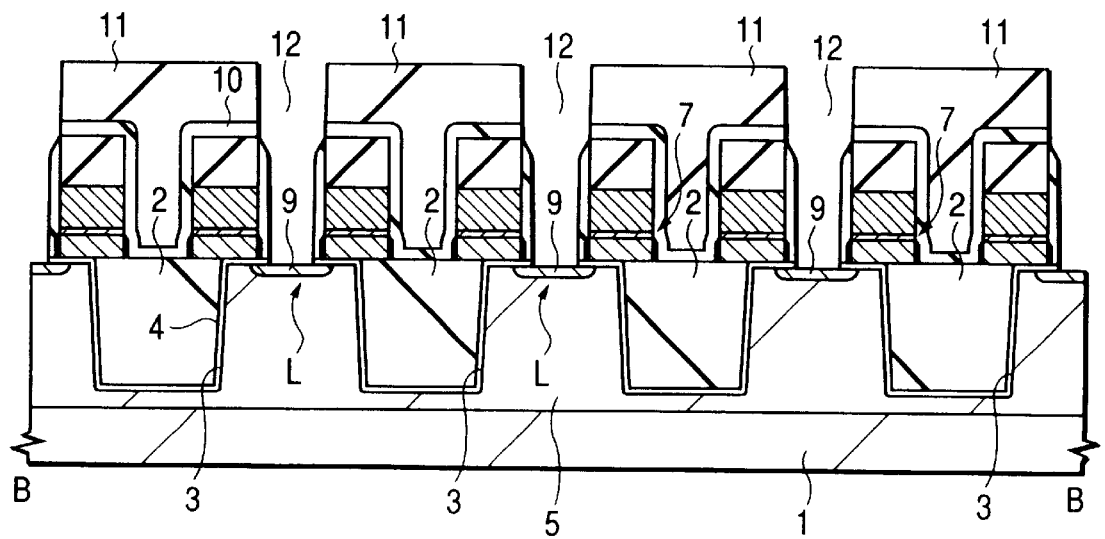
FIG. 12 is a sectional view illustrating a step in the production of the DRAM according to the embodiment 1 in the order of steps.
Figure 13:
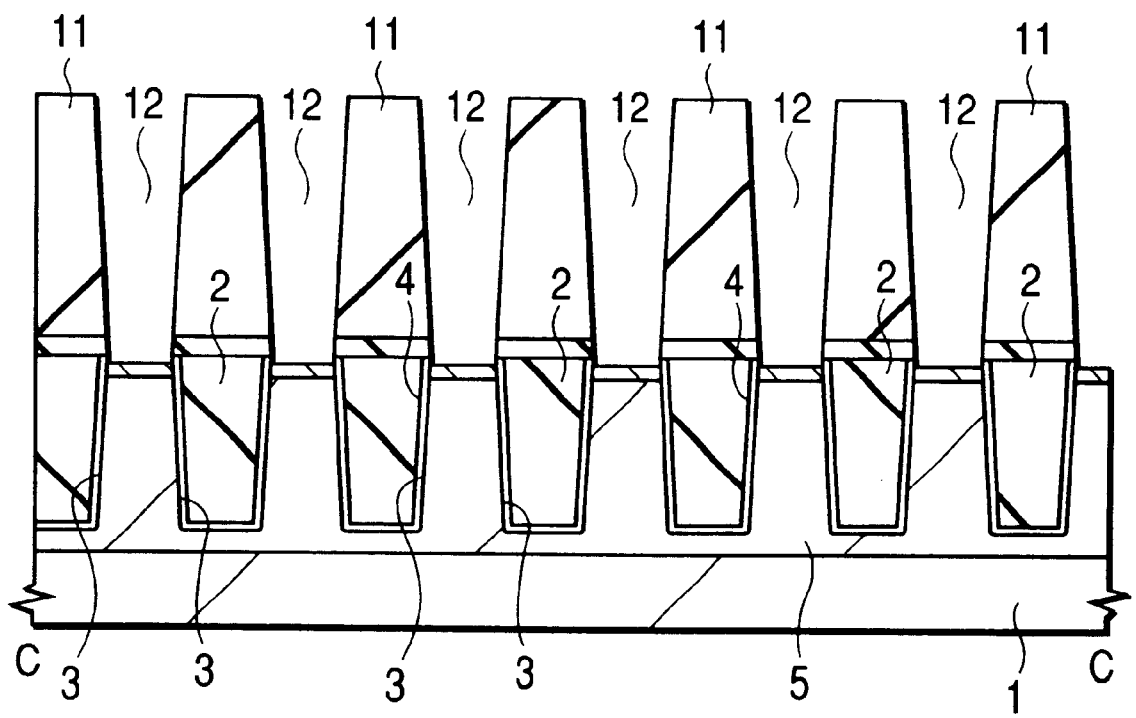
FIG. 13 is a sectional view illustrating a step in the production of the DRAM according to the embodiment 1 in the order of steps.

Thereafter, contact holes 12 are formed in plane positions shown in FIG. 10 by dry-etching using the photoresist film as a mask. The contact holes 12 are formed by etching the silicon oxide film 11 and the silicon nitride film 10 on the n-type semiconductor region 9 (source, drain) First, the etching of a first step is conducted under such a condition that the silicon oxide-film 11 is etched at a larger rate than the silicon nitride film 10, so that the silicon nitride film 10 covering the n-type semiconductor regions 9 and the element isolation grooves 3 will not be completely removed. Then, the etching of a second step is conducted under such a condition that the silicon nitride film 10 is etched at a larger rate than the silicon oxide film (gate oxide film 6 and silicon oxide film in the element isolation grooves 3), thereby to remove the silicon nitride film 10 and the gate oxide film 6 on the n-type semiconductor regions 9. This prevents the n-type semiconductor regions 9 and the element isolation grooves 3 from being deeply ground. Further, the etching is conducted under such a condition that the silicon nitride film 10 is subjected to anisotropic etching and that the silicon nitride film 10 remains on the side walls of the gate electrodes 7 (word lines WL). Accordingly, contact holes 12 having a diameter smaller than a limit of resolution of photolithography are formed so as to be self-aligned to the gate electrodes 7 (word lines WL). In order to form the contact holes 12 in a manner such that they are self-aligned to the gate electrodes 7 (word lines WL), the silicon nitride film 10 may be subjected to anisotropic etching in advance to form a side wall spacer on the side walls of the gate electrodes 7 (word lines WL).

Figure 14:
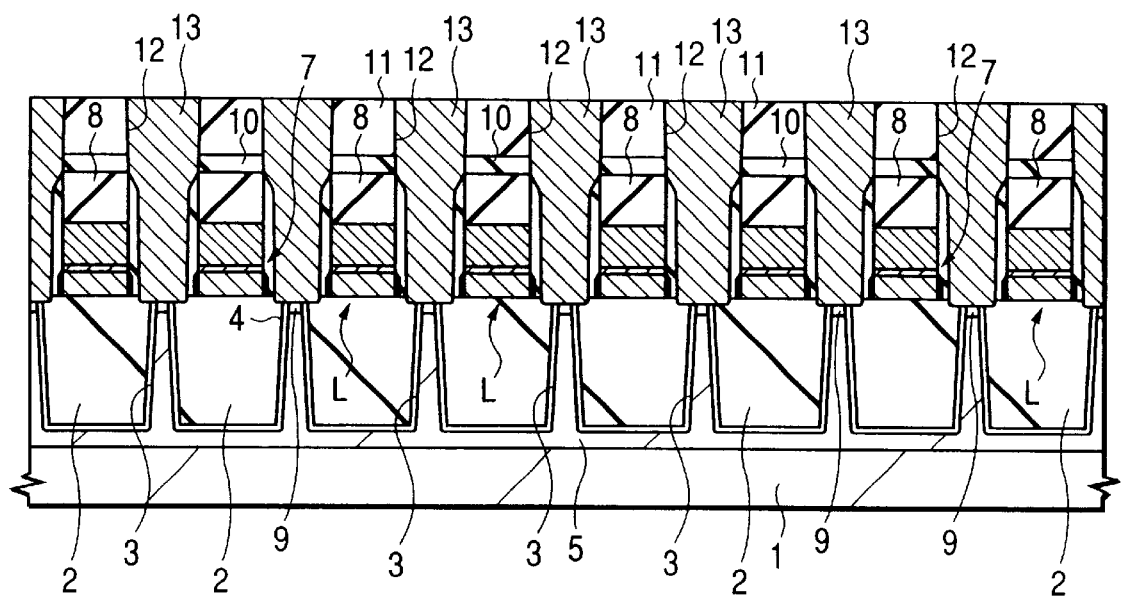
FIG. 14 is a sectional view illustrating a step in the production of the DRAM according to the embodiment 1 in the order of steps.
Figure 15:
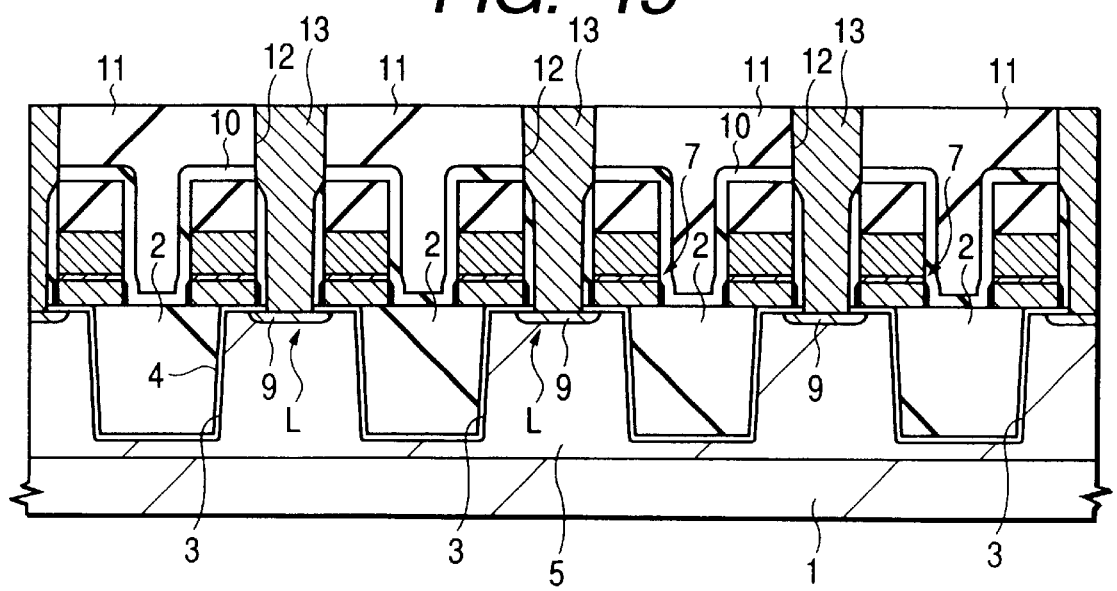
FIG. 15 is a sectional view illustrating a step in the production of the DRAM according to the embodiment 1 in the order of steps.

Next, the photoresist film is removed, the dry-etching residue and the photoresist residue on the surface of the substrate exposed on the bottom of the contact holes 12 are removed by using an etching solution such as a mixed acid of hydrofluoric acid and ammonium fluoride, and plugs 13 are formed in the contact holes 12 as shown in FIGS. 14 and 15. The plugs 13 are formed by depositing, by the CVD method, a polycrystalline silicon film doped with n-type impurities (e.g., P (phosphorus)) on the silicon oxide film 11, and polishing the polycrystalline silicon film by the CMP method so as to be left in the contact holes 12.

Figure 16:
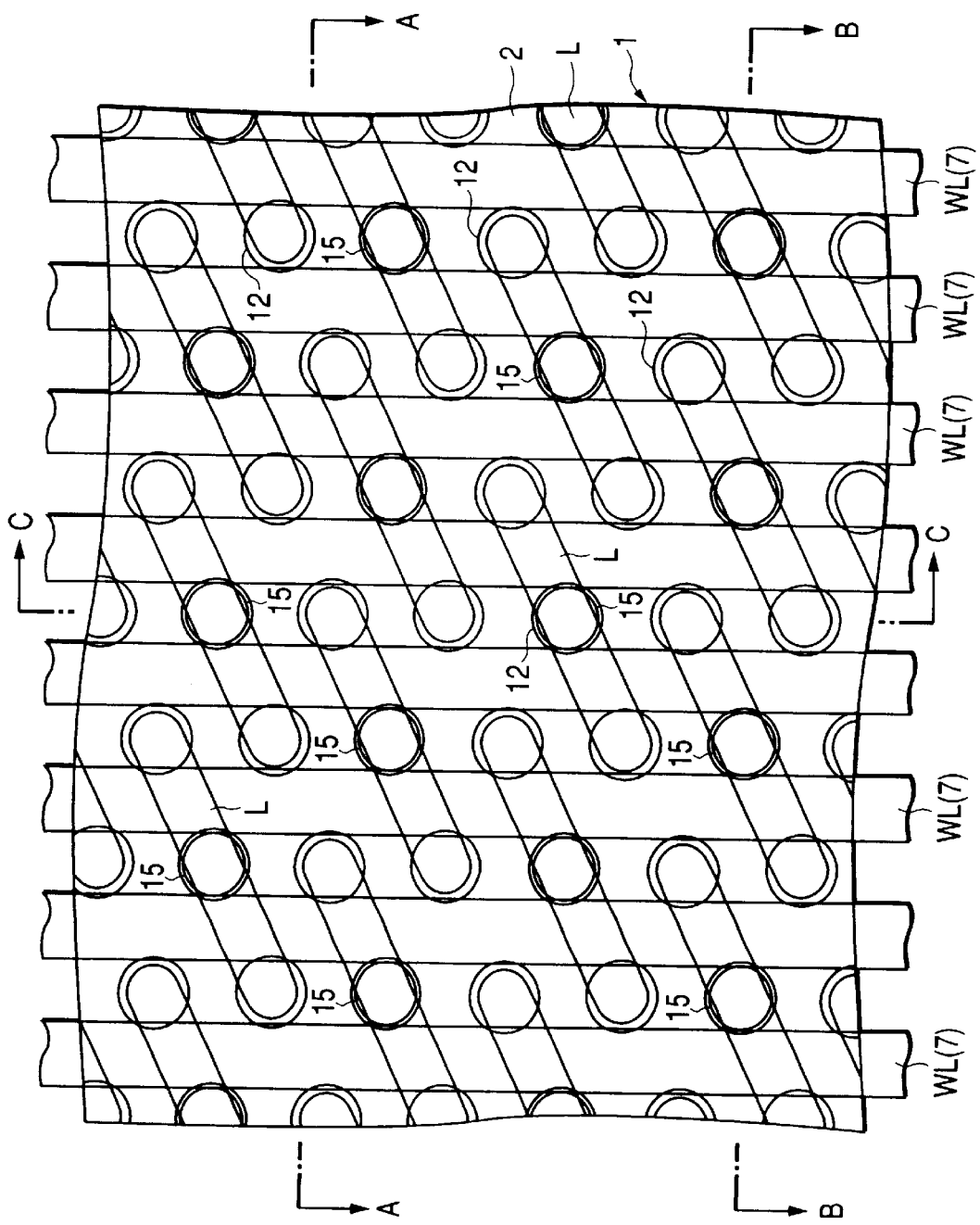
FIG. 16 is a plan view illustrating a step in the production of the DRAM according to the embodiment 1 in the order of steps.
Figure 17:
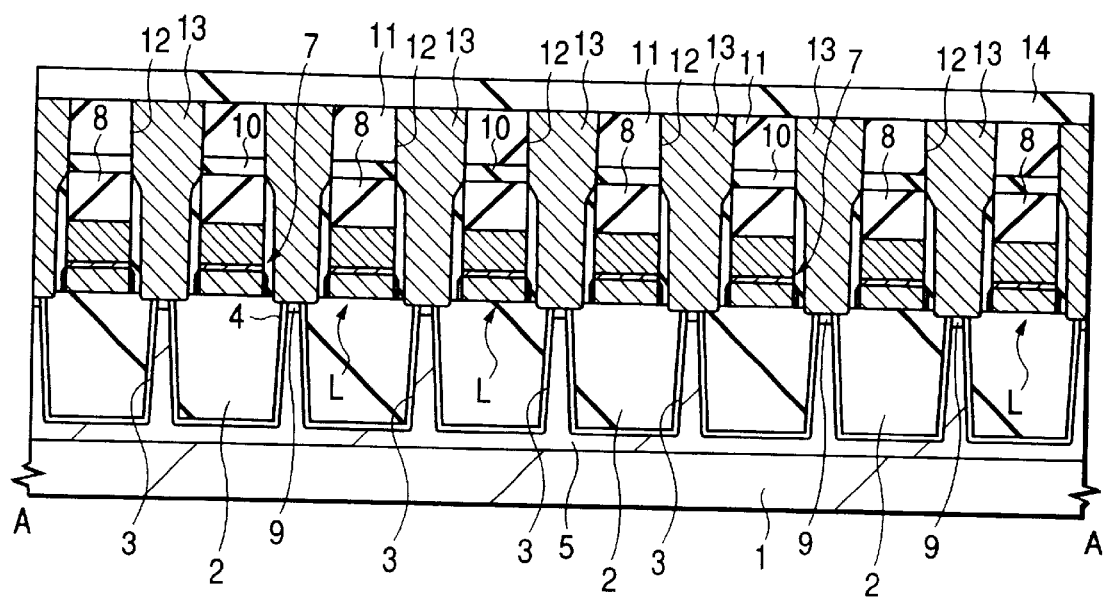
FIG. 17 is a sectional view illustrating a step in the production of the DRAM according to the embodiment 1 in the order of steps.
Figure 18:
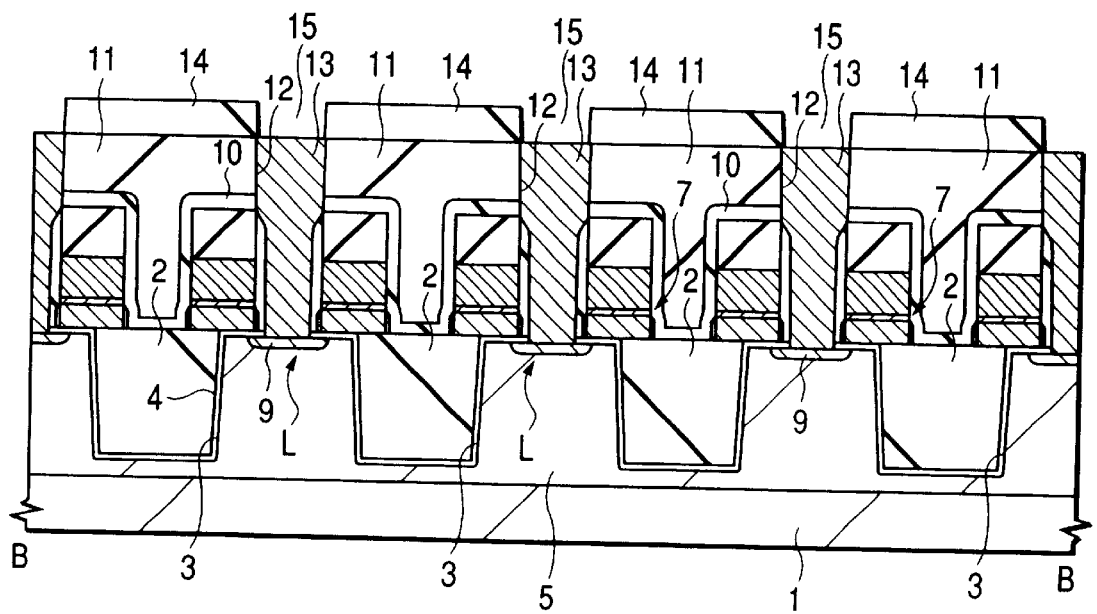
FIG. 18 is a sectional view illustrating a step in the production of the DRAM according to the embodiment 1 in the order of steps.
Figure 19:
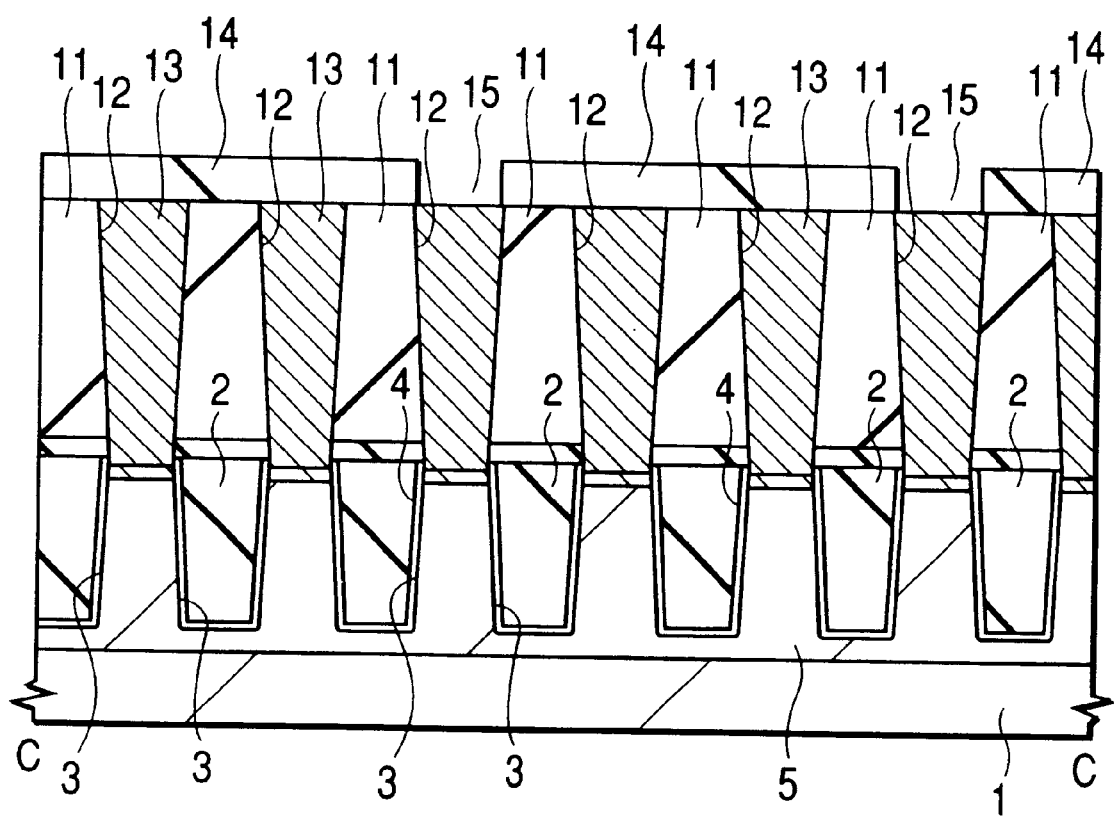
FIG. 19 is a sectional view illustrating a step in the production of the DRAM according to the embodiment 1 in the order of steps.

Referring next to FIGS. 16 to 19, a silicon oxide film 14 is deposited to a thickness of about 200 nm on the silicon oxide film 11. The silicon oxide film 14 has a function of insulating bit lines BL, that will be described in the next step, from the plugs 13. Then, through holes 15 are formed in the silicon oxide film 14 by dry-etching by using the photoresist film as a mask. FIG. 16 illustrates positions where the through holes 15 are formed. Upon forming the through-holes 15, the surfaces of the plugs 13 are exposed. After the photoresist film is remove, a new-photoresist film is formed and is used as a mask to form contact holes even in the peripheral circuit regions by dry-etching.

Referring next to FIGS. 20 to 23, plugs 16 are formed in the through holes 15, and bit lines BL connected to the plugs 16 are formed on the silicon oxide film 14.

To form the plugs 16, first, a Ti film is deposited to a thickness of about 50 nm on the silicon oxide film 14 by sputtering, and the semiconductor substrate 1 is heat-treated at about 800° C. Then, a TiN film is deposited to a thickness of about 50 nm on the Ti film by sputtering, and a W film is deposited thereon to a thickness of about 150 nm. Thereafter, CMP is effected, and the thin film on the silicon oxide film 14 is removed, so that the thin film remains in the through holes 15 only. After a Ti film is deposited, the semiconductor substrate 1 is heat-treated at about 800° C., whereby the Ti film reacts with underlying silicon to form a $TiSi_2$ (titanium silicide) layer of a low resistance on the surfaces of the plugs 13. This makes it possible to lower the contact resistance.

Figure 20:
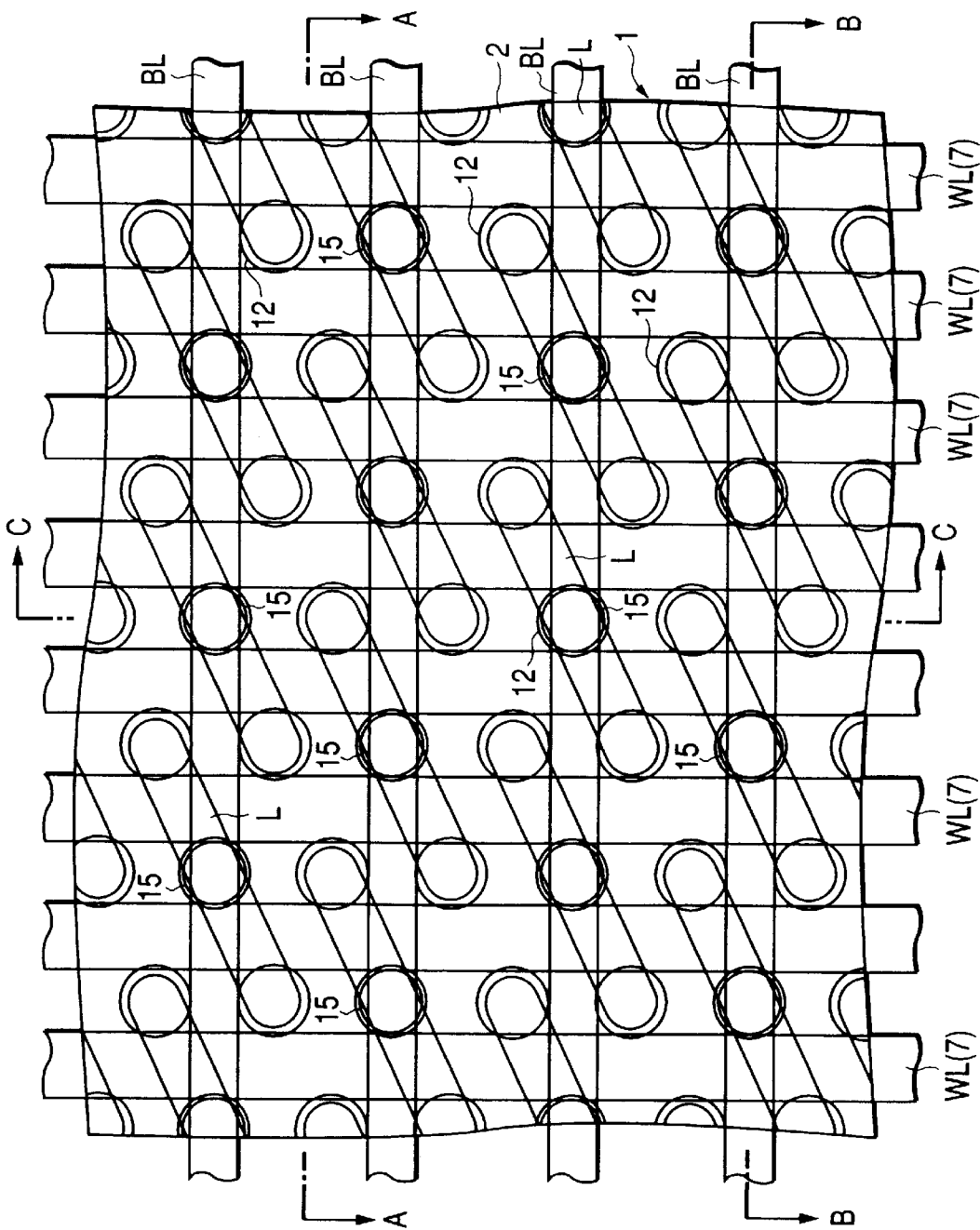
FIG. 20 is a plan view illustrating a step in the production of producing the 6RAM according to the embodiment 1 in the order of steps.
Figure 21:
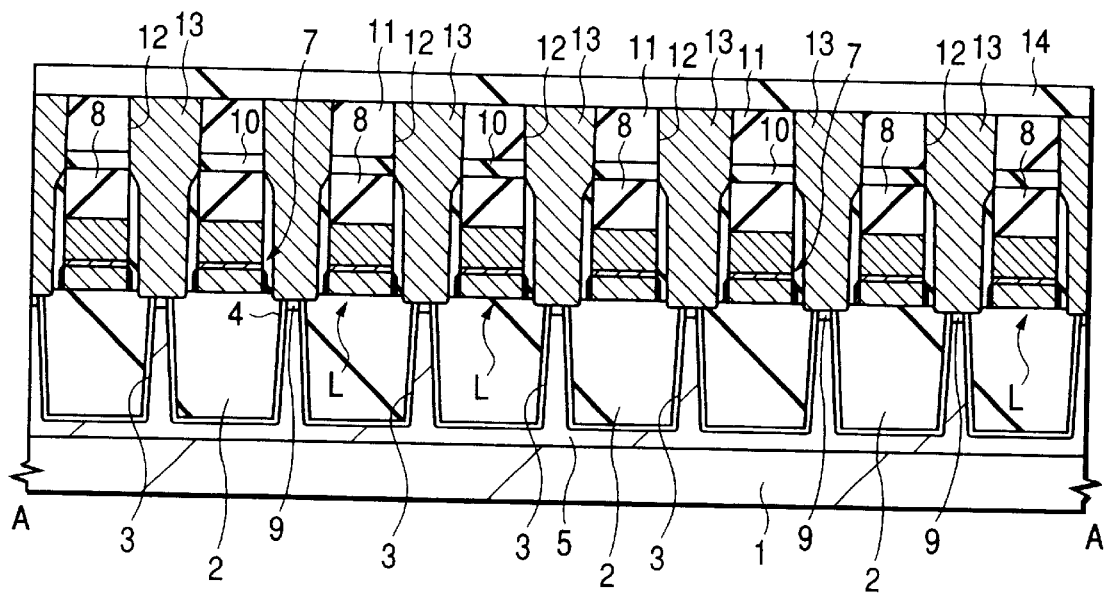
FIG. 21 is a sectional view illustrating a step in the production of the DRAM according to the embodiment 1 in the order of steps.
Figure 22:
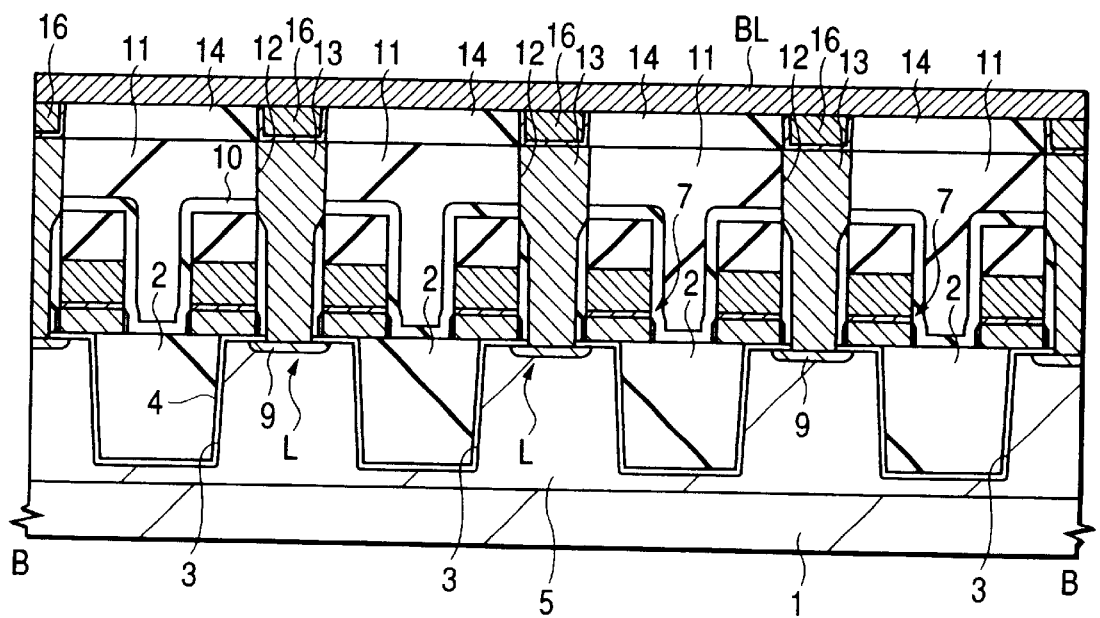
FIG. 22 is a sectional view illustrating a step in the production of the DRAM according to the embodiment 1 in the order of steps.
Figure 23:
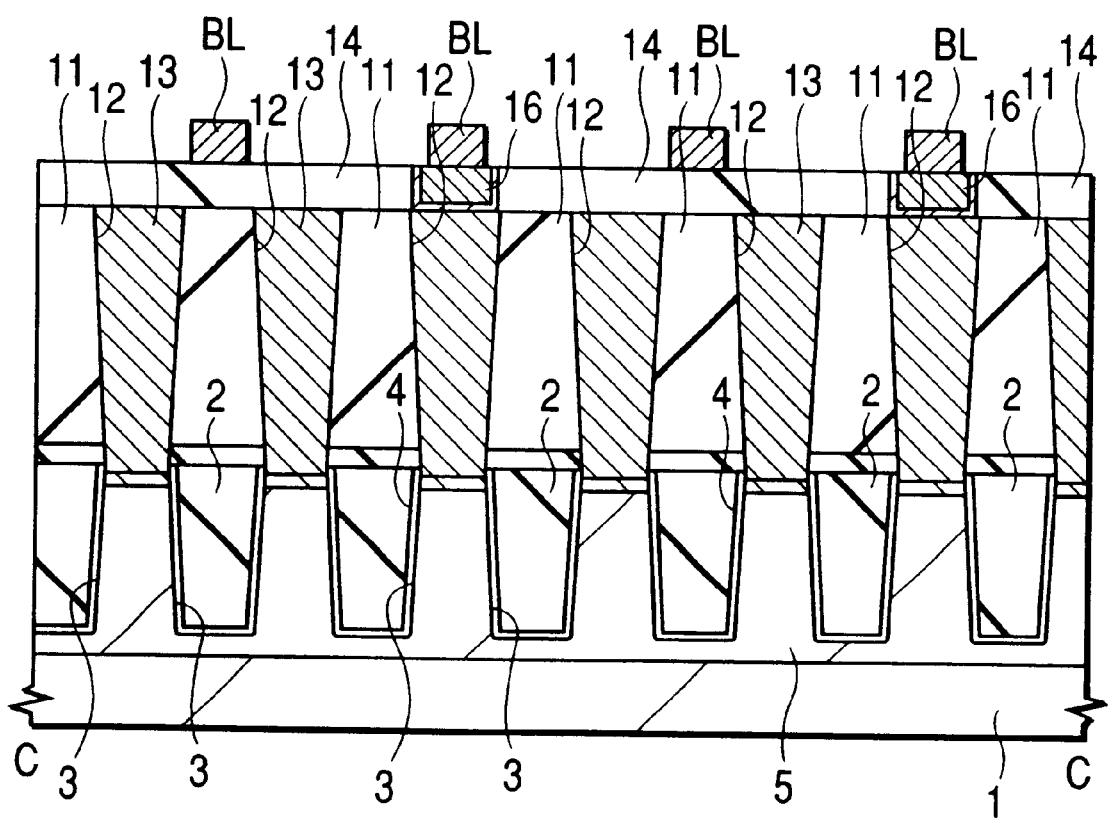
FIG. 23 is a sectional view illustrating a step in the production of the DRAM according to the embodiment 1 in the order of steps.

The bit lines BL are formed by depositing, for example, a tungsten film on the whole surface of the semiconductor substrate 1, followed by patterning, relying upon photolithography and etching technology. The bit lines BL are patterned in a manner that is shown in FIG. 20. The bit lines BL are so formed that the gaps among them are larger than the width thereof in order to decrease the parasitic capacitance formed between the neighboring bit lines BL as much as possible and to increase the data reading speed and writing speed.

Similar plugs can also be formed in the contact holes in the peripheral circuit regions simultaneously with the formation of the plugs 16. It is also acceptable to form a similar first wiring layer on the peripheral circuit regions simultaneously with the formation of bit lines BL.

Referring next to FIGS. 24 to 27, an insulating film 17 is formed to cover the bit lines BL, and through holes 18 are formed in the insulating film 17.

As the insulating film 17, there is used, for example, an SOG film, a TEOS oxide film, or a laminates film thereof. Further, the surface of the insulating film 17 is polished by using the CMP method and is flattened. In order to recover damage on the surfaces7, a TEOS oxide film may be formed to a thickness of about 100 nm.

Figure 24:
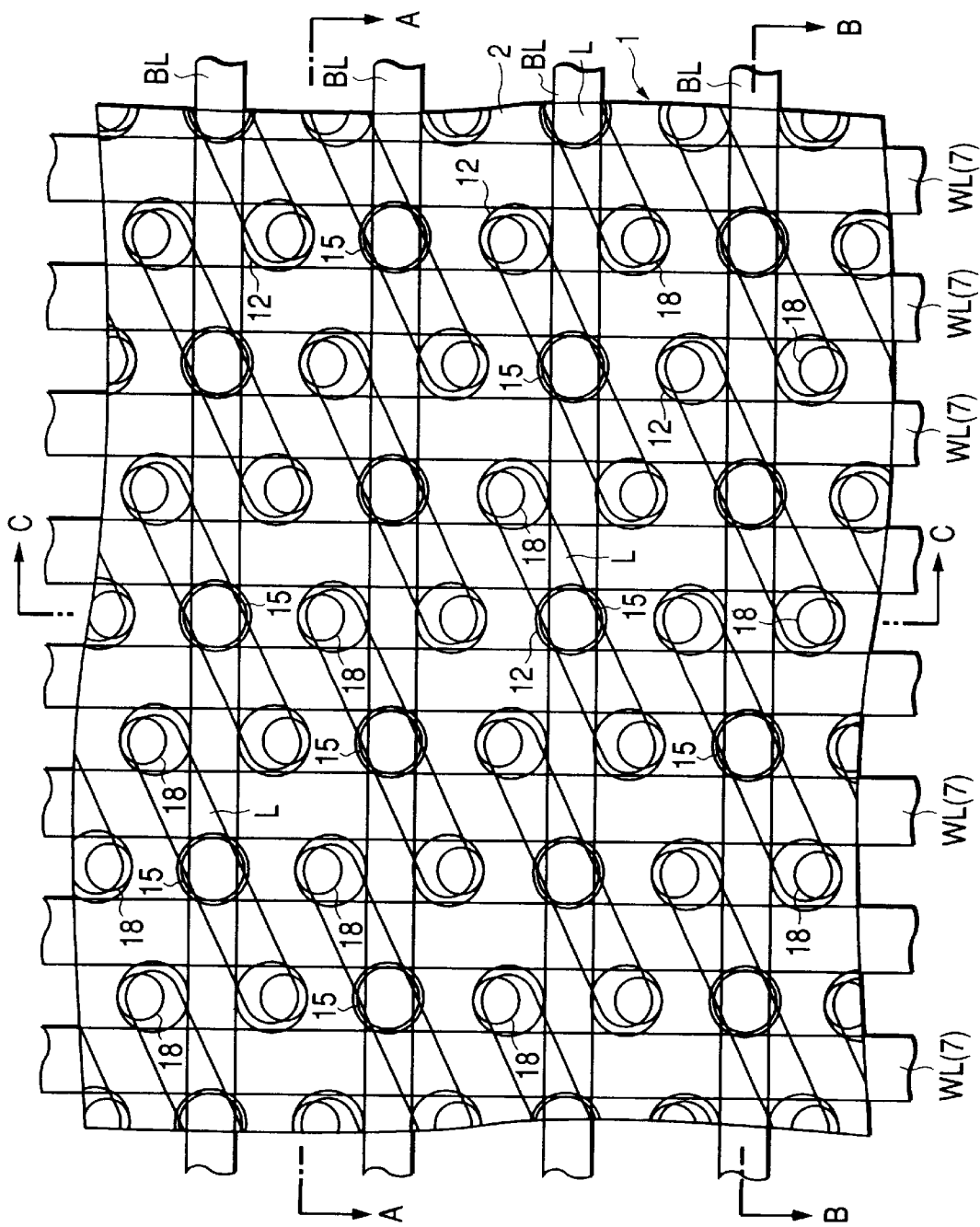
FIG. 24 is a plan view illustrating a step in the production of the DRAM according to the embodiment 1 in the order of steps.
Figure 25:
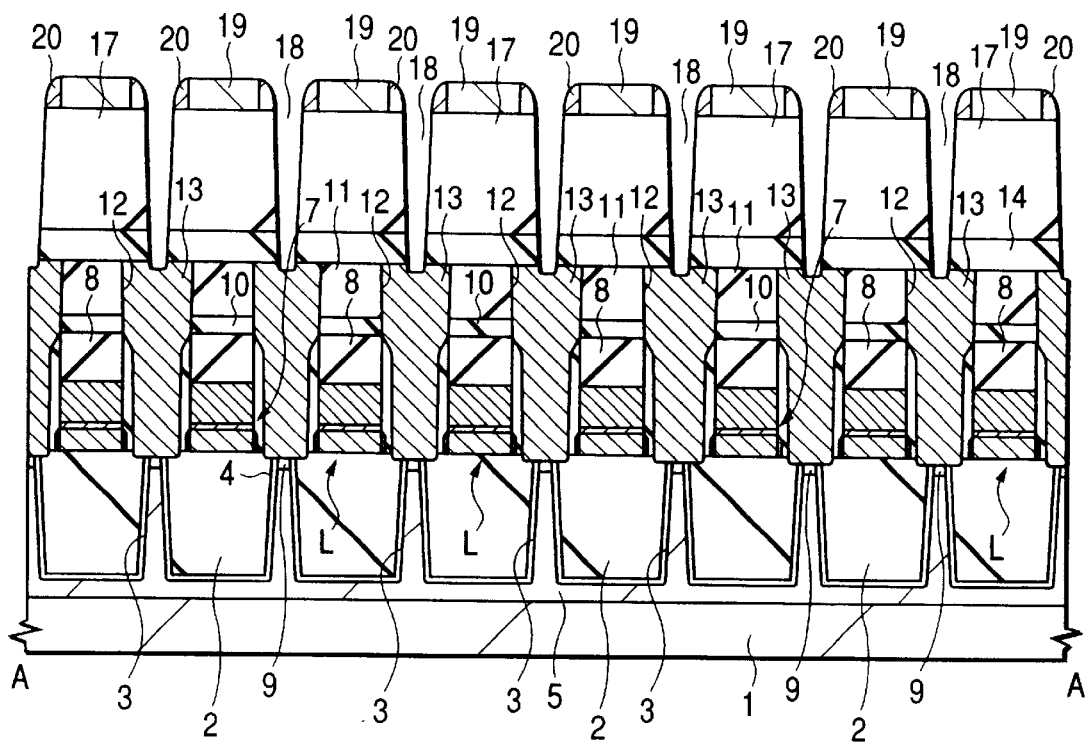
FIG. 25 is a sectional view illustrating a step in the production of the DRAM according to the embodiment 1 in the order of steps.
Figure 26:
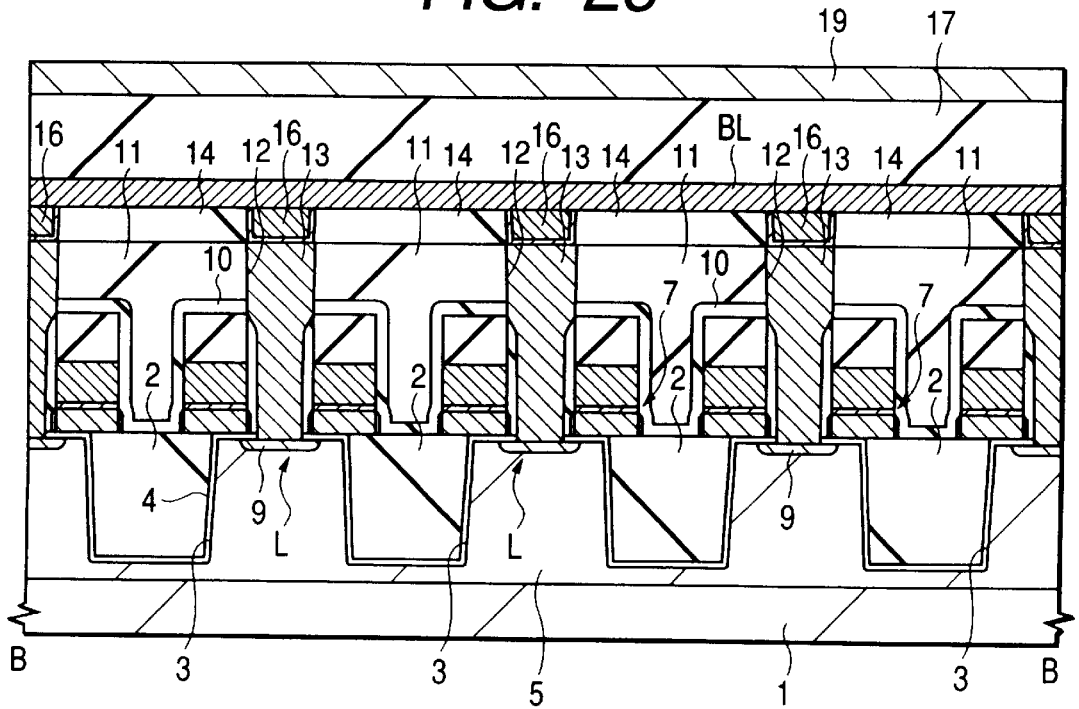
FIG. 26 is a sectional view illustrating a step in the production of the DRAM according to the embodiment 1 in the order of steps.
Figure 27:
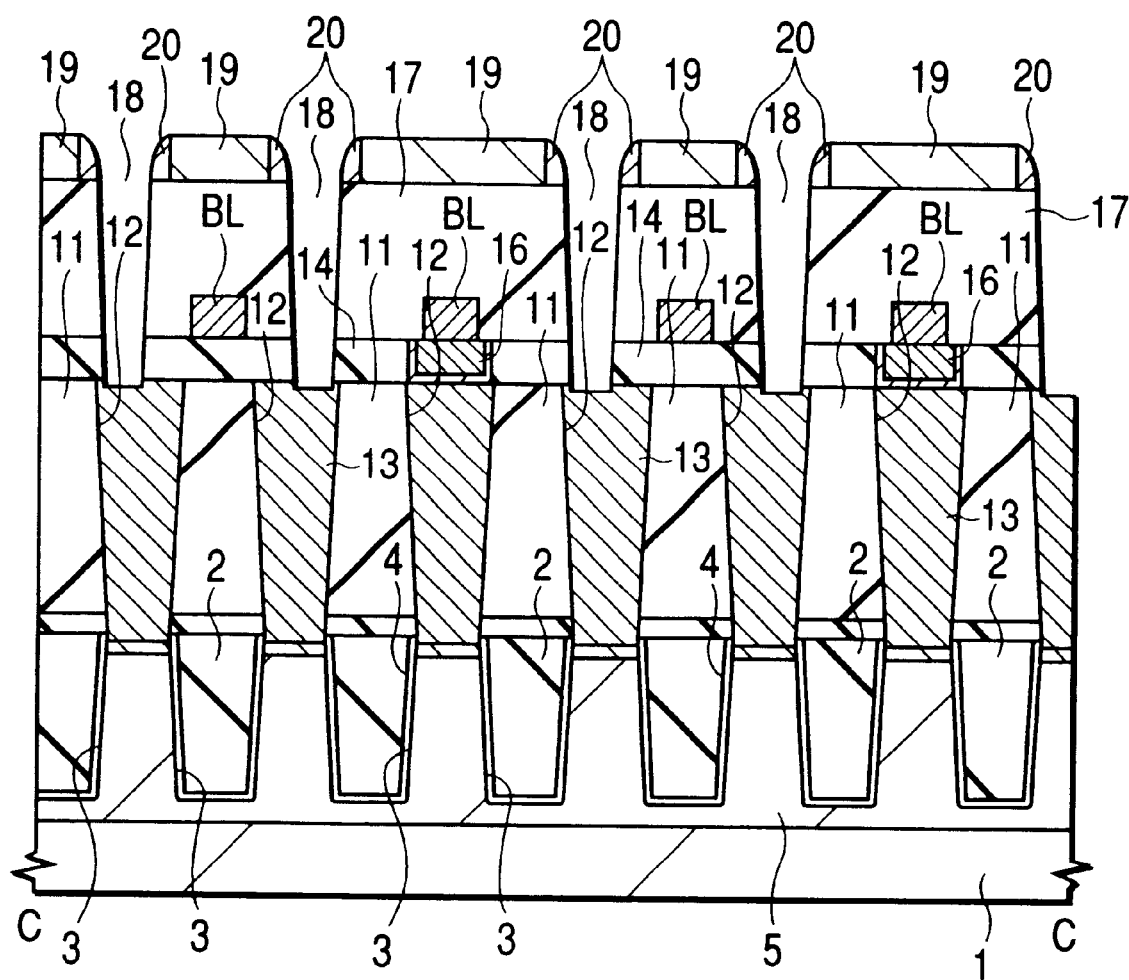
FIG. 27 is a sectional view illustrating a step in the production of the DRAM according to the embodiment 1 in the order of steps.

Through holes 18 are formed by forming a hard mask 19 of, for example, a polycrystalline silicon film on the insulating film 17, followed by patterning so as to form openings at predetermined positions (where through holes 18 are to be formed) as shown in FIG. 24. Thereafter, side wall spacers 20 of the same material are formed on the side walls of the openings. Upon forming side wall spacers 20 as described above, through holes 18 are formed in a size smaller than a limit of resolution of photolithography. Then, by using the hard mask 19 and the side wall spacers 20 as masks, the insulating film 17 is subjected to the anisotropic etching (dry-etching) to form through holes 18.

By using an etching solution such as a mixed acid of hydrofluoric acid and ammonium fluoride, the dry-etching residue and the photoresist residue are removed from the surfaces of the plugs 3 exposed on the bottoms of the through holes 18.

Figure 28:
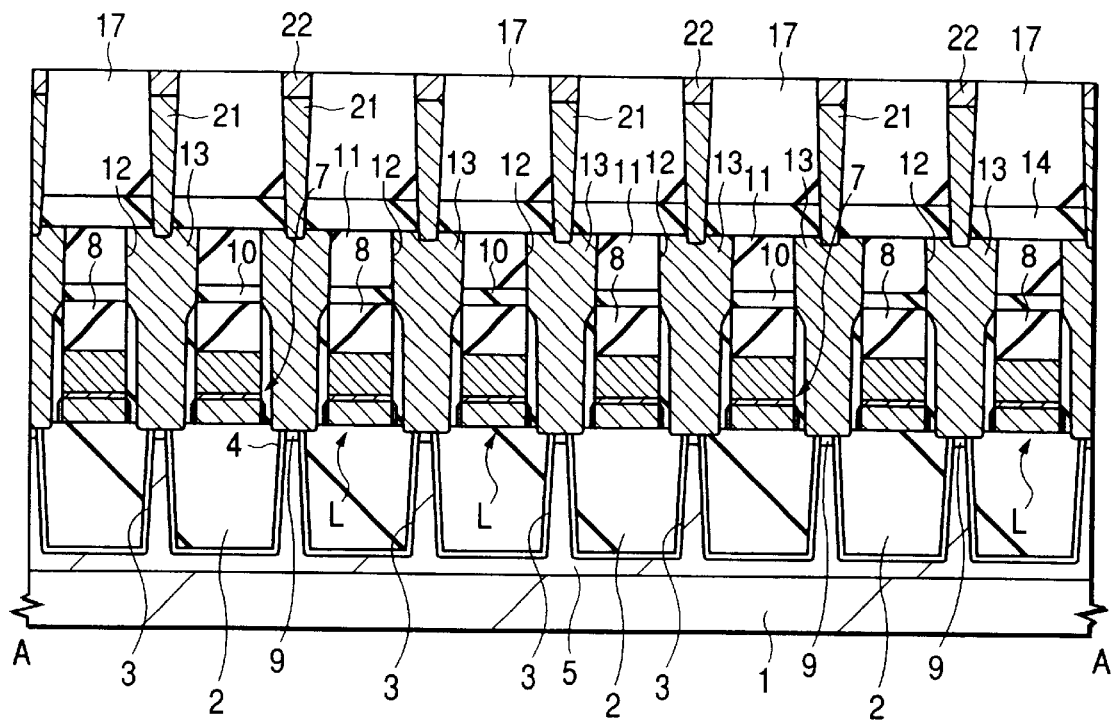
FIG. 28 is a sectional view illustrating a step in the production of the DRAM according to the embodiment 1 in the order of steps.
Figure 29:
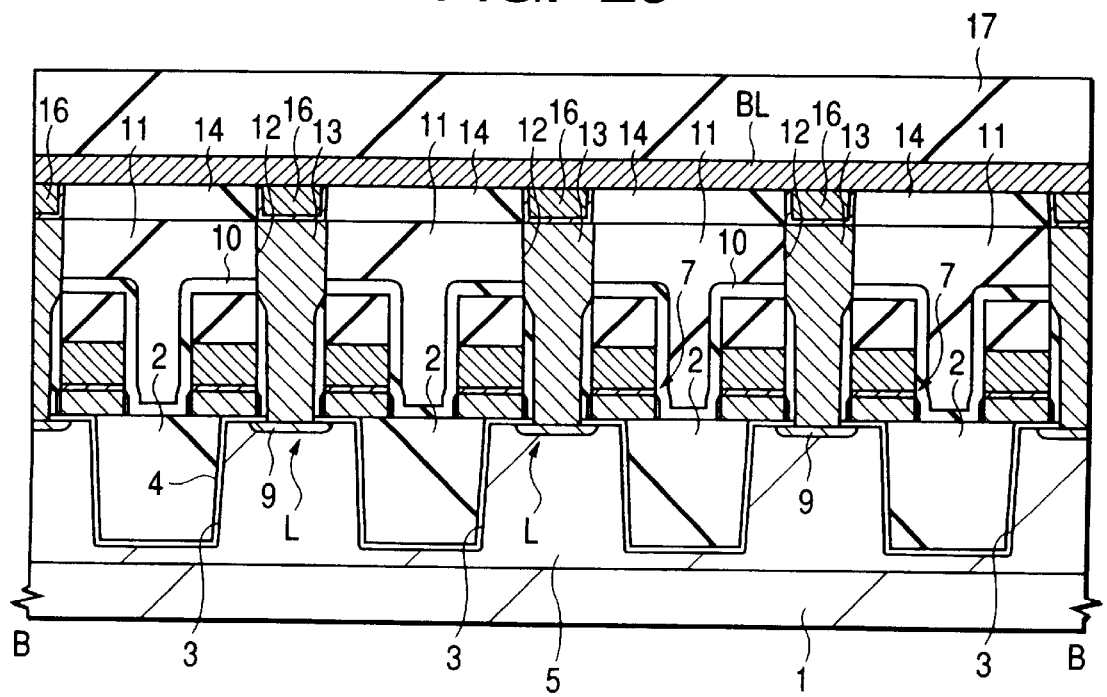
FIG. 29 is a sectional view illustrating a step in the production of the DRAM according to the embodiment 1 in the order of steps.
Figure 30:
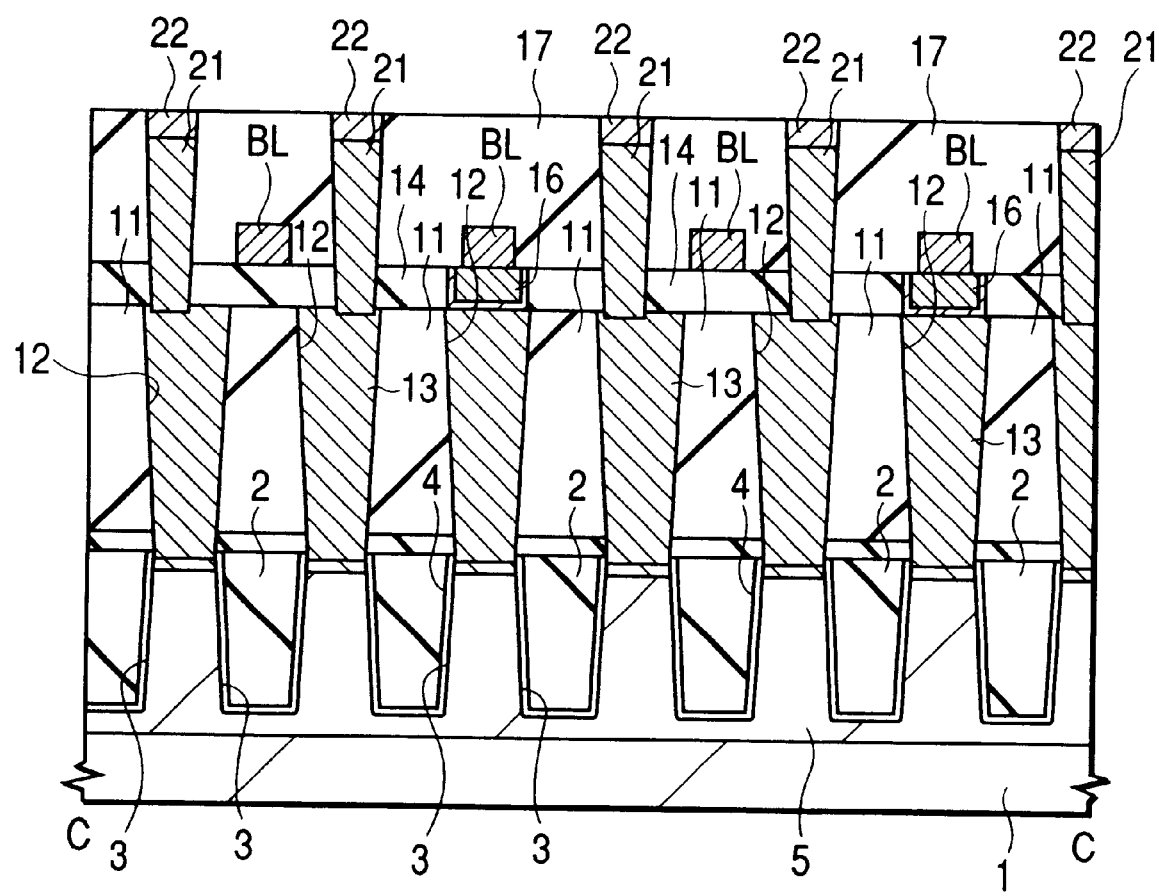
FIG. 30 is a sectional view illustrating a step in the production of the DRAM according to the embodiment 1 in the order of steps.

Referring next to FIGS. 28 to 30, plugs 21 are formed in the through holes 18. The plugs 21 are formed of polycrystalline silicon. The plugs 21 are formed by depositing, for example, a polycrystalline silicon film on the insulating film 17 by the CVD method, and etching back the polycrystalline silicon film so as to be left in the through holes 18. The etching-back method may be replaced by the CMP method. The hard mask 19 and the side wall spacers 20 are removed through the polishing by an etching back or CMP method.

Further, a ruthenium silicide (RuSi) film 22 is formed on the plugs 21. The ruthenium silicide film 22 is formed, as described below. That is, the etching back is effected to a certain degree to excessively etch the plugs 21 at the upper part in the through holes 18. Or, after the polishing by the CMP method, the plugs 21 are etched back to form dents in the upper parts of the through holes 18. Thereafter, a ruthenium silicide film is deposited by sputtering or CVD so as to fill the dents and is then removed from the portions other than the dents by etching back or CMP, so that the ruthenium silicide film 22 remains in the dents only.

Or, after the plugs 21 are formed, a ruthenium film is deposited on the whole surface of the semiconductor substrate 1, and the semiconductor substrate 1 is heat-treated to execute a silicide reaction at a portion where the plugs 21 are in contact with the ruthenium film, thereby to form the ruthenium silicide 22 on the plugs 21. The unreacted ruthenium film it selectively removed by, for example, wet-etching.

Figure 31:
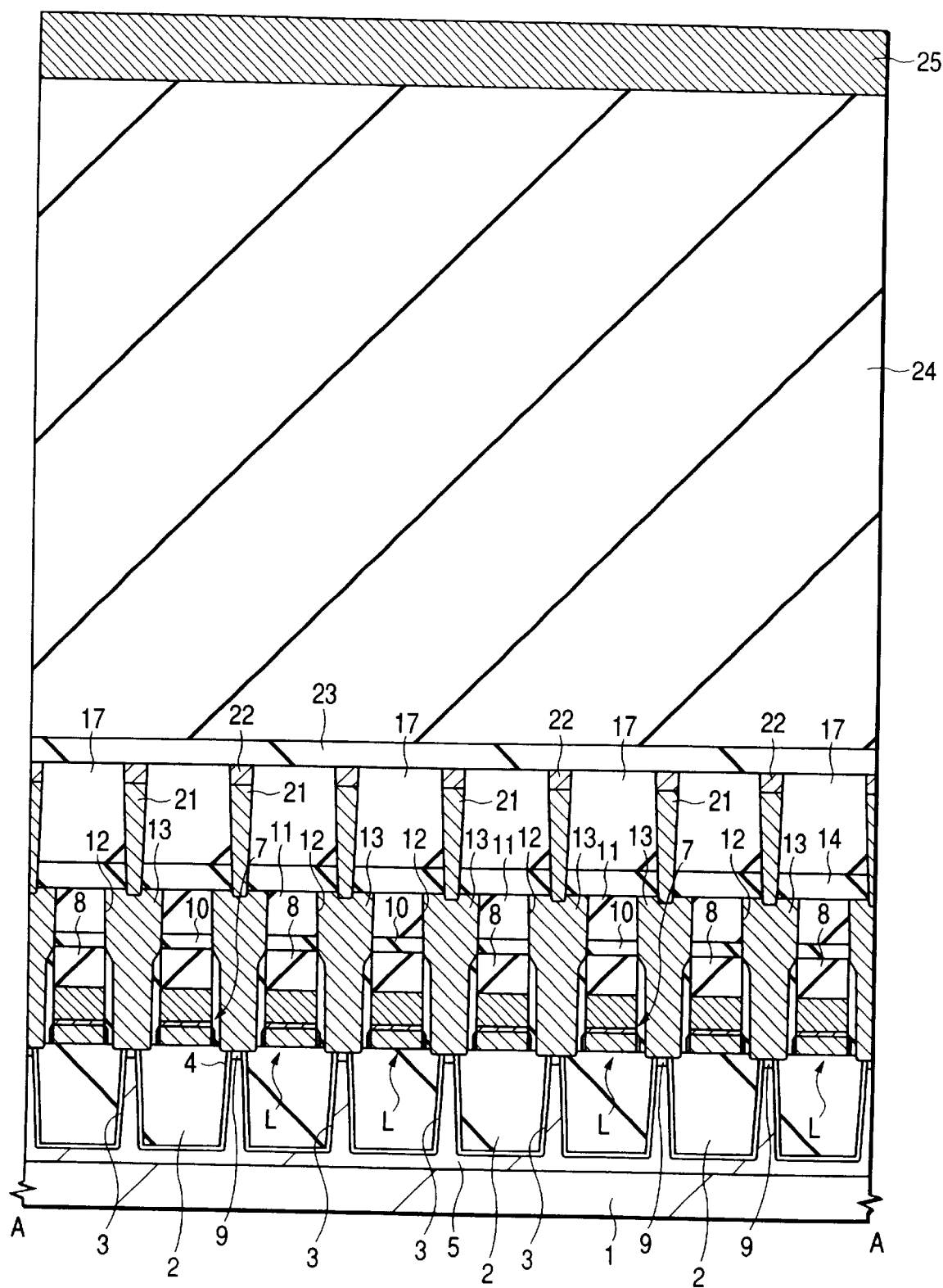
FIG. 31 is a sectional view illustrating a step in the production of the DRAM according to the embodiment 1 in the order of steps.

Referring next to FIG. 31, a silicon nitride film 23 and a silicon oxide film 24 are formed on the insulating film 17 in which the plugs 21 and ruthenium silicide 22 have been formed. The silicon nitride film 23 and the silicon oxide film 24 are deposited by, for example, the CVD method. The silicon nitride film 23 works as an etching stopper at the time of forming holes 26, as will be described later, and its thickness is selected as so to exhibit a stopper function.The silicon nitride film 23 has a thickness of, for example, 200 nm. The silicon oxide film 24 is formed for machining the lower electrode of a capacitor, and its thickness is calculated from the surface area (electrode area) of the lower electrode that is capable of maintaining a necessary capacity. The electrode area required for the lower electrode varies depending upon the area occupied by the capacitor, or upon the thickness and dielectric constant of a capacitor-insulating film. A hard mask 25 is formed on the silicon oxide film 24.

Referring next to FIGS. 32 to 35, the hard mask 25 is patterned, and holes (openings) 26 are formed by etching the silicon oxide film 24 and the silicon nitride film 23 by using the patterned hard mask 25 as a mask. The lower electrodes of the capacitors are formed on the inner surfaces of the holes 26.

Figure 32:
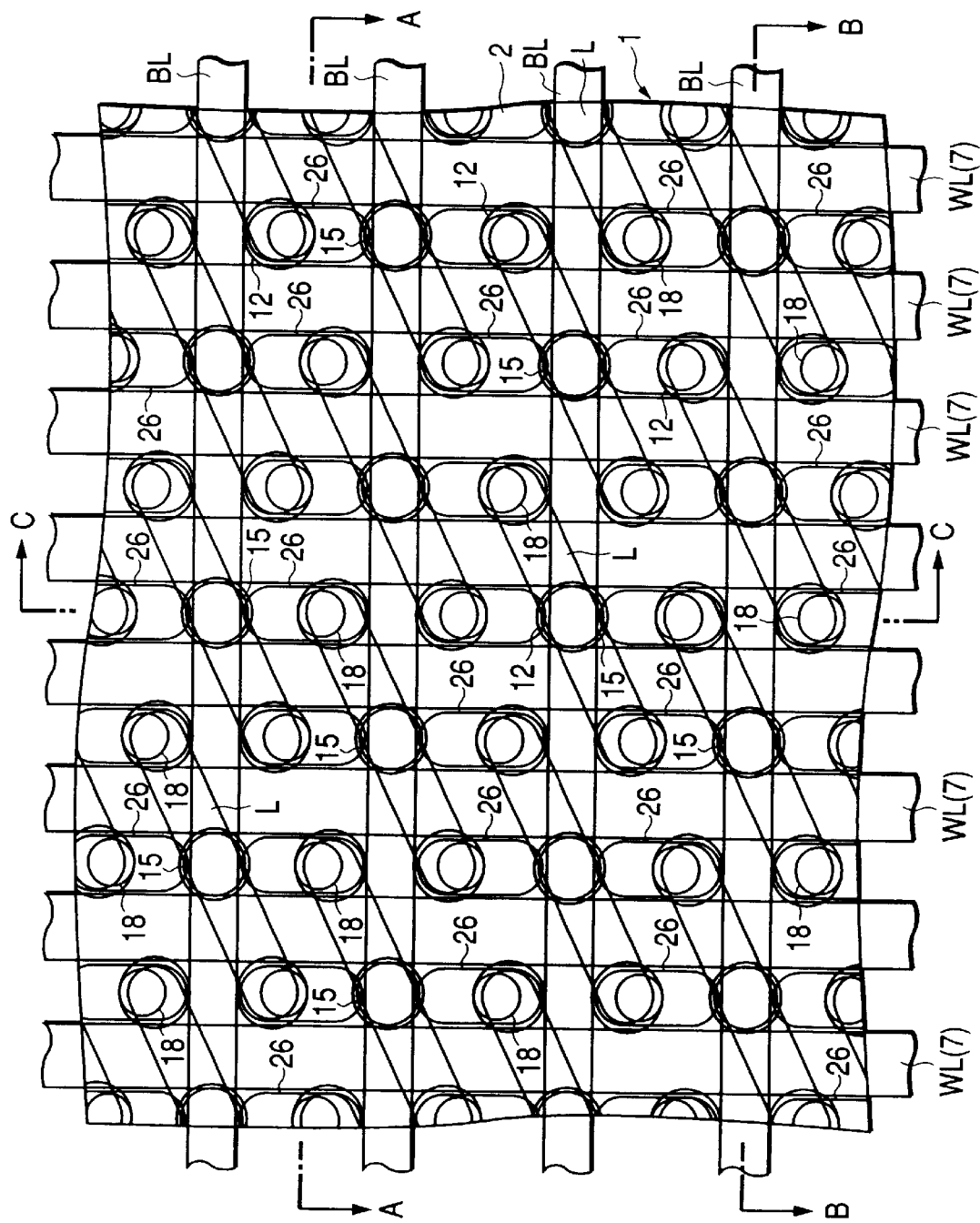
FIG. 32 is a plan view illustrating a step in the production of the DRAM according to the embodiment 1 in the order of steps.
Figure 33:
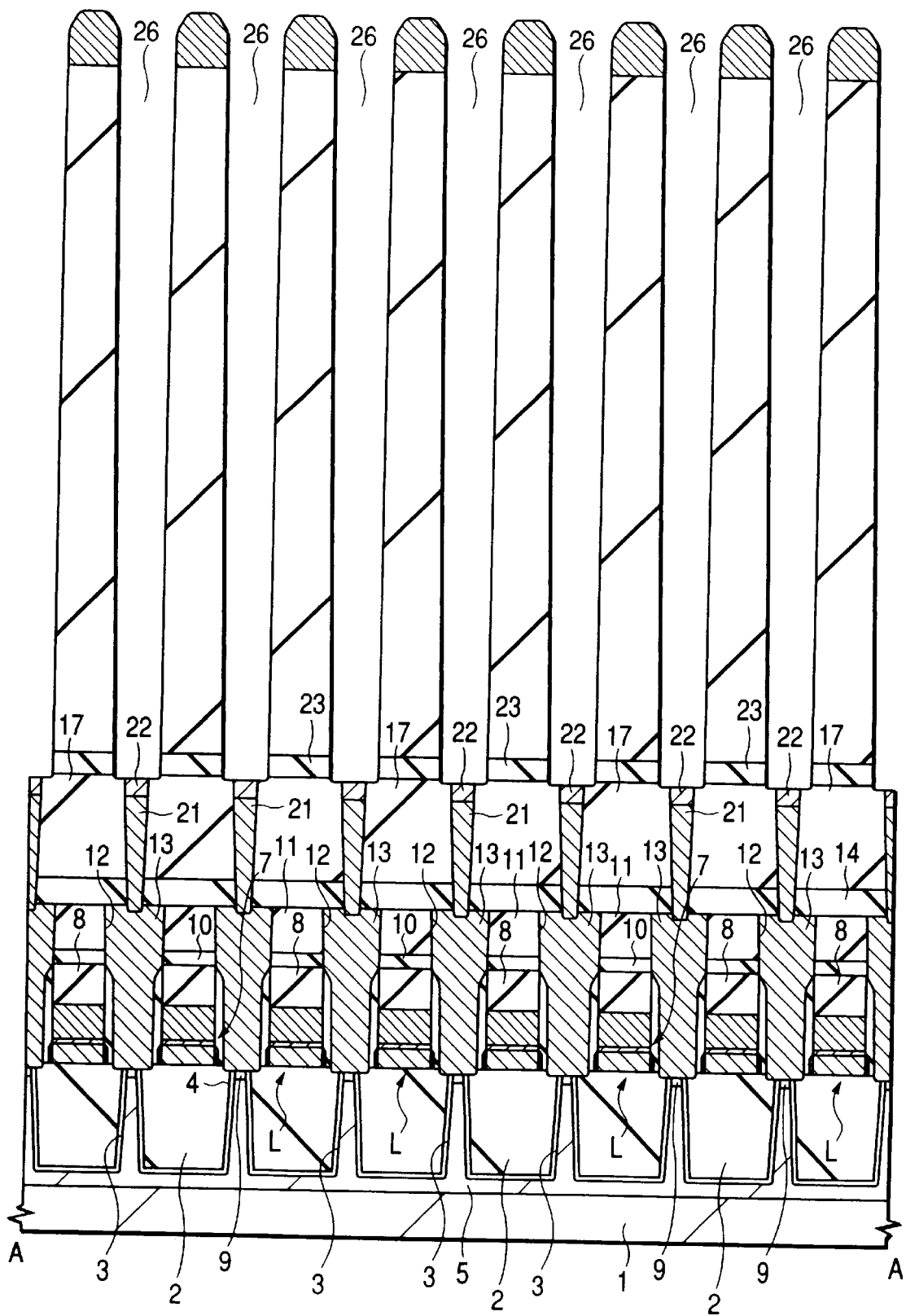
FIG. 33 is a sectional view illustrating a step in the production of the DRAM according to the embodiment 1 in the order of steps.
Figure 34:
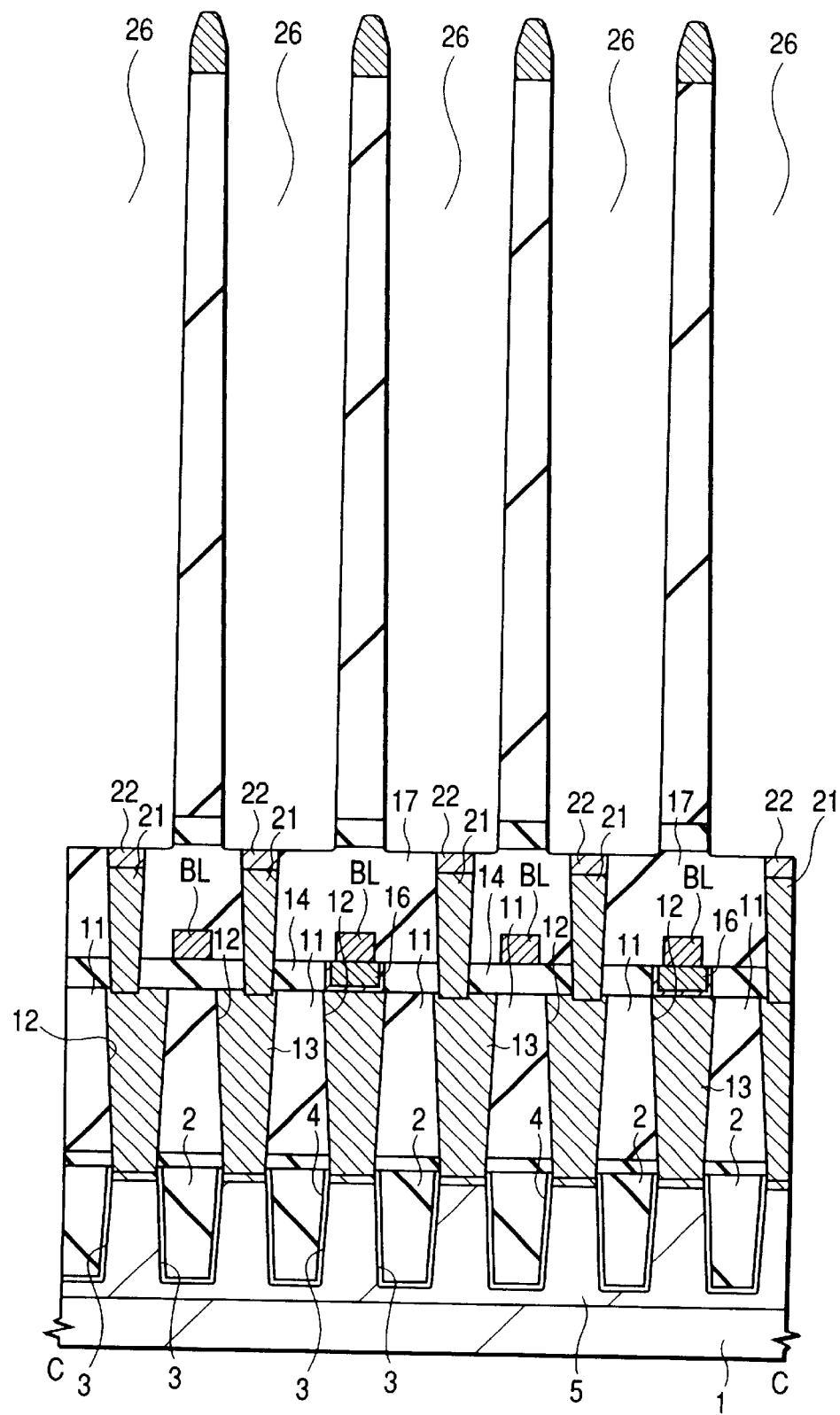
FIG. 34 is a sectional view illustrating a step in the production of the DRAM according to the embodiment 1 in the order of steps.

The hard mask 25 is patterned by etching using the photoresist film as a mask. The hard mask 25 is patterned by plane-patterning as shown in FIG. 32.

The holes 26 are formed by an anisotropic dry-etching. The etching is first conducted under a selective etching condition in which the silicon oxide film is etched at a large rate and the silicon nitride film is etched at a small rate. Here, the silicon nitride film 23 is little etched and works as an etching stopper in the first etching. Next, the second etching is conducted under a condition where the silicon nitride film is easily etched. The silicon nitride film 23 is thus etched to form the holes 26. Upon conducting the etching in two steps, the insulating film 17 lying under the silicon nitride film 23 is prevented from being excessively etched. Thus, the surfaces of the ruthenium silicide 22 on the upper part of the plugs 21 are exposed.

Figure 35:
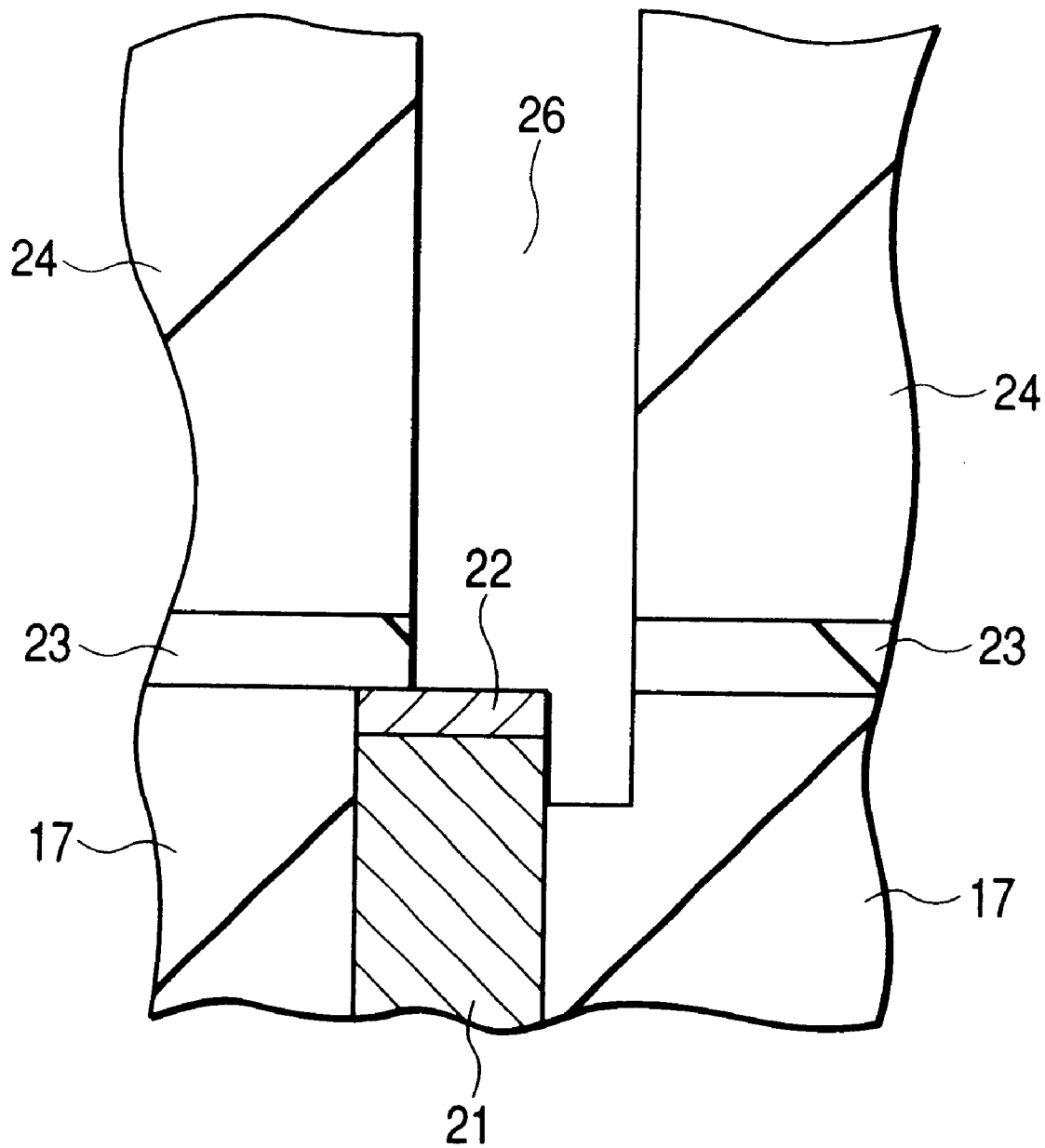
FIG. 35 is a sectional view illustrating a step in the production of the DRAM according to the embodiment 1 in the order of steps.

FIG. 35 is a sectional view illustrating the bottom of the hole 26 on an enlarged scale. As described above, the hole 26 is formed by using the silicon nitride film 23 and by effecting the etching in two steps. Therefore, the insulating film 17 is suppressed from being excessively etched in the bottom of the hole 26. In the highly integrated memory cells of the DRAM, however, it is not possible to avoid deviation (matching deviation) of the holes 26 from the plugs 21, and the insulating film 17 is often excessively etched. FIG. 35 illustrates such a case in an exaggerated manner. That is, in the bottom of the hole 26, not only is the surface of the ruthenium silicide 22 exposed, but also the side surface of the plug 21 formed of polycrystalline silicon is partly exposed. When a tantalum oxide film, which is a capacitor-insulating film, is formed under such a condition, the polycrystalline silicon comes into direct contact with the tantalum oxide film at some portion to impair the reliability of the capacitor-insulating film as described earlier. In this embodiment, however, the above problem does not occur since the polycrystalline silicon does not come into direct contact with the capacitor-insulating film owing to the formation of the barrier layer.

Figure 36:
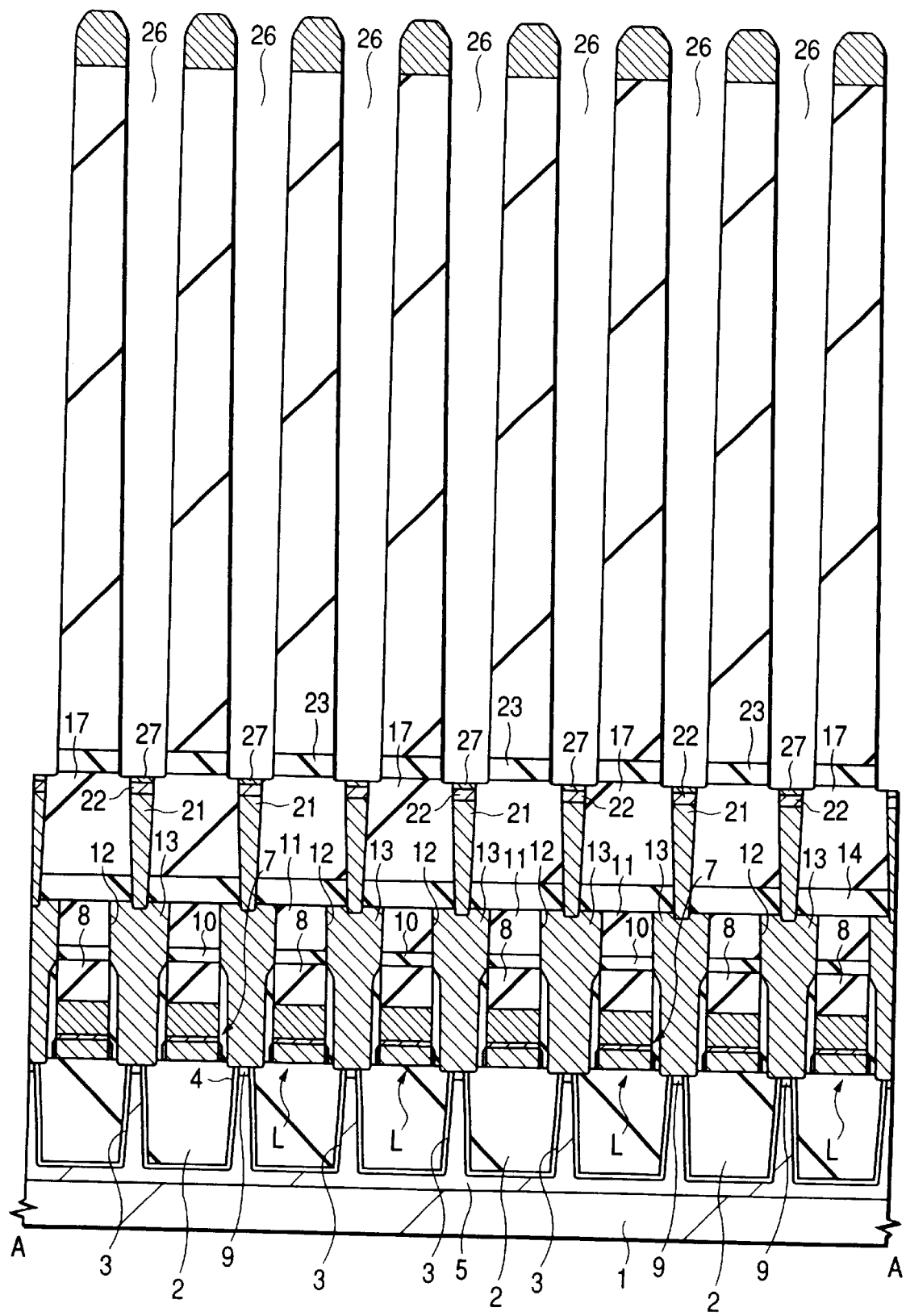
FIG. 36 is a sectional view illustrating a step in the production of the DRAM according to the embodiment 1 in the order of steps.
Figure 37:
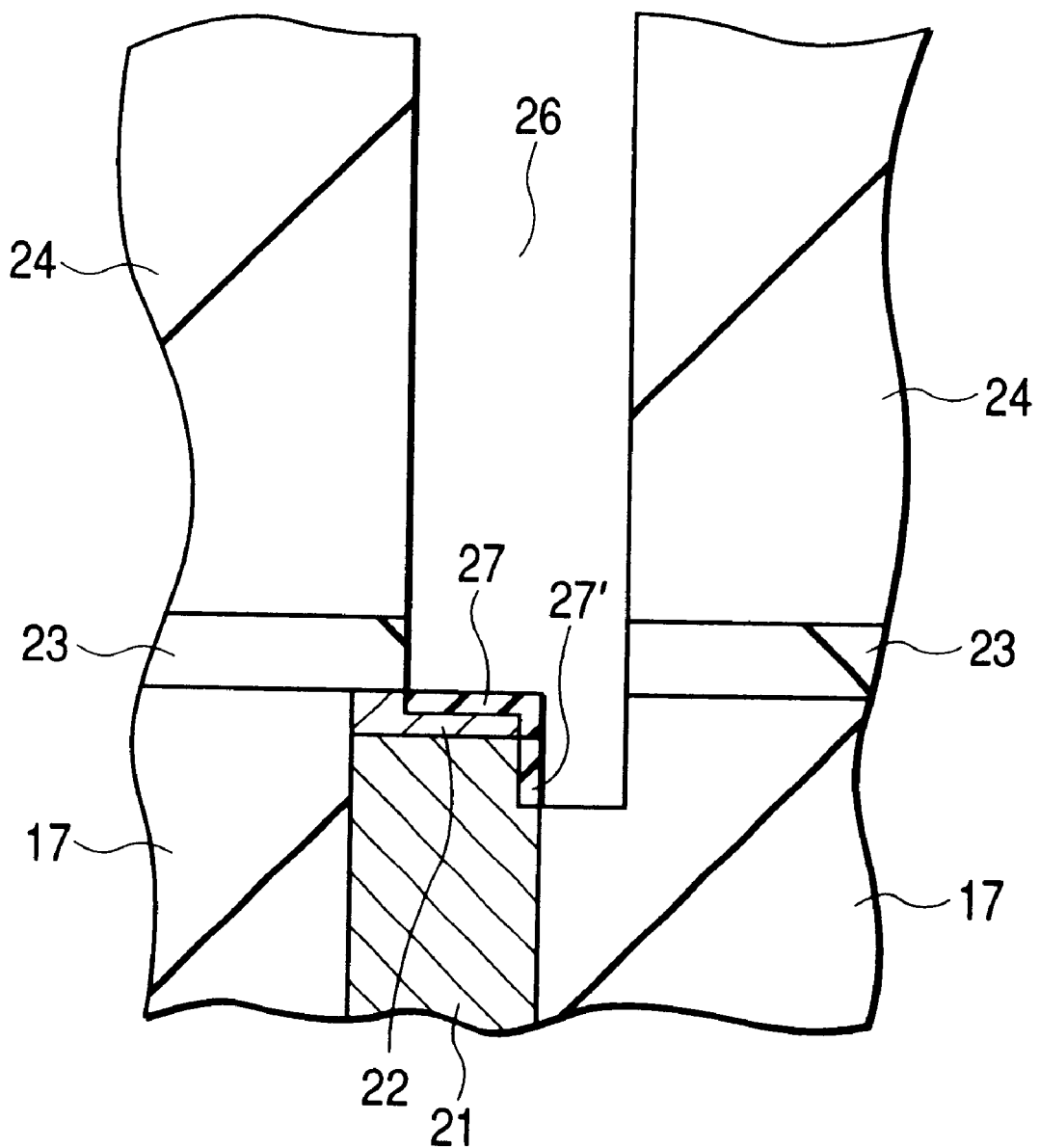
FIG. 37 is a sectional view illustrating a step in the production of the DRAM according to the embodiment 1 in the order of steps.

Referring next to FIGS. 36 and 37, a barrier film 27 is formed on the surface of the ruthenium silicide 22 on the bottom of the hole 26. FIG. 37 is a sectional view illustrating the bottom of the hole 26 on an enlarged scale like FIG. 35.

The barrier film 27 is formed by oxidizing the semiconductor substrate 1. The oxidation treatment is conducted by leaving the semiconductor substrate 1 in an atmosphere of, for example, about 1000C for about 3 minutes. The barrier film 27 formed by the oxidation treatment is usually a spontaneously oxidized film which is self-aligned relative to the ruthenium silicide 22 on the bottoms of the holes 26. The barrier film 27 formed on the ruthenium silicide 22 is an oxide film of ruthenium silicide. It is desired that the barrier film 27, which is spontaneously oxidized by being left to stand in the open atmosphere, has a thickness of smaller than 0.5 nm. This thin spontaneously oxidized film does not impair the electric conduction between the plugs 21 and the lower electrodes.

The presence of the barrier film 27 hinders the reaction between the lower electrode (ruthenium metal) that will be described below and the ruthenium silicide 22, and suppresses the lower electrode (ruthenium) from being converted into a silicide thereof. That is, when silicon or ruthenium silicide (plug) comes into direct contact with ruthenium (lower electrode), silicon is fed from the plug side to the ruthenium (lower electrode) side, ruthenium is converted into a silicide thereof, causing the shape of the lower electrodes to become abnormal. Such an abnormal shape exerts undesired stress on the capacitor-insulating film, resulting in an increase in the leakage current through the capacitor-insulating film. Further, silicon fed to ruthenium (lower electrode) diffuses in the lower electrode and reaches the capacitor-insulating film. The diffused silicon atoms combine with oxygen atoms contained in the capacitor-insulating film to form a silicon oxide film having a small dielectric constant. The presence of the silicon oxide film between the lower electrode and the capacitor-insulating film substantially decreases the dielectric constant of the capacitor-insulating film and, hence, decreases the capacity stored in the capacitor. As will be described later, further, oxygen may reach the plugs 21 through the lower electrodes in the step of forming the capacitor-insulating film. When oxygen reaches the plugs 21, a silicon oxide is formed which is an insulator due to the combination of the plug material (polycrystalline silicon) with oxygen. Formation of the insulator impairs the electric conduction between the plug 21 and the lower electrode causing an increase in the resistance. In this embodiment, however, the above hindrance does not occur due to the formation of the barrier film 27, and a highly reliable capacitor is constituted.

Further, even when the silicon nitride film 23 is utilized as an etching stopper in forming the holes 26 (openings), it often happens that the etching selection ratio is not maintained high enough and the side walls of the plugs 21 are exposed. Even in such a case, however, the silicon oxide film is formed as a barrier layer on the side walls (exposed portions) of the plugs 21 (portion 27 in FIG. 37). This avoids the probability of direct contact between the lower electrode and the plug 21, preventing the occurrence of the above problem.

Further, since the barrier film 27 is a thin oxide film formed on the bottoms of the holes 26 (openings), the deep holes 26 can be utilized as regions for forming the lower electrodes to a sufficient degree.

Besides, since the insulating film (silicon oxide film 24) having holes 26 (openings) formed therein is left, the upper portions of the capacitors are easily flattened making it possible to highly densely form the upper wirings.

Figure 38:
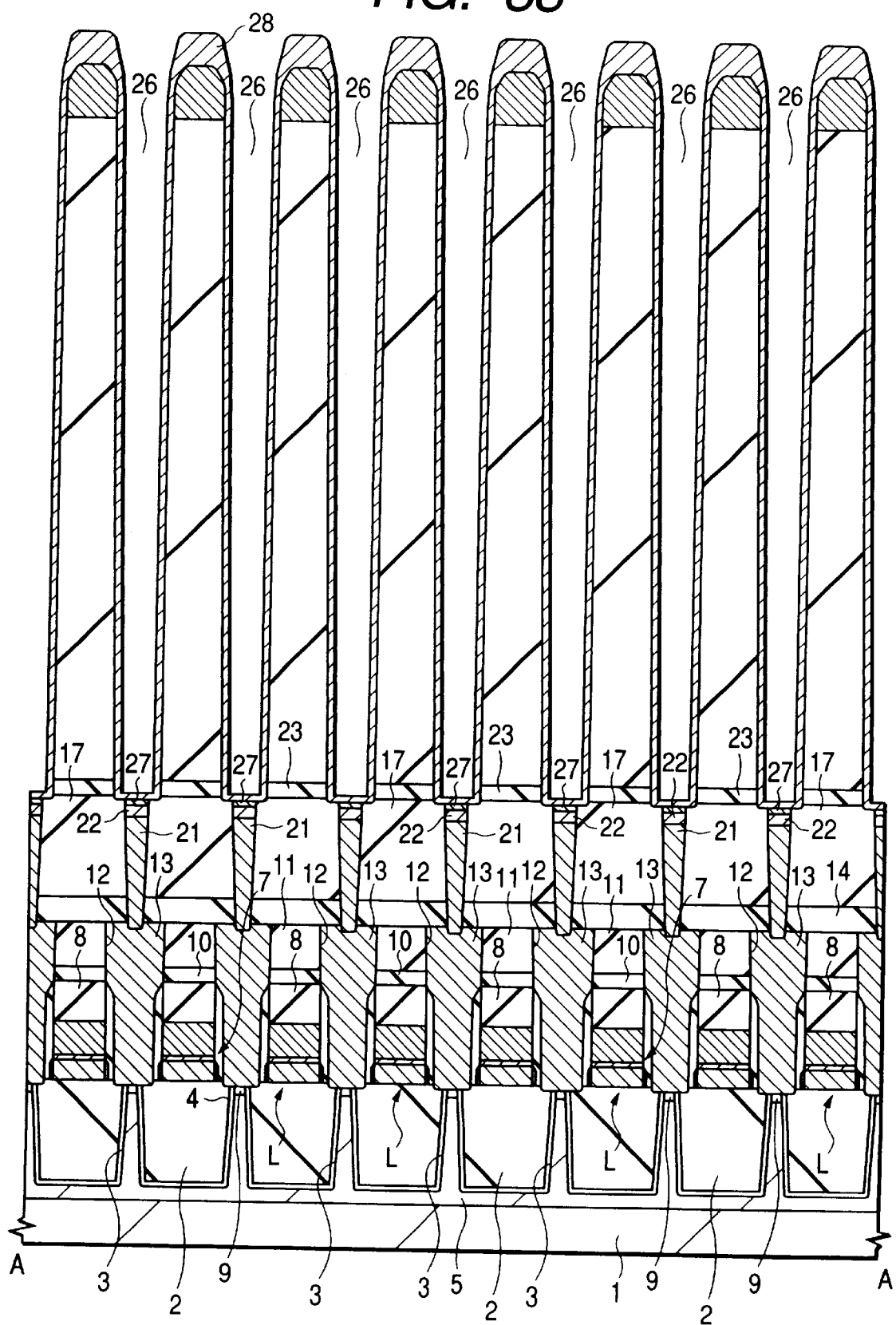
FIG. 38 is a sectional view illustrating a step in the production of the DRAM according to the embodiment 1 in the order of steps.

Referring next to FIG. 38, a ruthenium film 28 is formed to form the lower electrodes. The ruthenium film 28 is so formed as to cover the side walls and bottom surfaces of the holes 26. The ruthenium film 28 is formed by, for example, the CVD method to a thickness of, for example, 20 nm. Due to the CVD method, the ruthenium film 28 is formed on the side walls of the holes 26, too, maintaining a sufficiently large thickness.

Figure 39:
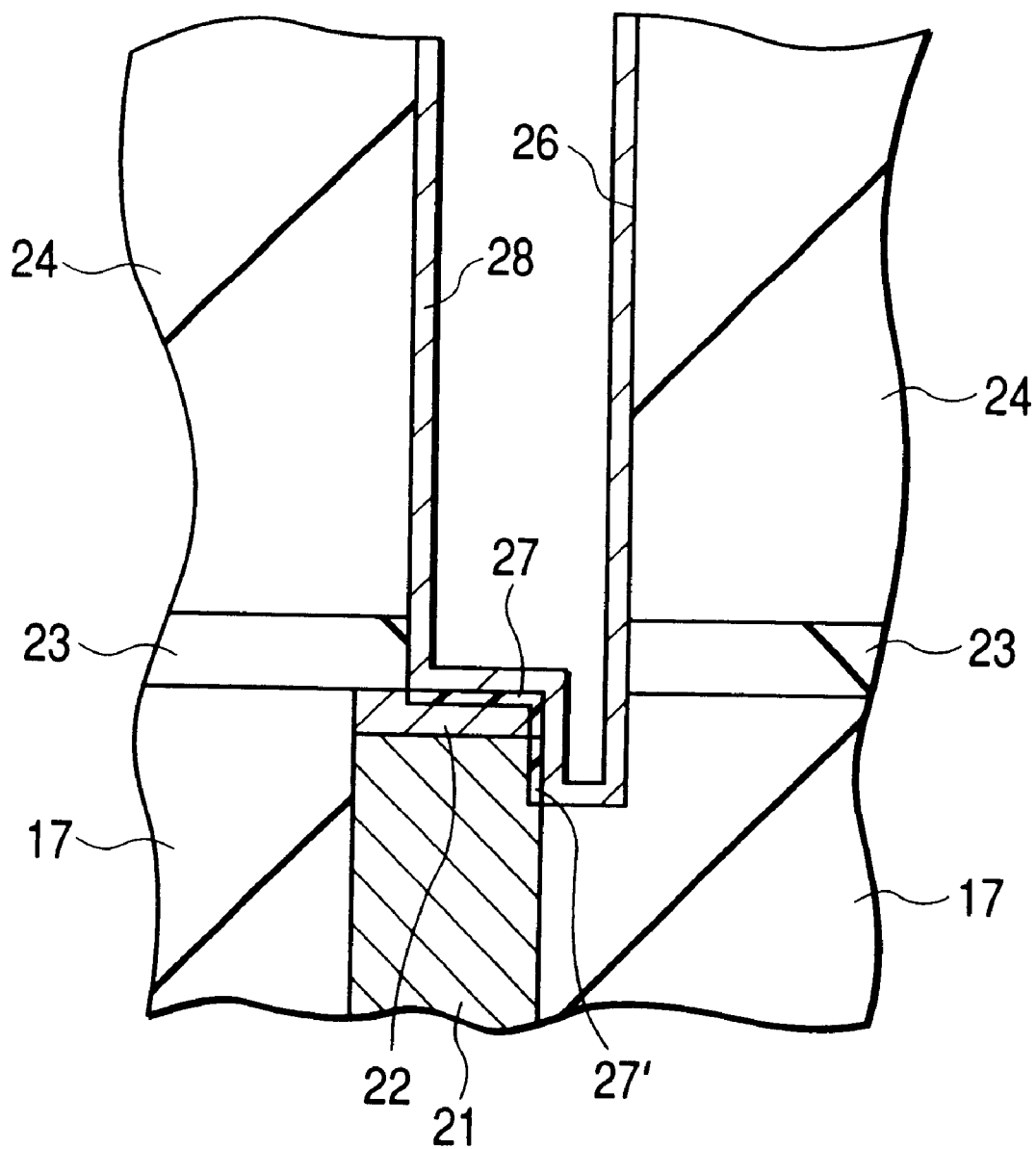
FIG. 39 is a sectional view illustrating a step in the production of the DRAM according to the embodiment 1 in the order of steps.
Figure 40:
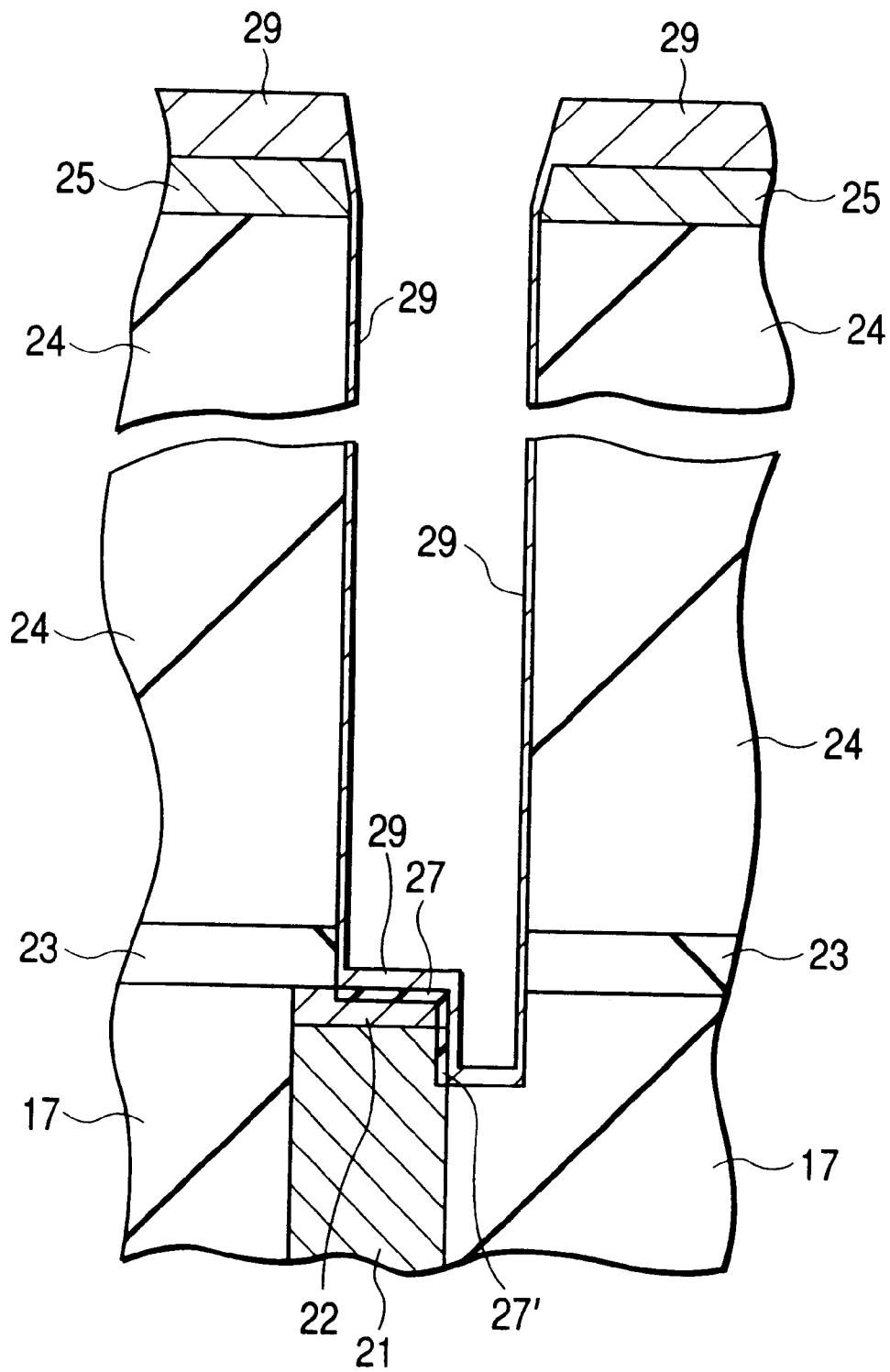
FIG. 40 is a sectional view illustrating a step in the production of the DRAM according to the embodiment 1 in the order of steps.

FIG. 39 is a sectional view illustrating the bottom of the hole 26 on an enlarged scale. Since the barrier film 27 is formed very thinly in a self-aligned manner as described above, the ruthenium film 28 is formed favorably covering the bottoms of the holes 26 enabling the deep holes 26 to be utilized as regions for forming the lower electrodes to a sufficient degree.

Figure 41:
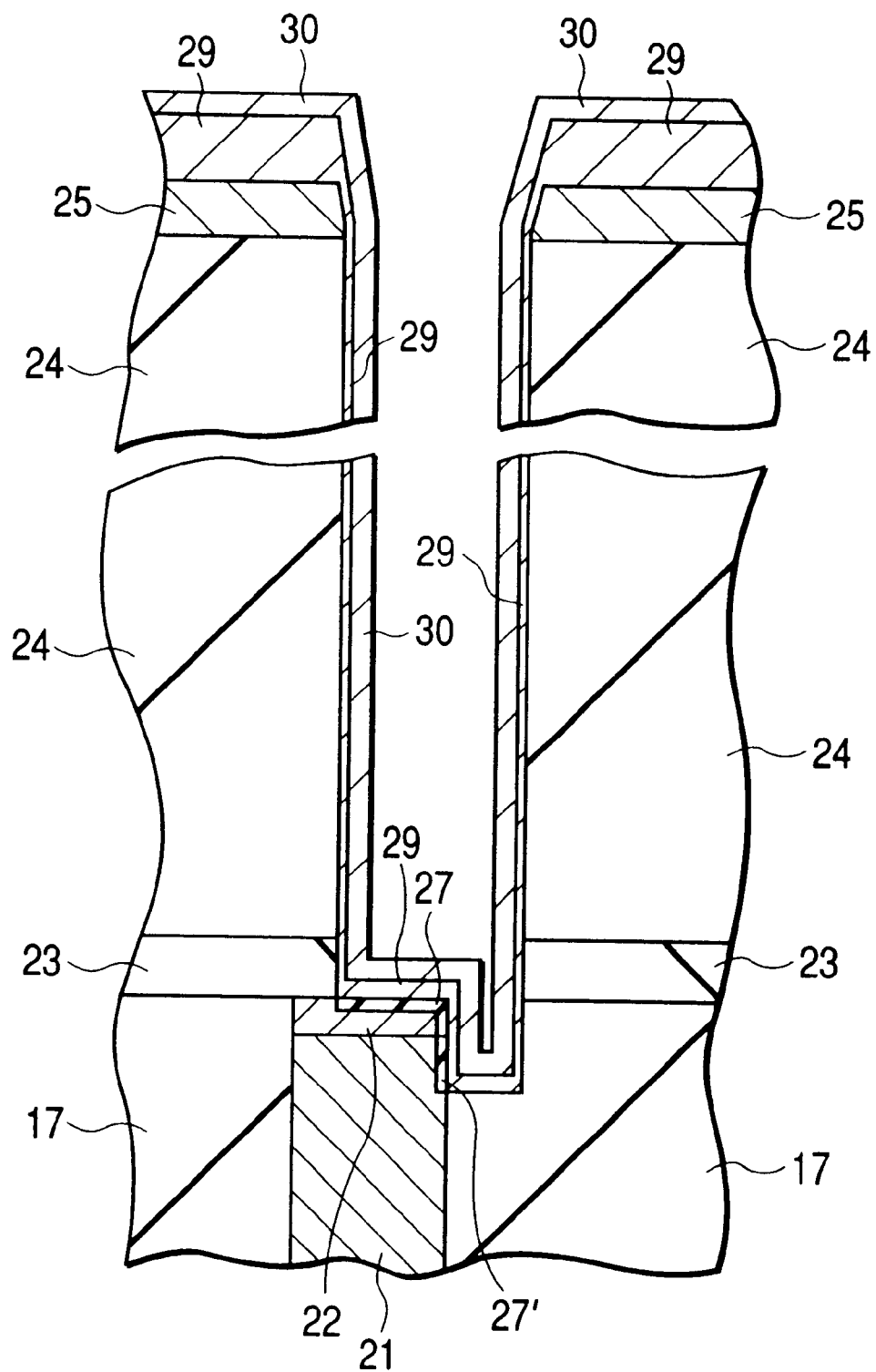
FIG. 41 is a sectional view illustrating a step in the production of the DRAM according to the embodiment 1 in the order of steps.

In the foregoing, an example of forming the ruthenium film 28 by the CVD method has been described. However, a ruthenium film 29 may be formed by sputtering prior to forming the ruthenium film 28 by the CVD method. That is, referring to FIG. 40, the ruthenium film 29 is formed by sputtering, and, then, a ruthenium film 30 is formed by the CVD method as shown in FIG. 41.

The ruthenium film 29 is formed by sputtering and is almost not deposited on the side walls of the holes 26, but is thickly formed on only the surfaces and bottoms of the holes 26. Therefore, the bottoms of the holes 26 are not unnecessarily closed by the presence of the ruthenium film 29. The regions that can be utilized as the lower electrodes are not constricted, either. Though the ruthenium film 29 is almost not deposited on the side walls of the holes, a film thereof is formed to a slight degree. Even such a very thin film works to improve the adhesion to the ruthenium film 30 formed by the CVD method. That is, adhesion to the ruthenium film 30 is improved since the ruthenium film 29 has been formed prior to forming the ruthenium film 30 by the CVD method. On the other hand, since ruthenium is thickly formed on the bottoms of the holes 26, diffusion of silicon is suppressed in the regions of the lower ruthenium despite the presence of silicon atoms that diffuse in the barrier film 27, and the effect upon the capacitor-insulating film is relaxed. Further, the diffusion of oxygen from the capacitor-insulating film is suppressed to suppress the adverse effect of oxygen upon the plugs 21.

Figure 42:
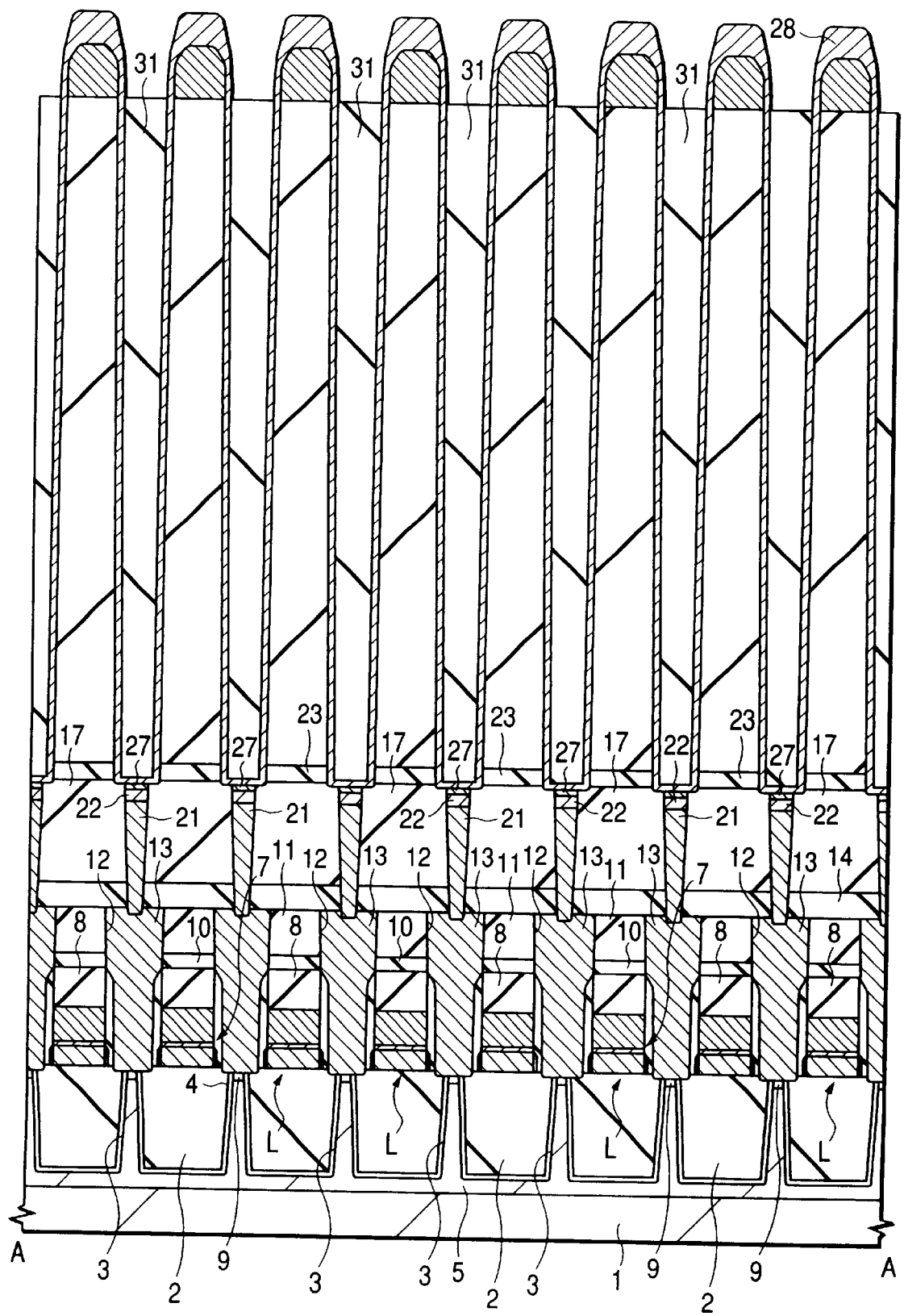
FIG. 42 is a sectional view illustrating a step in the production of the DRAM according to the embodiment 1 in the order of steps.

Referring next to FIG. 42, an insulating film 31 is formed so as to fill the holes 26. The insulating film 31 may be, for example, an SOG film. The insulating film 31, which is an SOG film, is selectively removed at the time of removing the insulating film 31, as will be described later. The insulating film 31 is formed on the whole surface of the semiconductor substrate 1 and is removed by etching back or the like method so as to be filled in the holes 26. The insulating film 31 may be a resist film or the like film in addition to being a SOG film.

Figure 43:
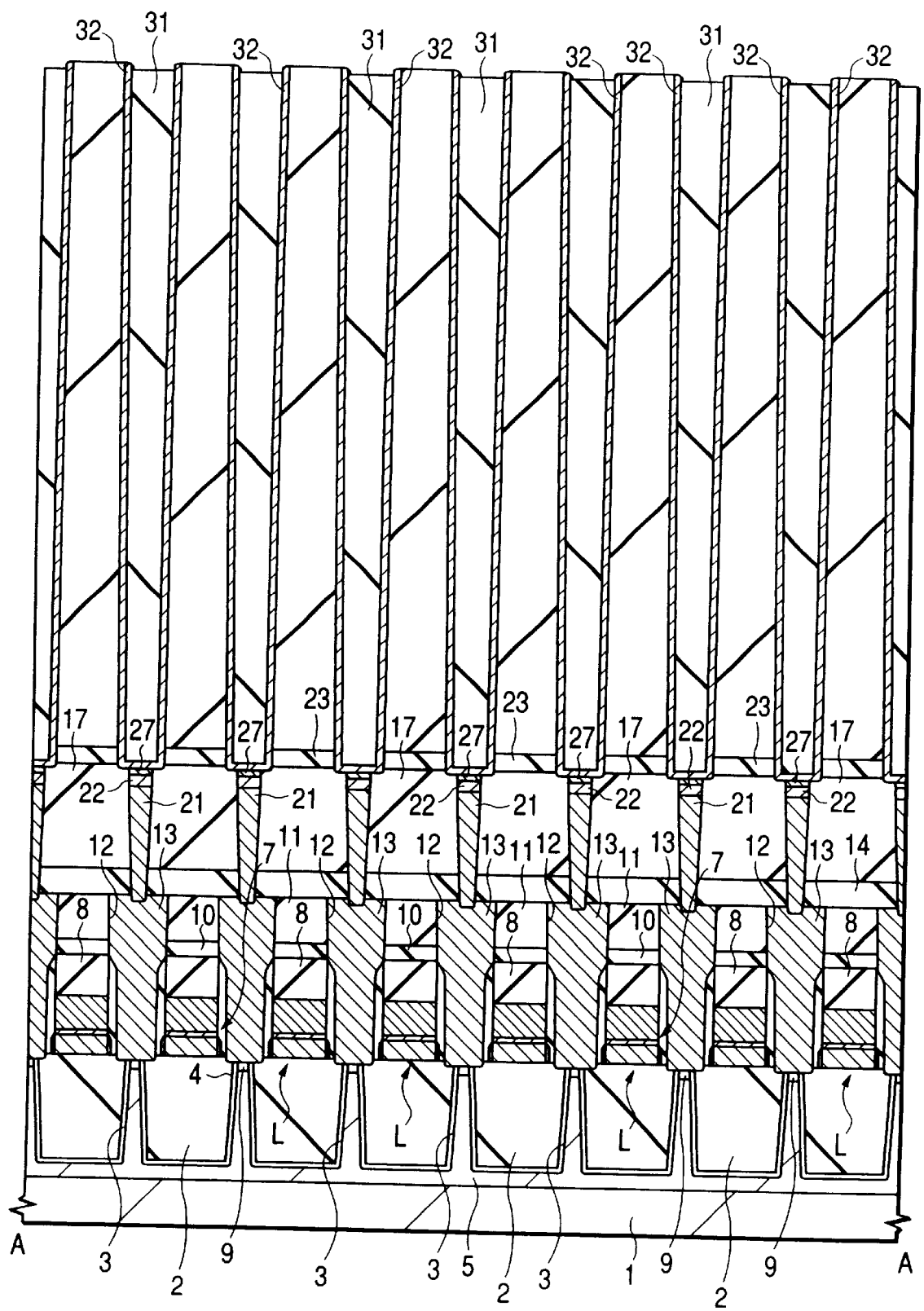
FIG. 43 is a sectional view illustrating a step in the production of the DRAM according to the embodiment 1 in the order of steps.

Referring next to FIG. 43, the ruthenium film 28 is removed from the areas other than the holes 26 by, for example, etching back. Thus, the lower electrodes 32 of the capacitors are formed. At this time, the hard mask 25 is also removed. The CMP method may be employed instead of the etching-back method.

Figure 44:
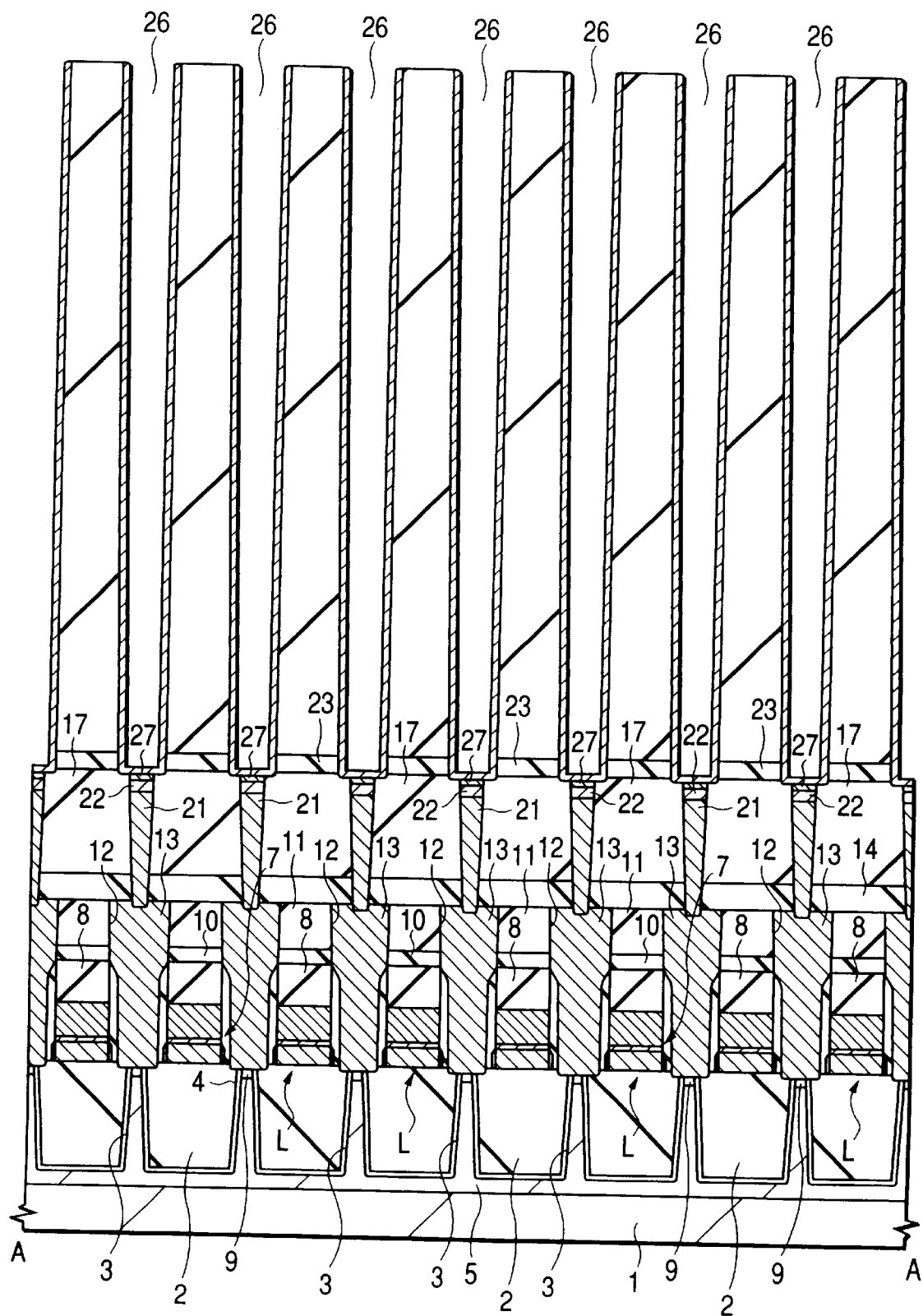
FIG. 44 is a sectional view illustrating a step in the production of the DRAM according to the embodiment 1 in the order of steps.

Referring next to FIG. 44, the insulating film 31 is removed by, for example, wet-etching.

Figure 45:
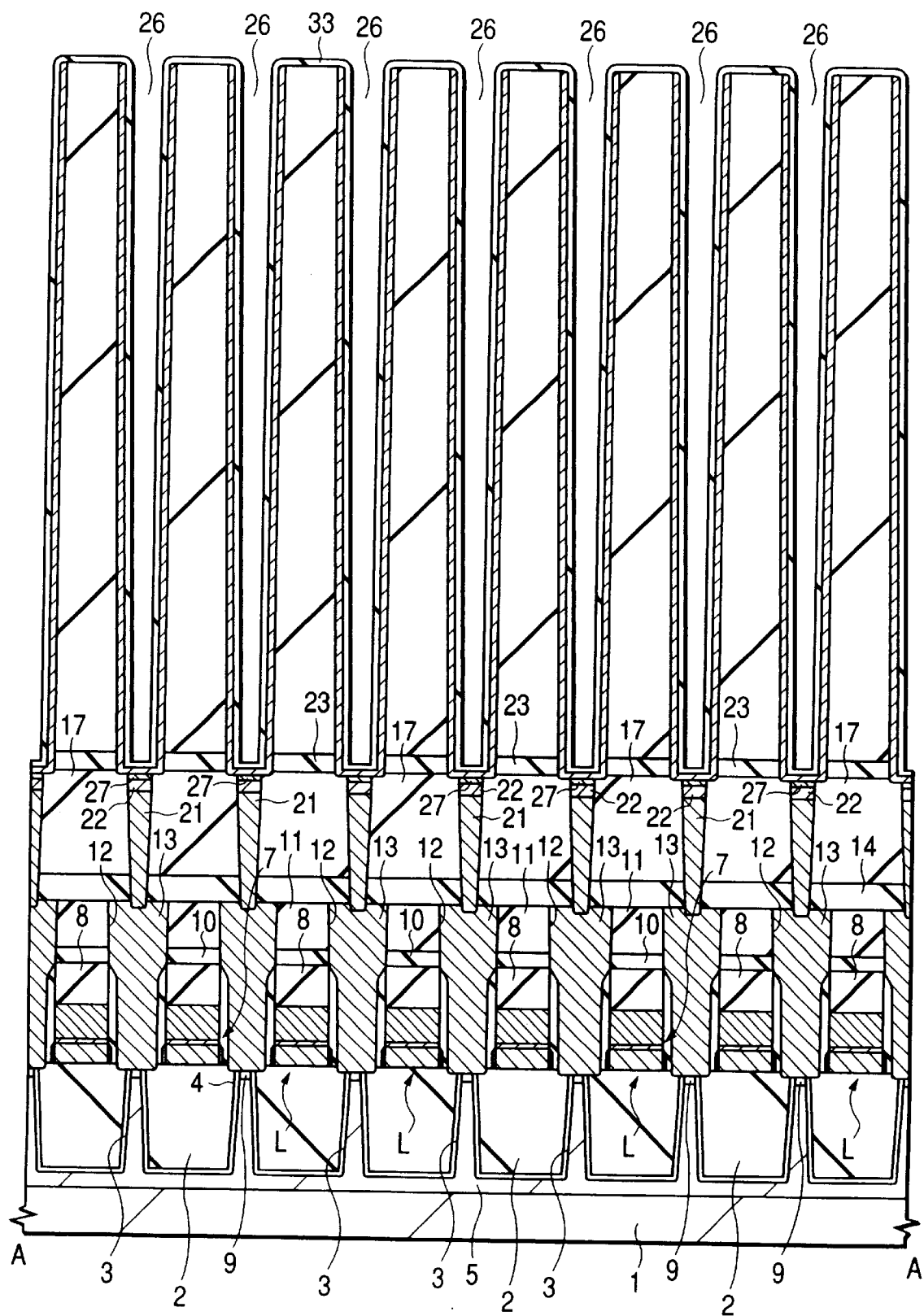
FIG. 45 is a sectional view illustrating a step in the production of the DRAM according to the embodiment 1 in the order of steps.

Then, referring to FIG. 45, a capacitor-insulating film 33 is formed. The capacitor-insulating film 33 is a polycrystalline tantalum oxide film. The capacitor-insulating film 33 is formed in a manner as described below. That is, a tantalum oxide film is deposited to a thickness of about 10 to 15 nm on the whole surface of the semiconductor substrate 1. The tantalum oxide film is deposited by a thermal CVD method by using, for example, a pentaethoxytantalum (Ta(OC$_2$H$_5$)$_5$) as a starting gas and oxygen (O$_2$) as an oxidizing agent, at a treating temperature of, for example, 440° C. and under a treating pressure of, for example, 65 Pa. Upon depositing the tantalum oxide film by the thermal CVD method as described above, excellent step coverage is accomplished.

The tantalum oxide film formed under this condition is a thin amorphous film. Further, the tantalum oxide film contains large amounts of carbon mixed from the starting material as impurities, and is not capable of stably maintaining properties as a capacitor-insulating film and is not practicable. To maintain stability, therefore, the tantalum oxide film must be treated with heat. Upon treating the tantalum oxide film with heat, there is formed a crystallized tantalum oxide film. Due to this heat treatment, the tantalum-oxide film is crystallized and oxygen defects are compensated.

The tantalum oxide film is crystallized by the heat treatment in a nonoxidizing atmosphere at a treating temperature of 500 to 750° C. Thereafter, the crystallized film is reformed by the heat treatment in an oxidizing atmosphere at a treating temperature of 500 to 700° C. Upon executing the crystallization by heat treatment, first, and then executing the reforming by heat treatment, it becomes less probable that the plugs 21, ruthenium silicide 22 and barrier films 27, 27' located on the lower side will be oxidized. The heat treatment for crystallization may be effected in an oxidizing atmosphere.

Figure 46:
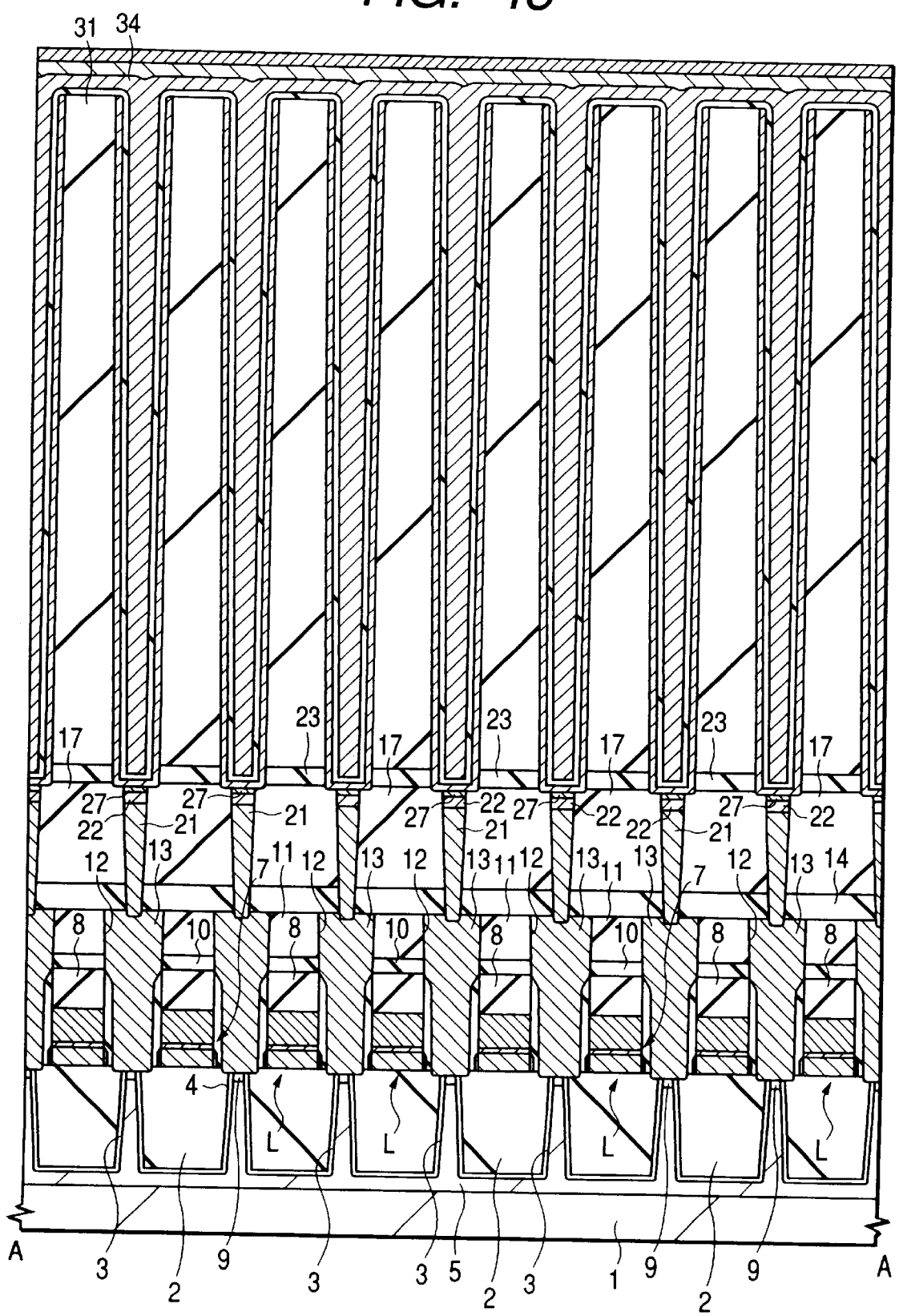
FIG. 46 is a sectional view illustrating a step in the production of the DRAM according to the embodiment 1 in the order of steps.

Referring next to FIG. 46, an upper electrode 34 of the capacitors is formed. The upper electrode 34 may, for example, be formed of a ruthenium film. The upper electrode 34 is formed by the CVD method so as to fill fine holes 26. When a tantalum oxide film is used as the capacitor-insulating film, a titanium nitride film may be used as a material of the upper electrode 34. As the upper electrode 34, there can be further used a film of a laminate of layers of titanium nitride and tungsten in addition to ruthenium. Capacitors of the memory cells of the D are thus formed.

Thereafter, an insulating film is formed so as to cover the capacitor, and an upper wiring such as a second wiring is formed, which, however, are not described here in detail.

According to this embodiment, the barrier film 27 is formed on the bottoms of the holes 26 in a self-aligned manner to obtain the above-mentioned effect, thereby improving the reliability of the capacitor-insulating film, substantially preventing a drop in the dielectric constant of the capacitor-insulating film, and suppressing an increase in the connection resistance between the lower electrodes of the capacitors and the plugs. In a highly integrated DRAM in which a mask is likely to be deviated, the positions of the lower electrodes are deviated from the plugs. Even in this case, however, the reliability of the capacitor-insulating film does not decrease.

In this embodiment, as shown in the drawings described above, the depth of the holes 62 is very much larger than the diameter thereof. That is, the holes 62 have a large aspect ratio. The capacitors of this structure can be divided into a capacitor C1 created by the side wall of a cylindrical shape and a capacitor C2 created by the bottom surface, as components forming a capacitance of the capacitor. The capacity C of the capacitor as a whole is C=C1+C2. In this embodiment, C1 has an area larger than that of C2. Therefore, the capacity C Of the capacitor is dominated by C1. With the capacitor structure of this embodiment, further, the component C1 can be increased by increasing the depth of the hole 26 (height of the lower electrode of the capacitor) without increasing the area occupied by the hole 26, making it possible to maintain a desired capacity of the capacitor without relying upon C2, of which the capacity is limited by a plane area occupied by the capacitor.

Embodiment 2.

FIGS. 47(*a*) to 47(*f*) are sectional views illustrating a method of producing a DRAM according to another embodiment of this invention in the order of steps.

The method of producing the DRAM of this embodiment is nearly the same as that of the embodiment 1 up to the steps of FIGS. 28, 29 and 30. Therefore, the description up to the above steps is not repeated. Here, however, the ruthenium silicide 22 is not formed, but the plugs 21 are so formed as to be completely buried in the through holes 18.

Then, the silicon nitride film 23 and the silicon oxide film 24 are formed as shown in FIG. 31, and the holes 26 are formed as shown in FIGS. 32 to 35 (FIG. 47(*a*)). Here, however, FIGS. 47(*a*) to 47(*f*) illustrate the portion of the hole 26 only, but do not illustrate the hard mask 25. Besides, the aspect ratio of the hole 26 is shown as being smaller than the real ratio (the depth of the hole 26 is small). The same holds in the sectional views of FIGS. 48(*a*) to 48(*c*) and subsequent drawings, which, however, is not described concerning the subsequent drawings.

Figure 47A:
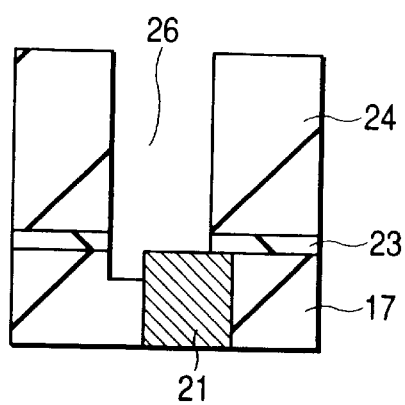
FIGS. 47(a) to 47(f) are sectional views illustrating steps in the production of a DRAM according to an embodiment 2 of this invention in the order of steps.
Figure 47D:
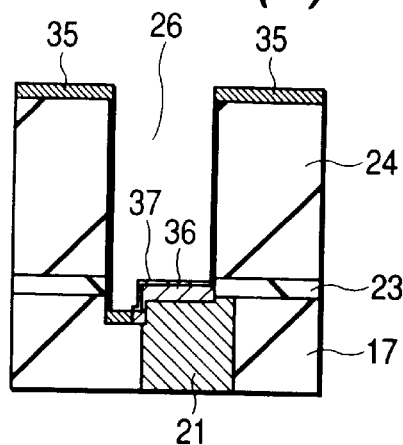
Figure 47B:
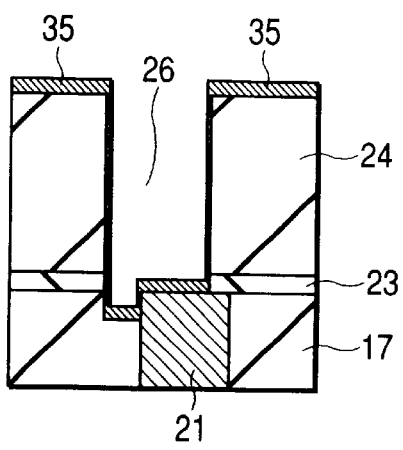

Referring next to FIG. 47(b), a ruthenium film 35 is-formed by sputtering. Due to the sputtering method, the ruthenium film 35 is thickly formed on the bottoms of the holes 26 and on the surface of the silicon oxide film 24, but almost no film is formed on the side walls of the holes 26.

Figure 47E:
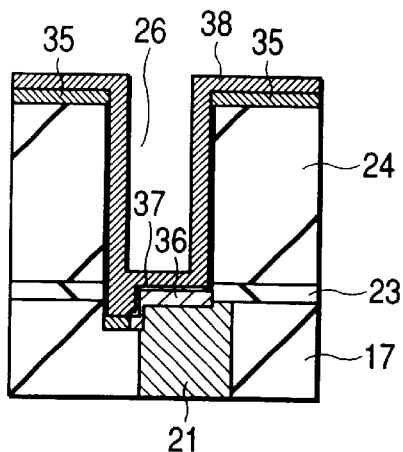
Figure 47C:
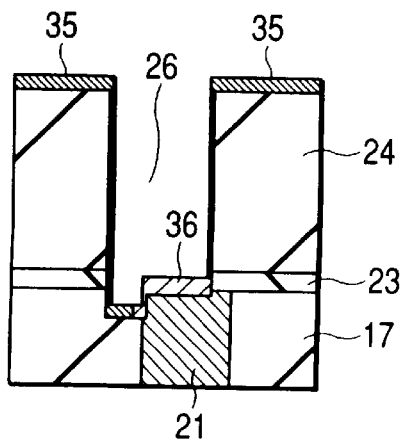
Figure 47F:
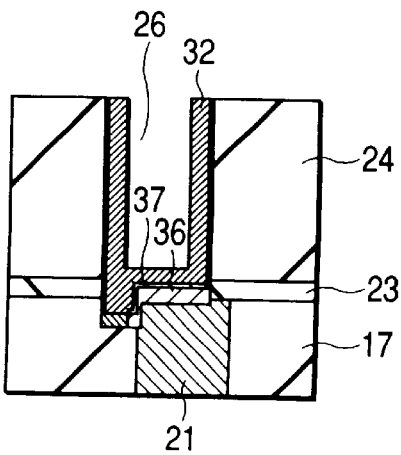

Referring next to FIG. 47(c), the whole surface is heat-treated to cause the ruthenium film 35 to react with the plug 21 of silicon thereby to form a ruthenium silicide film 36. The heat treatment is conducted in an atmosphere containing hydrogen at 700° C. for 5 minutes. The atmosphere, however, need not necessarily contain hydrogen. Thus, the ruthenium silicide film 36 is formed by the heat treatment on only the region where the ruthenium film 35 is in contact with the plug 21 of silicon in a self-aligned manner. There exists no material (silicon) to be reacted with ruthenium on the surface of the silicon oxide film 24 and on the side walls of the holes 26. Accordingly, no ruthenium silicide is formed by the heat treatment. The thickness of the ruthenium silicide film 36 is adjusted by, for example, controlling the thickness of the ruthenium film 35. In this step, the unreacted ruthenium film 35 can be removed by selective etching.

Referring next to FIG. 47(d), the surface of the ruthenium silicide film 36 is spontaneously oxidized to form a barrier film 37 like the case of the barrier film 27 of the embodiment 1. Like in the embodiment 1, the barrier film 37 is an oxide film of ruthenium silicide.

Referring next to FIG. 47(e), a ruthenium film 38 is formed like the ruthenium film 28 of the embodiment 1. Further, like in the embodiment 1, the silicon oxide film 31 is buried in the holes 26 and is etched back. The ruthenium film 38 on the silicon oxide film 24 is then removed. Here, the ruthenium film 35 for forming the ruthenium silicide is also removed. Thus, the number of steps is decreased. The lower electrodes 32 of the capacitors are thus formed (FIG. 47(f)).

The subsequent steps are the same as those of the embodiment 1 and will not be described again.

According to this embodiment, the ruthenium silicide film 36 is formed on the whole surfaces of the plugs 21 exposed on the bottoms of the openings (holes 26), and the contact resistance decreases between the plugs 21 and the lower electrodes 32. This increases the contact area that contributes to the electric conduction between the plugs 21 and the lower electrodes 32. Even when the upper surface of the plug 21 is not sufficiently exposed due to the deviation of the mask, the ruthenium silicide film 36 is formed on the side walls, too, of the plugs 21 exposed by the perforation in the silicon oxide film 17. This helps decrease the electric resistance in the contact regions between the plugs 21 and the lower electrodes 32.

Besides, since the silicide film is formed on the bottoms only of the openings (holes 26) in a self-aligned manner, it is acceptable to selectively remove the unreacted ruthenium film 35 by etching.

Further, the ruthenium silicide film 36 and the barrier film 37 are formed on the bottoms of the openings (holes 26) in a self-aligned manner, making it possible to form the lower electrodes 32 without greatly constricting the diameter of the holes 26, and they can be effectively utilized as regions for forming the capacitor-insulating films and the upper electrode at a subsequent step.

Embodiment 3.

Figure 48A:
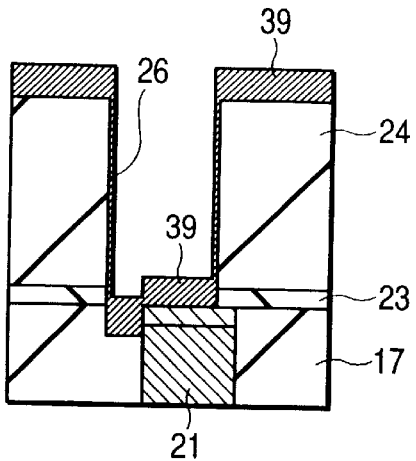
FIGS. 48(a) to 48(c) are sectional views illustrating steps in the production of the DRAM according to an embodiment 3 of this invention in the order of steps.
Figure 48B:
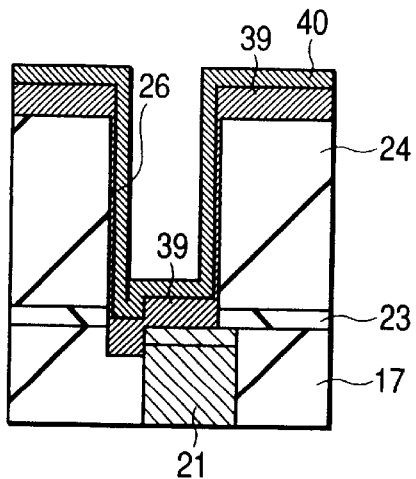
Figure 48C:
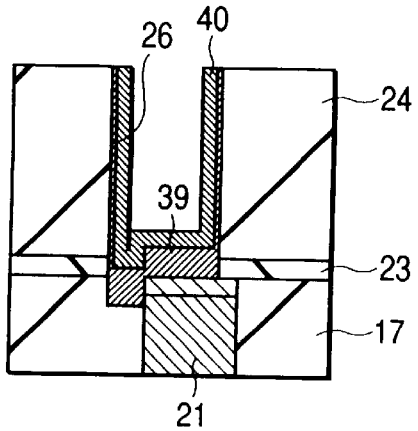

FIGS. 48(a) to 48(c) are sectional views illustrating the method of producing a DRAM according to a further embodiment of the invention in the order of steps.

In the method of producing a DRAM according to this embodiment, the holes 26 are formed in the same manner as in FIGS. 32 to 35 of the embodiment 1, and, then, a titanium nitride film 39 is formed by sputtering as shown in FIG. 48(a) Due to the sputtering method, the titanium nitride film 39 is thickly formed-on the bottoms of the holes 26 and on the surface of the silicon oxide film 24, but almost no film is formed on the sidewalls of the holes 26. The titanium nitride film 39 functions as a barrier like the barrier films 27 and 37 in the embodiments 1 and 2.

Referring next to FIG. 48(b), a ruthenium film 40 is formed like the ruthenium film 28 of the embodiment 1. Then, the silicon oxide film 31 is buried in the holes 26 like in the embodiment 1 and is etched back. The ruthenium film 40 on the silicon oxide film 24 is removed. Here, the titanium nitride film 39 is removed, too. This decreases the number of steps. The lower electrodes 32 of the capacitors are thus formed (FIG. 48(c)).

The subsequent steps are the same as those of the embodiment 1, and will not be described again.

According to this embodiment, the barrier film (titanium nitride film 39) having a small resistance is formed to a sufficiently large thickness while suppressing an increase in the element resistance.

Besides, the barrier film is formed based upon a highly directive sputtering method. Namely, the barrier film is not formed, or is formed very thinly, on the side walls of the openings (holes 26), permitting the openings to be effectively utilized as regions for forming the capacitor elements.

As a modified embodiment, further, the ruthenium silicide film 36 that is formed in a self-aligned manner may be applied as explained with reference to the embodiment 2. The effects are as describe above.

In this embodiment, the titanium nitride film 39 is left even at the time of depositing the ruthenium film 40. However, the titanium nitride film 39 remaining on the side walls of the openings (holes 26) may be removed by wet-etching. In this case, the openings can be more effectively utilized as regions for forming capacitor elements.

Figure 49A:
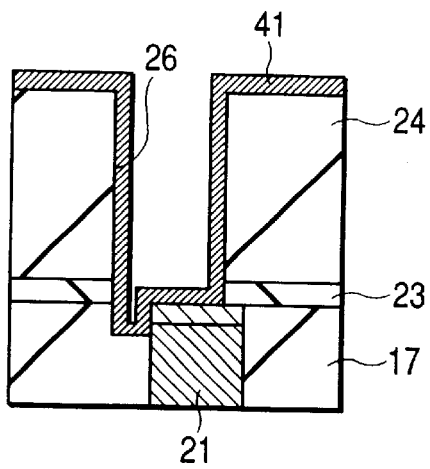
FIGS. 49(a) to 49(d) are sectional views illustrating other steps in the production of the DRAM according to the embodiment 3 of this invention in the order of steps.
Figure 49D:
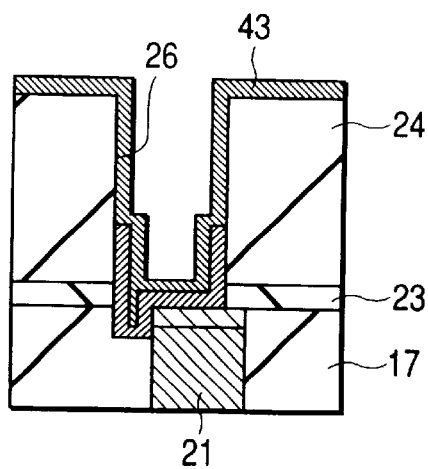
Figure 49B:
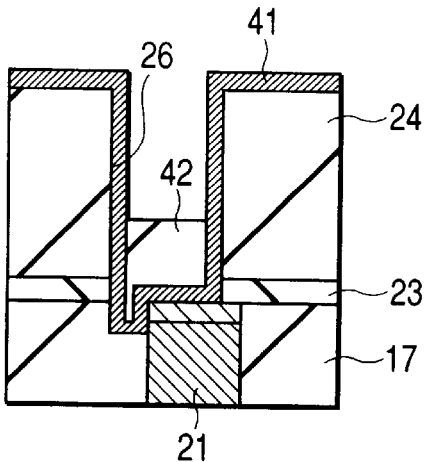
Figure 49C:
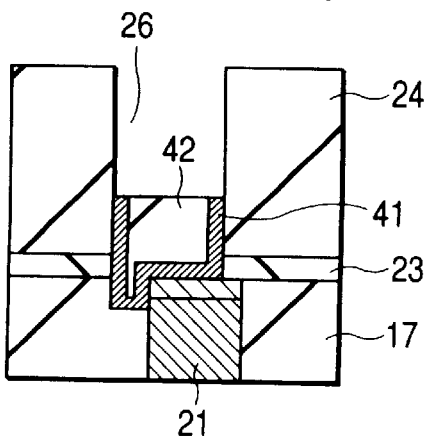

Referring to FIGS. 49(a) to 49(d), further, a titanium nitride film 41 may be left on the bottoms only of the holes 26. Namely, referring to FIG. 49(a), the titanium nitride film 41 is deposited in the hole 26 by the CVD method. The titanium nitride film 41 is formed even on the side walls of the holes 26 since it is formed by the CVD method. Then, as shown in FIG. 49(b), an SOG film or an insulating film 42 of resist is formed so as to remain on the bottoms of the holes 26. The insulating film 42 is formed by depositing a film so as to be buried in the holes 26 and then by etching back. Thereafter, the exposed titanium nitride film 41 is selectively etched by wet-etching or isotropic dry-etching (FIG. 49(c) Referring next to FIG. 49(d), the ruthenium film 43 that serves as the lower electrode is formed by the CVD method. The subsequent steps are the same as those described earlier. This method does not cause the diameter of the holes 26 to decrease, and facilitates the formation of lower electrodes, dielectric and upper electrode.

Embodiment 4.

FIGS. 50(a) to 50(j) are sectional views illustrating a method of producing a DRAM according to a still further embodiment of this invention in the order of steps.

Figure 50A:
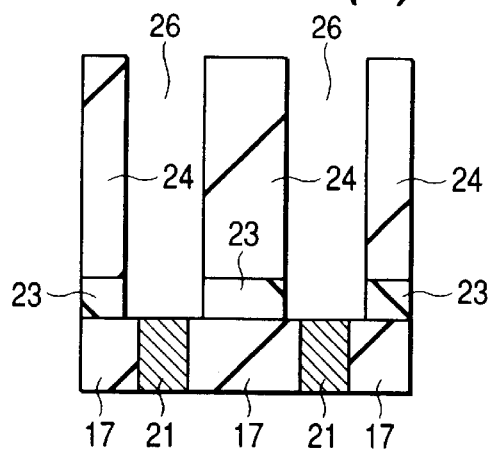
FIGS. 50(a) to 50(j) are sectional views illustrating steps in the production of the DRAM according to an embodiment 4 of this invention in the order of steps.
Figure 50D:
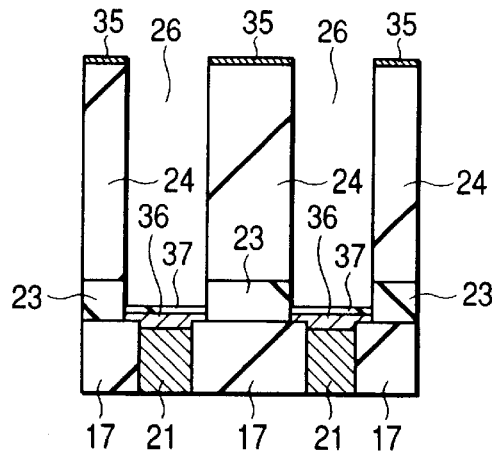
Figure 50B:
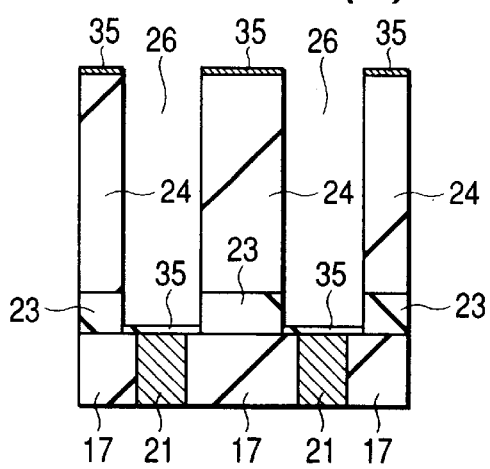

The method of producing the DRAM according to this embodiment is nearly the same as that of up to the step of FIG. 47(d) of the embodiment 2. That is, referring to FIG. 50(a), plugs 21 are formed in the insulating film 17, and the holes 26 are formed after the silicon nitride film 23 and the silicon oxide film 24 have been formed. Then, as shown in FIG. 50(b), the ruthenium film 35 is formed by sputtering and, as shown in FIG. 50(c), the whole surface is heat-treated to cause the ruthenium film 35 to react with the plugs 21 of silicon thereby to form the ruthenium silicide film 36. Then, as shown in FIG. 50(d), the surface of the ruthenium silicide film 36 is spontaneously oxidized to form the barrier film 37. The steps up to this point are the same as those of the embodiment 2. The barrier film 37 may be a titanium nitrite film formed by sputtering, as explained with reference to embodiment 3.

Figure 50E:
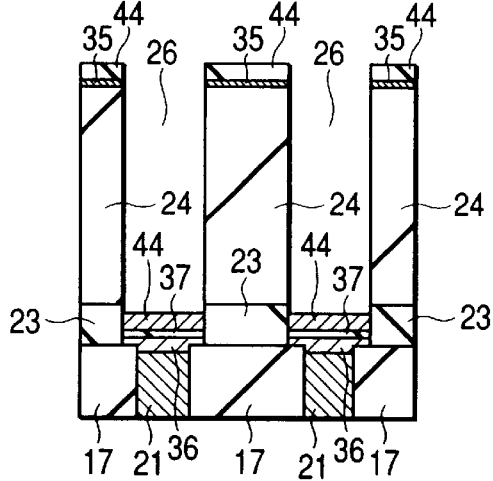
Figure 50C:
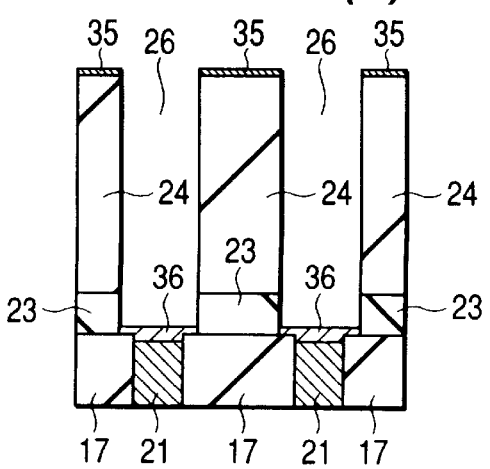

Referring next to FIG. 50(e), a ruthenium film 44 is formed by sputtering. Due to the directive sputtering method, the ruthenium film 44 is thickly formed on the bottoms of the holes 26 and on the silicon oxide film 24, but is almost not formed on the side walls of the holes 26. The ruthenium film 44 is not absolutely necessary and may not be formed as in the embodiment 2.

Figure 50F:
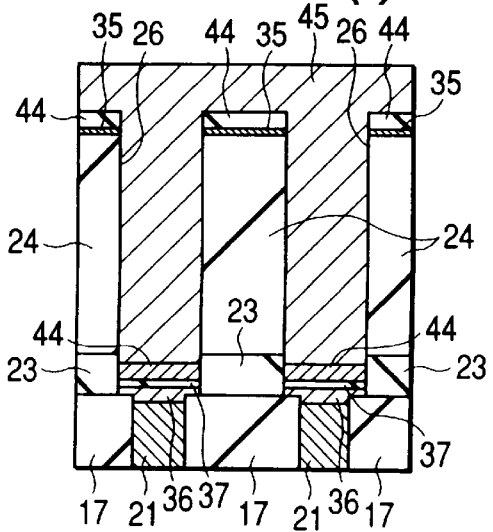

Referring next to FIG. 50(f), a ruthenium film 45 is formed so as to be buried in the holes 26. The ruthenium film 45 is deposited by the CVD method.

Figure 50G:
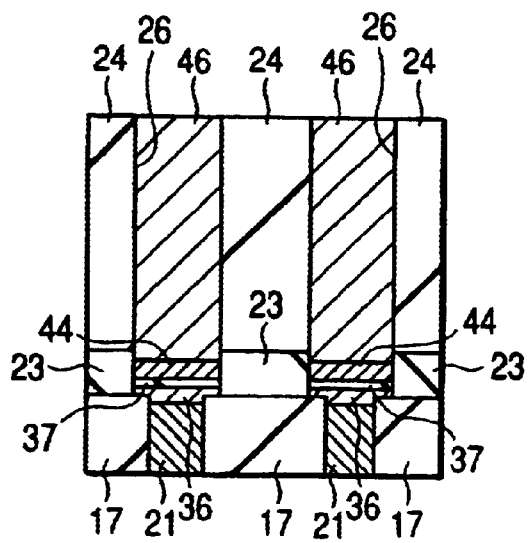

Referring next to FIG. 50(g), the ruthenium films 45, 44 and 35 on the silicon oxide film 24 are removed except for the regions of the holes 26 by polishing based on the CMP method. Therefore, the ruthenium film 45 remains being buried in the holes 26 only. The thus filled ruthenium film 45 serves as the lower electrodes 46 of the capacitors.

Figure 50I:
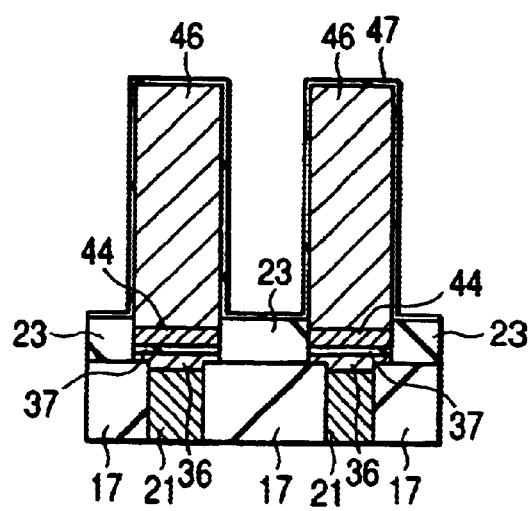
Figure 50H:
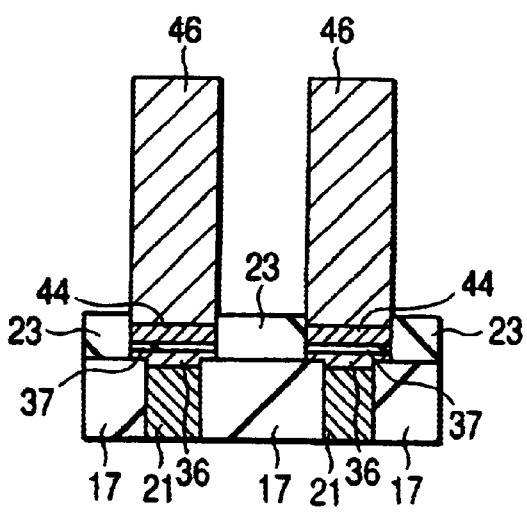

Referring next to FIG. 50(h), the silicon oxide film 24 is removed by wet-etching. The side surfaces of the lower electrodes 46 are thus exposed. In effecting the etching, the silicon nitride film 23 works as an etching stopper. In effecting the etching, the silicon oxide film 24 is left on the peripheral circuit regions to improve the flatness of the interlayer-insulating film formed on the capacitors. Further, the silicon nitride film 23 remaining on the bottom portions of the lower electrodes 46 prevents the lower electrodes 46 from falling, improves the reliability of the capacitors, and improves the yield of the DRAM.

Figure 50J:
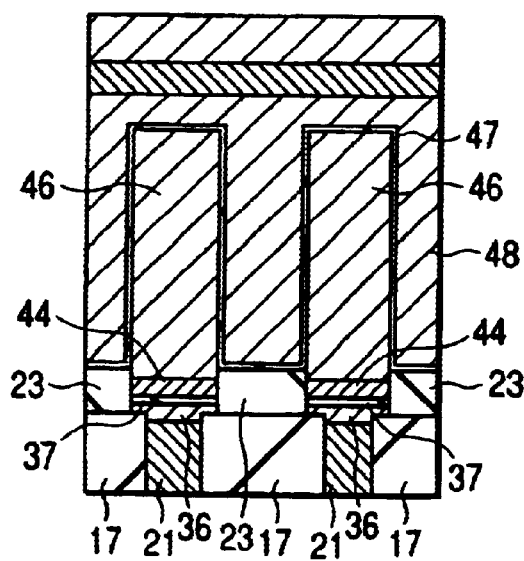

Referring next to FIG. 50(i), a capacitor insulating film 47 is formed, and an upper electrode 48 is formed as shown in FIG. 50(j). The capacitor-insulating film 47 and the upper electrode 48 are the same as those of the embodiment 1 and will not be described here again.

In this embodiment, the lower electrode 46 is formed by the ruthenium film having a large thickness making it possible to decrease the electric resistance of the electrode and to maintain reliability in the electric conduction between the plug 21 and the lower electrode 46. This is further effective in uniformalizing the film property on the surface of the lower electrode 46 that lies under the capacitor-insulating film 47.

In this embodiment, it is also possible to apply the buried ruthenium silicide 22 explained in the embodiment 1 or to apply the barrier films 27, 37 which are the oxide films explained in the embodiments 1 and 2, as a matter of course. In these cases, the effects are as described above.

Embodiment 5.

This embodiment deals with a structure in which the plugs 21 of silicon used in the above embodiments 1 to 4 are replaced by the plugs of ruthenium, and a method of producing the same.

FIGS. 51(a) to 51(h) are sectional views illustrating a method of producing the DRAM of this embodiment in the order of steps.

Figure 51A:
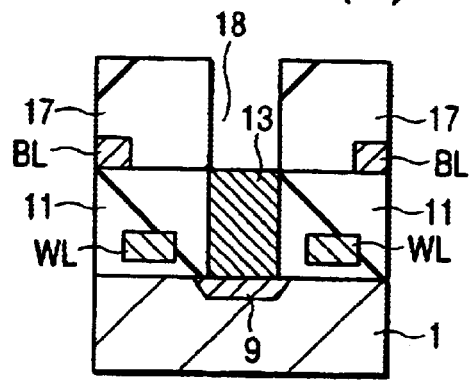
FIGS. 51(a) to 51(h) are sectional views illustrating steps in the production of a DRAM according to an embodiment 5 of this invention in the order of steps.

Referring to FIG. 51(a), a MISFET is formed on the main surface of a semiconductor substrate 1 as in the embodiment 1. In this step, word lines WL and an n-type semiconductor region 9 are formed. The MISFET is covered with a silicon oxide film 11, and a plug 13 of polycrystalline silicon is formed in the silicon oxide film 11. Further, bit lines BL are formed and an insulating film 17 is formed to cover the bit lines BL. Then, a through hole 18 is formed in the insulating film 17 (FIG. 51(a)). The members such as the semiconductor substrate 1, word lines WL, n-type semiconductor region 9, silicon oxide film 11, plug 13, bit lines BL, insulating film 17, and through hole 18, are the same as those described in the embodiment 1.

Figure 51B:
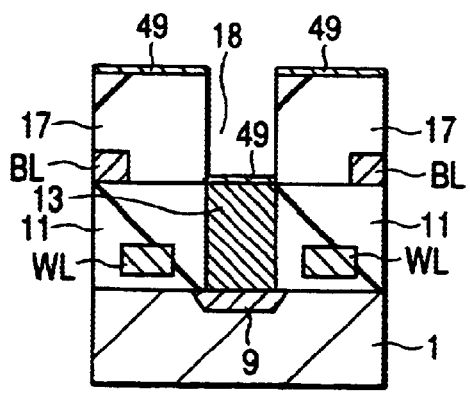

Referring next to FIG. 51(b), a ruthenium film 49 is formed by the directive sputtering method. Due to the s uttering method, the ruthenium film 49 is formed on the bottom of the through hole 18 and on the surface of the insulating film 17, but is almost not formed on the side wall of the through hole 18.

Figure 51C:
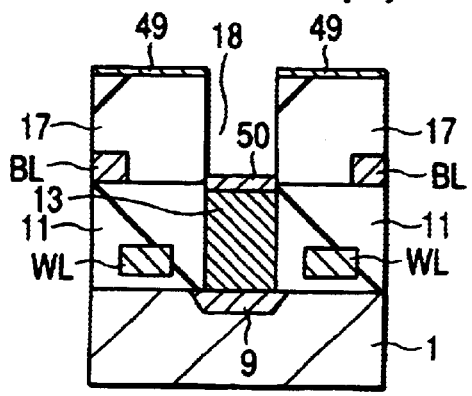

Referring next to FIG. 51(c), the heat treatment is conducted at, for example, 700° C. for 60 seconds. This forms a ruthenium silicide film 50 on the plug 13 in the bottom of the through hole 18. Thereafter, as in the embodiment 1, spontaneous oxidation is conducted to form a barrier layer (not shown) which is an oxide film of ruthenium silicide on the surface of the ruthenium silicide film 50.

Figure 51D:
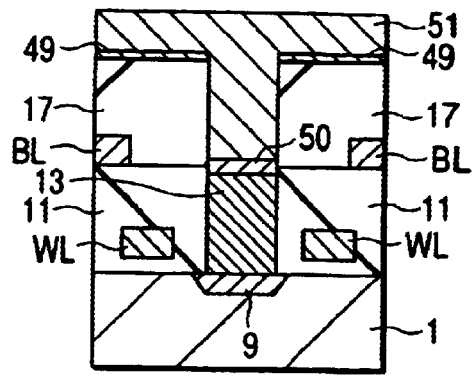

Referring next to FIG. 51(d), a ruthenium film 51 is formed by the CVD method. The ruthenium film 51 is so formed as to be completely buried in the through hole 18.

Figure 51E:
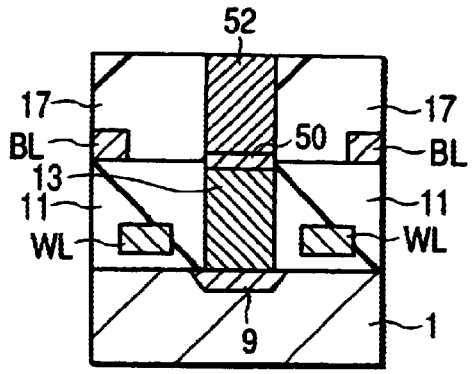

Referring next to FIG. 51(e), the ruthenium film 51 on the insulating film 17 is removed. The ruthenium film 51 is removed so that ruthenium remains in the through hole 18. Thus, there is formed a plug 52 of ruthenium.

Figure 51F:
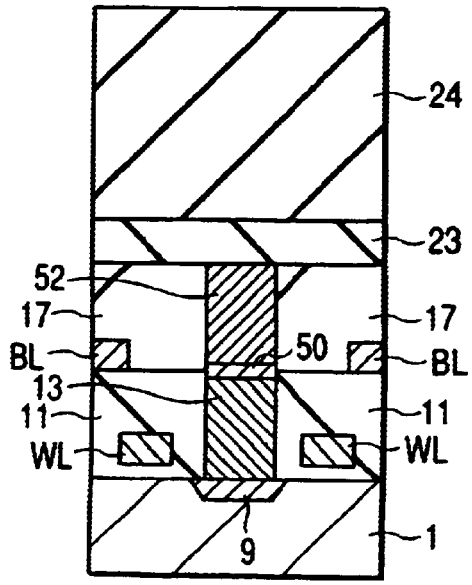
Figure 51G:
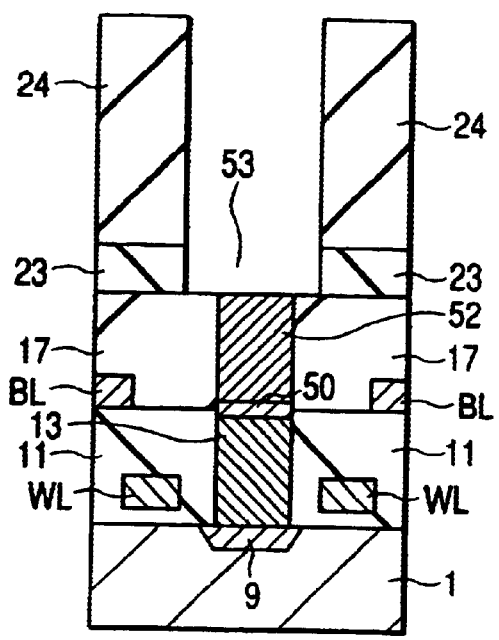

Then, a silicon nitride film 23 and a silicon oxide film 24 are formed on the insulating film 17 (FIG. 51(f)) like in the embodiment 1, and a hole 53 is perforated so as to be connected to the plug 52 of ruthenium (FIG. 51 (a)). The hole 53 is perforated in the same manner as the hole 26 in the embodiment 1.

Figure 51H:
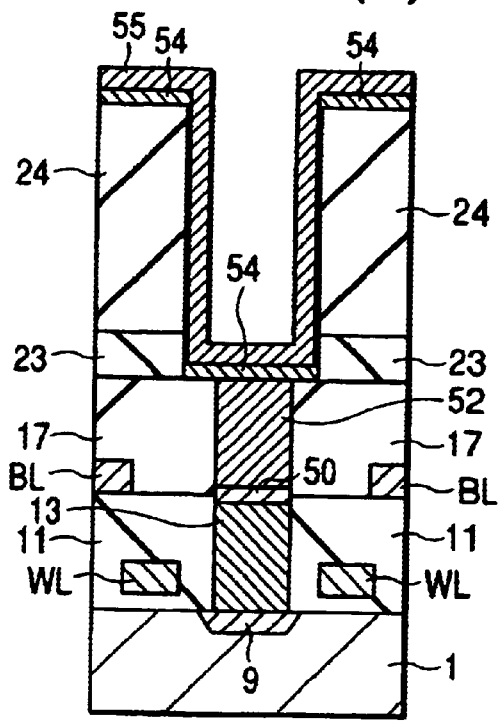

Referring next to FIG. 51(h), a ruthenium film 54 is formed by sputtering and a ruthenium film 55 is formed by CVD. The ruthenium films 54 and 55 form the lower electrode of the capacitor. The subsequent steps are the same as those of the embodiment 1.

According to this embodiment, the ruthenium silicide film 50 is formed on the surface of the silicon plug 13, and the plug 52 disposed on the side of the lower electrode is formed of ruthenium. Therefore, the capacitor-insulating film is isolated from the ruthenium silicide, and the ruthenium silicide is not oxidized by the diffusion of an oxidizing agent (e.g., oxygen) during the heat treatment of the capacitor-insulating film. That is, a distance is maintained between the capacitor-insulating film (dielectric film) and the structure under the barrier film, and oxygen must migrate a large distance from the lower surface of the lower electrode. Therefore, the probability of oxidation of the structure under the barrier film is more reliably avoided.

Figure 52:
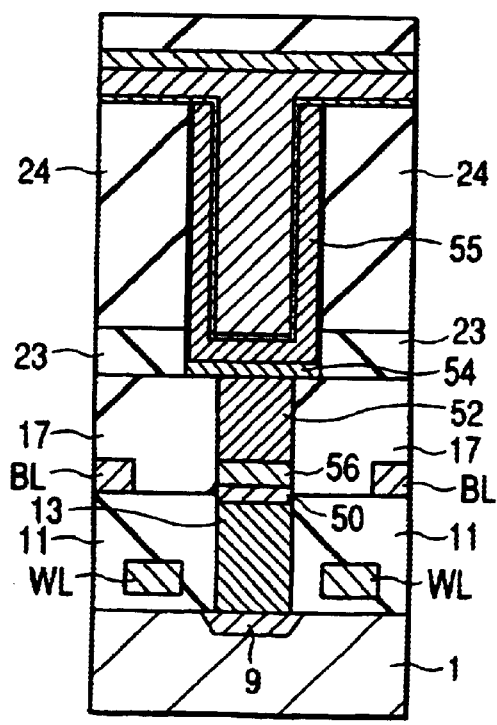
FIG. 52 is a sectional view illustrating another step in the production of the DRAM according to the embodiment 5 of this invention.

Referring to FIG. 52, a tungsten nitride film 56 may be formed between the silicide ruthenium film 50 and the ruthenium plug 52. The tungsten nitride film 56 works as a barrier film for preventing the diffusion of silicon. In this case, there is no need of forming the spontaneously oxidized film on the ruthenium silicide film 50. It is also possible to use titanium nitride instead of tungsten nitride.

Though the invention accomplished by the present inventors was concretely described above reference to various embodiments, it should be noted that the invention is in no way limited to the above embodiments only but can be changed and modified in a variety of ways without departing from the spirit and scope of the invention.

In the above embodiments, for example, the lower polycrystalline silicon plugs were utilized as a source of feeding silicon when the silicide film was formed in a self-aligned manner. Not being limited thereto only, however, a noncrystalline silicon film may be formed on the inner wall of the opening, in advance, and may be used as a source of feeding silicon.

Figure 53A:
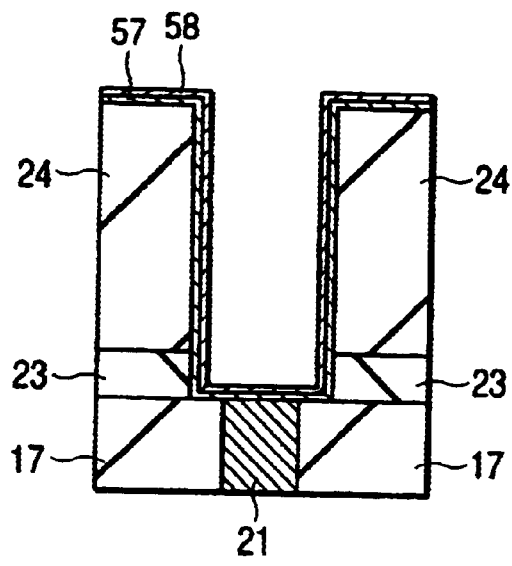
FIGS. 53(a) to 53(c) are sectional views illustrating steps in the production of a DRAM according to a further embodiment of this invention in the order of steps.
Figure 53C:
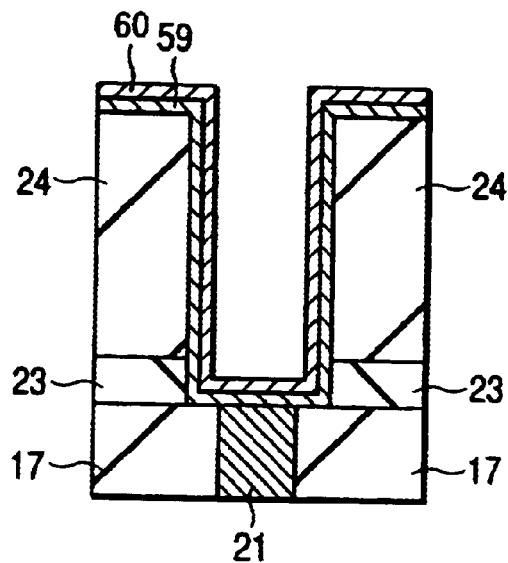
Figure 53B:
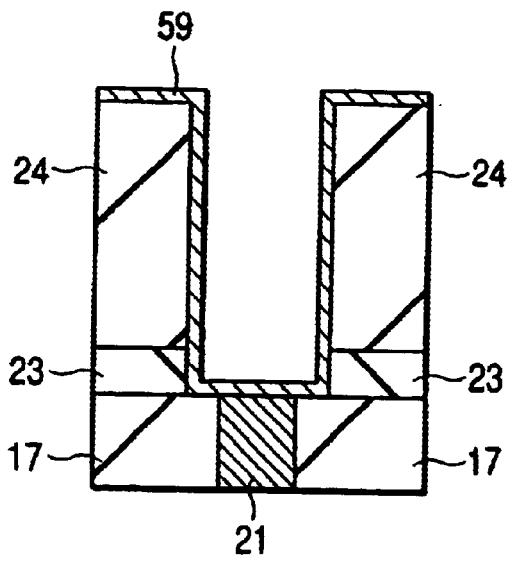

That is, referring to FIG. 53(a), an amorphous silicon film 57 is formed in the hole and, then, a ruthenium film 58 is formed. These films are heat-treated so as to be converted into a silicide-thereby to form ruthenium silicide film 59 (FIG. 53(b)).

Figure 54:
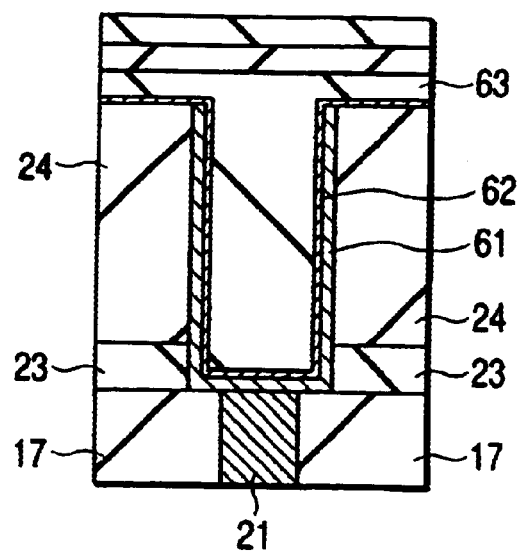
FIG. 54 is a sectional view illustrating another step in the production of the DRAM according to the embodiment of FIGS. 53(a) to 53(c)

Thereafter, a ruthenium film 60 is formed, and the ruthenium film 60 and the ruthenium silicide film 59 are used as the lower electrode. Here, the ruthenium film 60 need not be formed, but the ruthenium silicide film 59 only may be used as the lower electrode. That is, referring to FIG. 54, the ruthenium silicide is applied to the lower electrode 61, and a tantalum oxide film is used as the capacitor-insulating film. Further, a titanium film may be used as the upper electrode 63. The titanium nitride film may be formed by CVD, and another titanium nitride film may be formed thereon by sputtering.

Figure 55A:
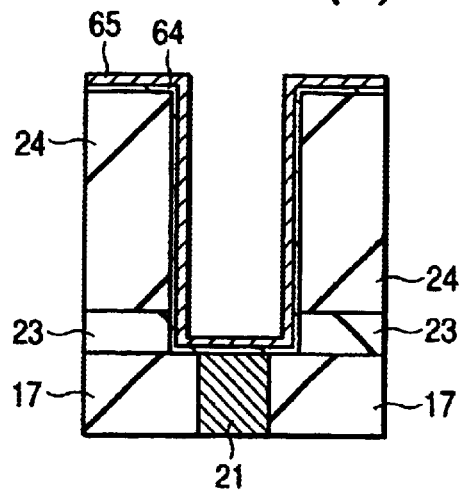
FIGS. 55(a) to 55(c) are sectional views illustrating steps in the production of a DRAM according to a further embodiment of this invention in the order of steps.
Figure 55B:
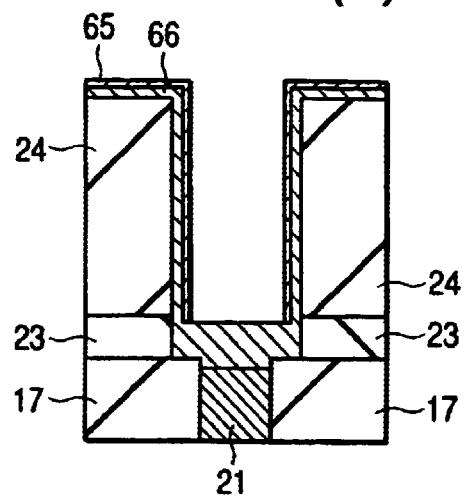
Figure 55C:
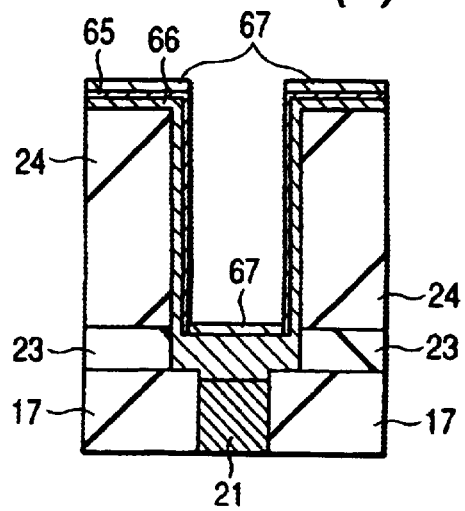

Referring to FIGS. 55(a) to 55(c), further, an amorphous silicon film 64 is thinly formed (e.g., 5 nm), a ruthenium film 65 is thickly formed (e.g., 15 nm) (FIG. 55(a)), and the ruthenium film 65 is partly left on a ruthenium silicide film 66 after the heat treatment for converting the films into a silicide thereof (FIG. 55(b)). Thereafter, the ruthenium film 67 is formed by sputtering (FIG. 55(c)) so as to be applied to the lower electrode.

Figure 56A:
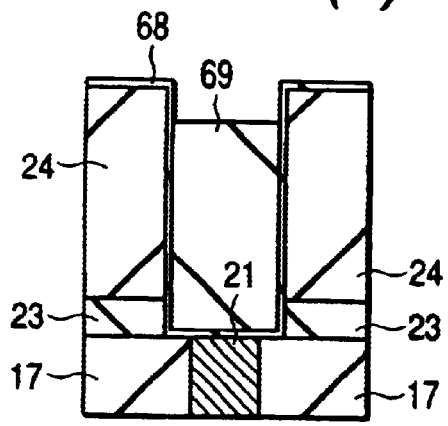
FIGS. 56(a) to 56(f) are sectional views illustrating steps in the production of a DRAM according to a further embodiment of this invention in the order of steps.
Figure 56D:
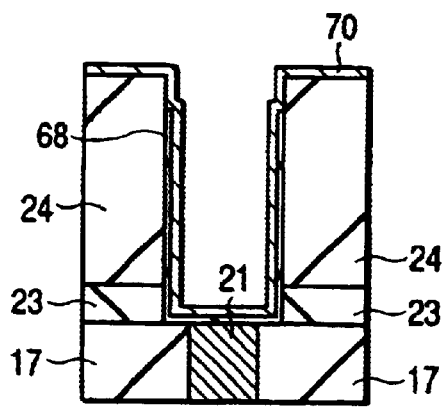
Figure 56B:
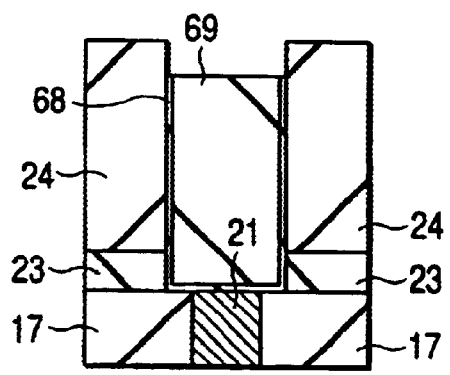
Figure 56E:
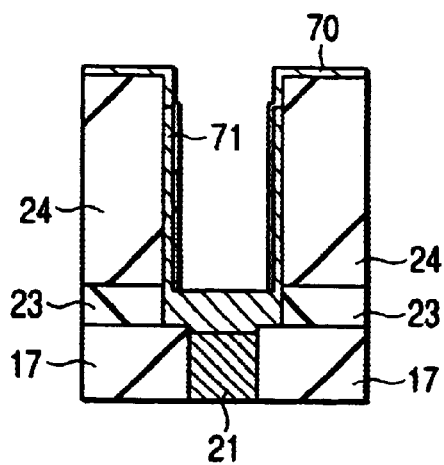
Figure 56C:
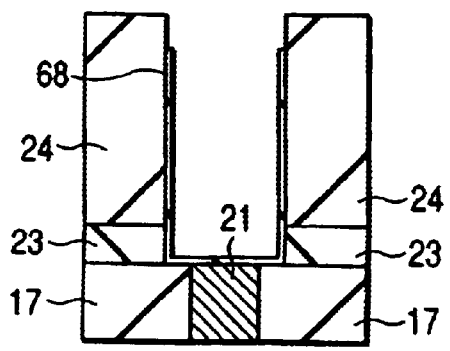
Figure 56F:
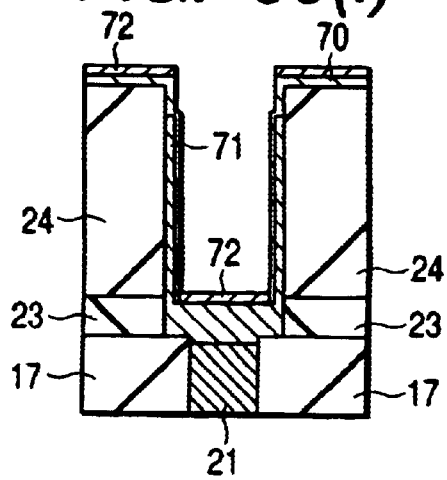
Figure 57A:
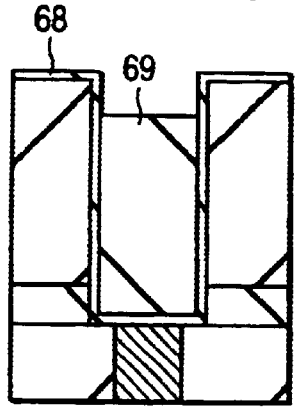
FIGS. 57(a) to 57(h) are sectional views illustrating steps in the production of a DRAM according to a further embodiment of this invention in the order of steps.
Figure 57D:
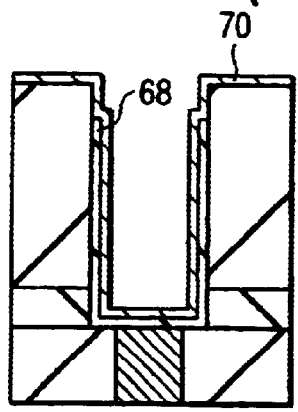
Figure 57G:
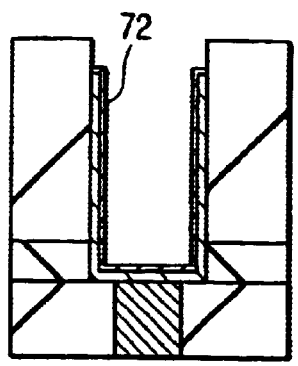
Figure 57B:
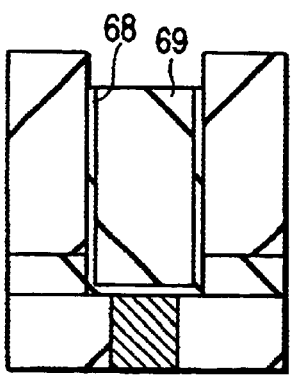
Figure 57E:
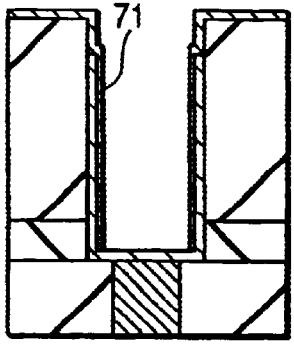
Figure 57H:
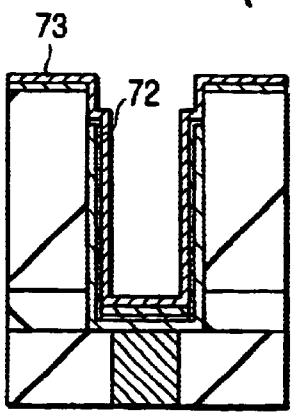
Figure 57C:
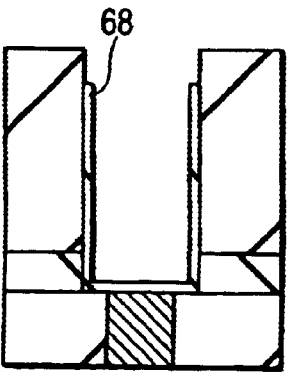
Figure 57F:
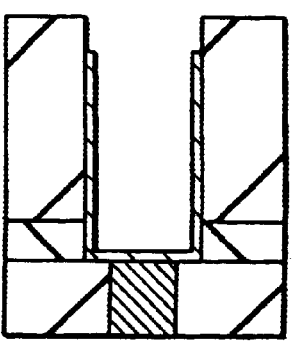
Figure 58A:
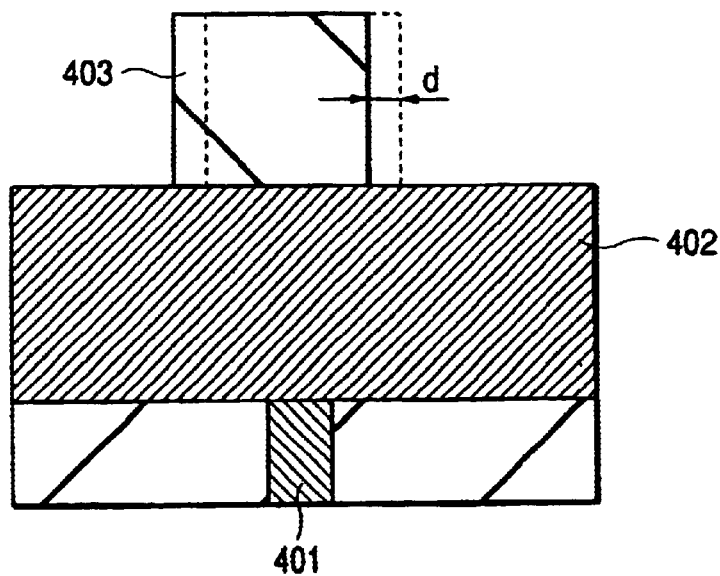
FIGS. 58(a) to 58(c) are sectional views illustrating a problem to which this invention is directed.
Figure 58B:
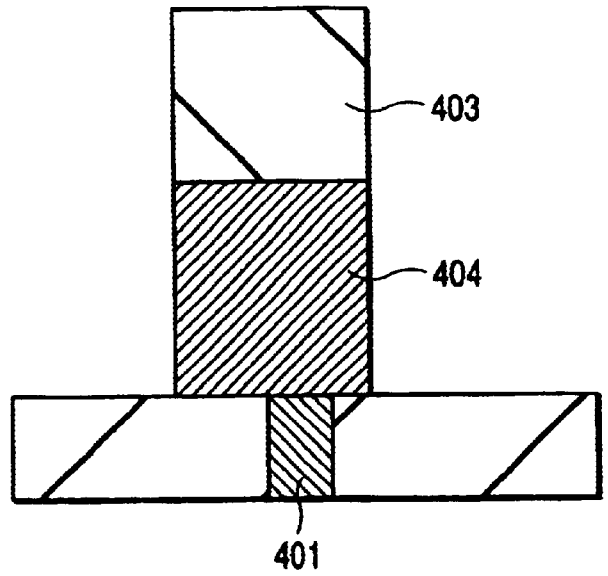
Figure 58C:
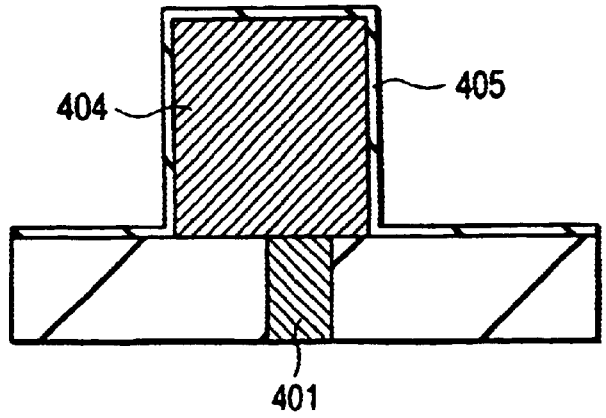
Figure 59A:
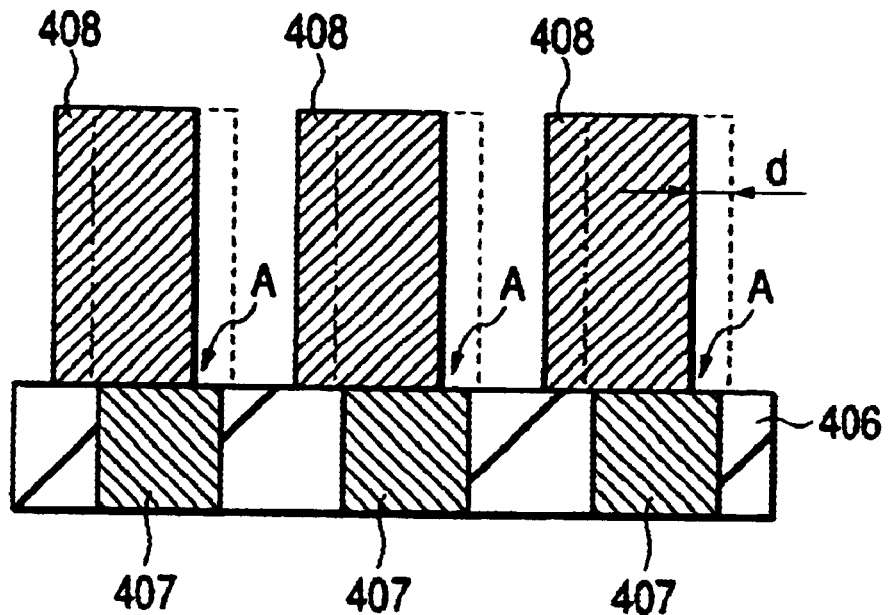
FIGS. 59(a) and 59(b) are sectional views illustrating a problem to which this invention is directed.
Figure 59B:
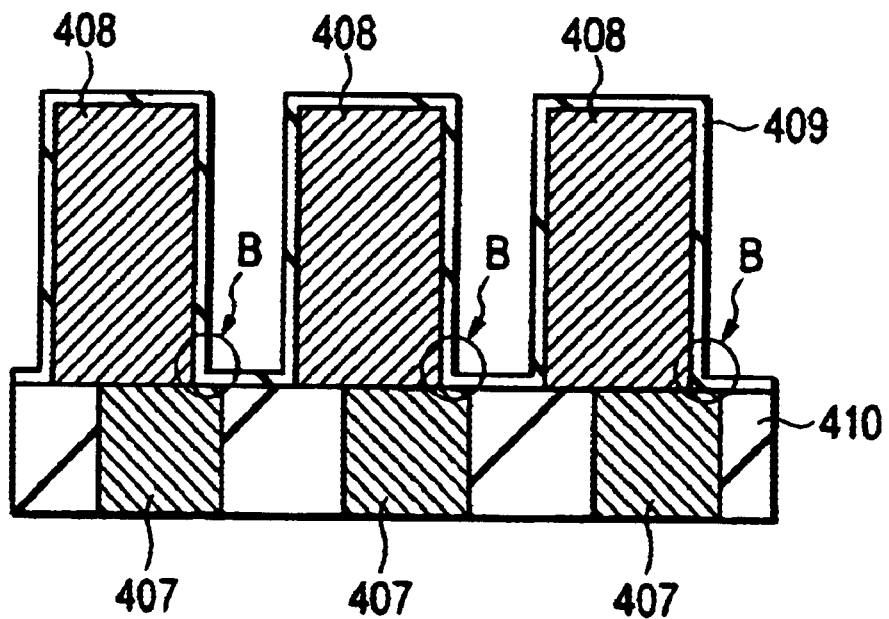
Figure 60A:
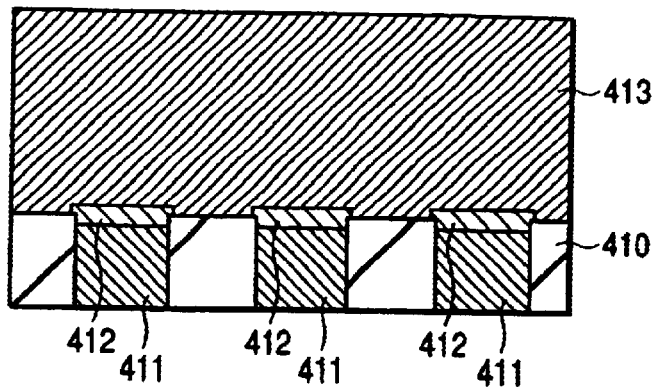
FIGS. 60(a) to 60(c) are sectional views illustrating a problem to which this invention is directed.
Figure 60B:
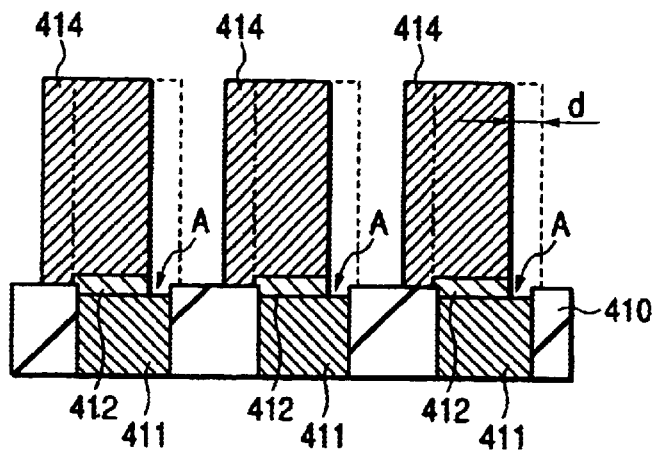
Figure 60C:
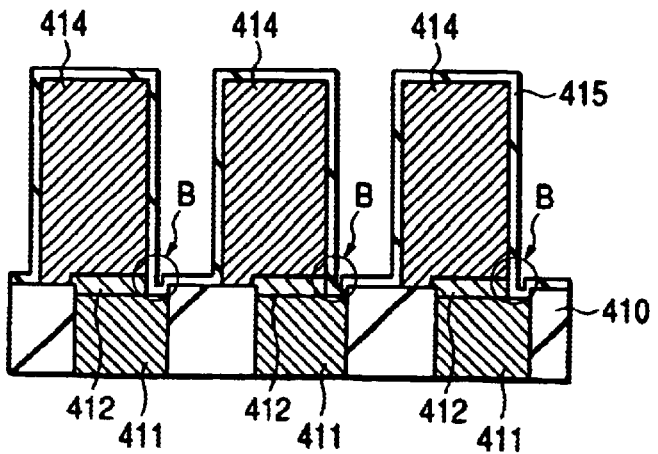

Or, as shown in FIGS. 56(a) to 56(f), an amorphous silicon film 68 is formed, the bottom of the hole is covered with, for example, a resist 69 (FIG. 56(a)), the etching is effected in the presence of the resist 69 to remove the exposed amorphous silicon film 68 (FIG. 56(b)) and, after the resist 69 is removed (FIG. 56(c)), a ruthenium film 70 is deposited (FIG. 56(d)). Thereafter, the heat treatment is effected to convert the film into a ruthenium silicide film 71 (FIG. 56(e)), and a ruthenium film 72 is formed by sputtering and is applied to the lower electrode (FIG. 56(f)). In this case, the ruthenium silicide does not come into contact with the capacitor-insulating film, contributing to improving the reliability of the capacitor.

In the cases of FIGS. 53(a) to 56(f), a barrier layer which is an oxide film can be formed on the surfaces of the exposed ruthenium silicide as a matter of course.

Or, as shown in FIGS. 57(a) to 57(h), an amorphous silicon film is formed in the hole (opening), and a metal film is formed thereon and is converted into a silicide thereof, thereby to form a silicide film even on the side walls of the opening so as to serve as an underlayer for the barrier film. That is., like in the case of FIGS. 56(a) to 56(e), an amorphous silicon film 68 and a resist 69 are formed in the hole (FIG. 57(a)), the exposed amorphous silicon film 68 is removed (FIG. 57(b)), and, after the resist 69 is removed (FIG. 57(c)), a ruthenium film 70 is deposited (FIG. 57(d)). A metal such as cobalt or titanium may be used instead of ruthenium. Thereafter, the heat treatment is effected to covert the film into a ruthenium silicide film 71 (FIG. 57(e)). The unreacted ruthenium film 70 is selectively removed (FIG. 57(f)) and, then, a barrier film 72 such as a titanium nitride film is formed (FIG. 57(g)), followed by the formation of a ruthenium film 73 by sputtering and CVD so as to be applied to the lower electrode (FIG. 57(h)).

In the foregoing embodiments, ruthenium silicide was used as the silicide film. It is, however, also acceptable to use titanium silicide or cobalt silicide.

In the foregoing embodiments, further, an oxide film of ruthenium silicide or a titanium nitride film was u sed as the barrier film. Not being limited thereto only, however, it is also acceptable to use an oxide film of titanium silicide or cobalt silicide, or tungsten nitride.

Further, the oxidation for forming the oxide film of silicide need not be limited to spontaneous oxidation, but may be any one of various known methods, such as a wet oxidation method, a heat oxidation method and the like method. In this case, it is necessary to form an oxide film of a small thickness to permit the flow of a tunnel current to maintain the electric conduction of the element.

Though ruthenium was exemplified as a material of the lower electrode, it is also acceptable to use platinum instead. Different metals may be selected for being deposited by spluttering and CVD. Upon forming a metal on the bottom of the opening by highly directive sputtering, the thickness of the lower electrode film becomes large on the bottom of the opening compared to that on the side wall of the opening.

The capacitor-insulating film (dielectric film) need not be limited to a tantalum oxide film, but may be a laminated layer of tantalum oxide films, a laminated layer of a tantalum oxide film and a strontium barium titanate (BST) film, or a single layer or a laminated layer of one or plural kinds of a tantalum oxide film, BST film, barium titanate film and strontium titanate film. Upon laminating plural capacitor-insulating films, it is possible to relax the concentration of the electric field at the grain boundaries due to nonuniform thickness of the films and, hence, to improve the reliability of the capacitor-insulating film, to improve the breakdown voltage and to decrease the leakage current. Upon laminating the tantalum oxide film and the BST film, it is possible to utilize a high dielectric constant of the BST film and to decrease the leakage utilizing the tantalum oxide film. In this case, the tantalum oxide film is formed first and is crystallized by heat treatment, in order to decrease the thermal burden exerted on the BST film.

In reforming the capacitor-insulating film (dielectric film) by heat treatment in an oxidizing atmosphere, further, the reforming can be accomplished at a low temperature by effecting the heat treatment in an atmosphere which is more oxidizing than the treatment with a plasma in ozone or in an oxidizing atmosphere.

Further, the upper electrode need not be limited to a ruthenium film, but may be a titanium nitride film.

In order to decrease the resistance of the element, further, an electrically conducting film, such as a tungsten film may be formed on the upper electrode (ruthenium), the tungsten film having an electric resistance smaller than that of the film that constitutes the upper electrode.

Briefly described below are the effects obtained by representative examples of the invention disclosed in this application.

(1) There is provided a semiconductor integrated circuit device having a structure in which, even when the lower electrode of the capacitor is formed so as to be deviated from the underlying plug, the dielectric (capacitor-insulating film) formed later does not come into contact with the underlying plug.

(2) The lower electrode is formed of ruthenium in a three-dimensional manner to increase the surface area of the capacitor and to increase the dielectric constant of the capacitor-insulating film, in order to maintain a desired capacity of the capacitor.

(3) The capacitor-insulating film is formed so as to be divided into plural layers in order to lengthen the life of the capacitor before it breaks down and to decrease drop-out bits of the memory cells. This enhances the reliability of the semiconductor integrated circuit.

What is claimed is:

1. A method of producing a semiconductor integrated circuit device having a semiconductor region on a main surface of a semiconductor substrate and having a capacitor element that includes a first electrode, a dielectric film and a second electrode on the main surface, comprising the steps of:

(a) forming the semiconductor region on the main surface of the semiconductor substrate;
   (b) forming a first insulating film on the semiconductor region;
   (c) forming a first electric conductor in the first insulating film;
   (d) forming a second insulating film on the first insulating film;
   (e) forming an opening in the second insulating film to expose part of the first electric conductor on the bottom of the opening;
   (f) forming a barrier film on the surface of the first electric conductor in the opening;
   (g) forming the first electrode in the opening so as to be electrically connected to the semiconductor region through the barrier film and the first electric conductor;
   (h) forming the dielectric film on the first electrode;
   (i) heat-treating the dielectric film in an oxidizing atmosphere; and
   (j) forming the second electrode on the dielectric film.

2. A method of producing a semiconductor integrated circuit device according to claim 1, further comprising the step of forming a MISFET having a gate electrode, a source region and a drain region on the main surface of the semiconductor substrate, and wherein the semiconductor region is either the source region or the drain region of the MISFET formed on the main surface of the semiconductor substrate.

3. A method of producing a semiconductor integrated circuit device according to claim 1, wherein the second insulating film is constituted by a first insulating film and a second insulating film formed on, the first insulating film, and the step of forming the opening in the step (e) includes the steps of:

etching the second insulating film under a condition where the rate of etching the second insulating film is larger than the rate of etching the first insulating film; and
   etching the first insulating film on the bottom in the opening formed in the second insulating film.

4. A method of producing a semiconductor integrated circuit device according to claim 3, wherein the first insulating film is constituted by a silicon nitride and the second insulating film is constituted by a silicon oxide.

5. A method of producing a semiconductor integrated circuit device according to claim 1, wherein the first electric conductor is constituted by an electrically conducting film containing silicon, and (k) provision is further made of the step of forming a silicide film on the first electric conductor exposed on the bottom in the opening.

6. A method of producing a semiconductor integrated circuit device according to claim 5, wherein the step of forming the silicide film further includes the steps of:

forming a metal film on the first electric conductor exposed on the bottom of the opening; and
   converting the metal film into a silicide thereof through a heat treatment.

7. A method of producing a semiconductor integrated circuit device according to claim 6, wherein the metal film is constituted by ruthenium, titanium or cobalt.

8. A method of producing a semiconductor integrated circuit device according to claim 1, wherein the step of forming the first electric conductor in the step (c) further includes the steps of:

forming an opening in the first insulating film;
   forming an electrically conducting connection member comprising silicon as a main component in the opening; and
   forming a silicide film on the electrically conducting connection member.

9. A method of producing a semiconductor integrated circuit device according to claim 8, wherein the silicide film is constituted by ruthenium silicide, titanium silicide or cobalt silicide.

10. A method of producing a semiconductor integrated circuit device according to claim 8, wherein the step of forming the barrier film in the step (f) includes the step of oxidizing the surface of the first electric conductor exposed on the bottom in the opening.

11. A method of producing a semiconductor integrated circuit device according to claim 5, wherein the step of forming the barrier film in the step (f) further includes the step of oxidizing the silicde film.

12. A method of producing a semiconductor integrated circuit device according to claim 1, wherein the step of forming the barrier film in the step (f) further includes the step of forming a barrier film in the opening by a sputtering method or by a CVD method.

13. A method of producing a semiconductor integrated circuit device according to claim 12, wherein the barrier film is constituted by titanium nitride, tungsten nitride, tungsten nitride silicide, titanium nitride silicide or tantalum nitride silicide.

14. A method of producing a semiconductor integrated circuit device according to claim 1, wherein the step of forming the first electrode in the step (g) further includes the steps of:

forming a first metal film in the opening by a sputtering method; and
   forming a second metal film on the first metal film by a CVD method.

15. A method of producing a semiconductor integrated circuit device according to claim 14, wherein the first and second metal films are constituted by ruthenium or platinum.

16. A method of producing a semiconductor integrated circuit device according to claim 14, wherein, in forming the first electrode in the step (g), the thicknesses of the first and second metal films are so adjusted as to reflect the shape of dent of the opening such that the dent remains in the upper surface thereof, and the dielectric film and the second electrode are formed on the first electrode that includes inner wall of the dent.

17. A method of producing a semiconductor integrated circuit device according to claim 3, wherein provision is further made of the step of:

(m) exposing the side walls of the first electrode by removing, by etching, the second insulating film surrounding the first electrode under such a condition that the rate of etching the second insulating film is larger than the rate of etching the first insulating film; and wherein,
   the dielectric film is formed even on the side wall of the first electrode exposed through the step (m) in the step (h).

18. A method of producing a semiconductor integrated circuit device according to claim 1, wherein the step (h) further includes the step of heat treatment for crystallizing the dielectric film.

19. A method of producing a semiconductor integrated circuit device according to claim 1, wherein provision is further made of the step of:
(n) heat-treating the dielectric film in a nonoxidizing atmosphere prior to the step (i).

20. A method of producing a semiconductor integrated circuit device according to claim 19, wherein the dielectric film is constituted by a tantalum oxide film, and the heat-treating temperatures in the steps (i) and (n) are in a range of from 500 to 750° C.

21. A method of producing a semiconductor integrated circuit device according to claim 1, wherein the step (h) further includes the steps of:
forming a tantalum oxide film on the first electrode;
heat-treating the tantalum oxide film in a nonoxidizing atmosphere; and
forming a second dielectric film on the tantalum oxide film after the heat treatment.

22. A method of producing a semiconductor integrated circuit device according to claim 21, wherein the second dielectric film is a tantalum oxide film or a barium strontium titanate film.

23. A method of producing a semiconductor integrated circuit device according to claim 1, wherein the dielectric film is constituted by a laminate of plural dielectric films.

24. A method of producing a semiconductor integrated circuit device according to claim 1, wherein the dielectric film is constituted by a single-layer film or a plural-layer film of one kind or plural kinds selected from a tantalum oxide film, a titanium oxide film, a barium strontium titanate film, a barium titanate film, and a strontium titanate film.

25. A method of producing a semiconductor integrated circuit device according to claim 1, wherein the second electrode is constituted by ruthenium or titanium nitride.

26. A method of producing a semiconductor integrated circuit device having a semiconductor region on a main surface of a semiconductor substrate and having a capacitor element that includes a first electrode, a dielectric film and a second electrode on the main surface, comprising the steps of:
(a) forming the semiconductor region on the main surface of the semiconductor substrate;
(b) forming a first insulating film on the semiconductor region;
(c) forming a first electric conductor comprised of an electrically conducting film including silicon, in the first insulating film;
(d) forming a second insulating film on the first insulating film;
(e) forming an opening in the second insulating film to expose part of the first electric conductor on the bottom of the opening;
(f) forming a barrier film on the surface of the first electric conductor in the opening; wherein the barrier film is comprised of titanium nitride, tungsten nitride, tungsten nitride silicide, titanium nitride silicide or tantalum nitride silicide;
(g) forming the first electrode in the opening so as to be electrically connected to the semiconductor region through the barrier film and the first electric conductor;
(h) forming the dielectric film on the first electrode;
(i) heat-treating the dielectric film in an oxidizing atmosphere; and
(j) forming the second electrode on the dielectric film.

27. A method of producing a semiconductor integrated circuit device according to claim 26, further comprising the step of:
(k) forming a silicide film on the first electric conductor exposed on the bottom in the opening.

28. A method of producing a semiconductor integrated circuit device having a memory cell that includes a MISFET and a capacitor element over a main surface of a semiconductor substrate, comprising the steps of:
(a) forming a MISFET over the main surface of the semiconductor substrate;
(b) forming a first insulating film over the semiconductor region;
(c) forming, in the first insulating film, an electric conductor including silicon, that electrically connects to the source or drain regions of the MISFET;
(d) forming a second insulating film over the first insulating film;
(e) forming an opening in the second insulating film to expose a part of the electric conductor on the bottom of the opening;
(f) forming a barrier film on the surface of the first electric conductor in the opening by oxidizing the surface of the electric conductor;
(g) forming, in the opening, a lower electrode of the capacitor element having a ruthenium film;
(h) forming, over the ruthenium film, a dielectric film of the capacitor element; and
(i) forming, over the dielectric film, an upper electrode of the capacitor element.

29. A method of producing a semiconductor integrated circuit device having a memory cell that includes a MISFET and a capacitor element over a main surface of a semiconductor substrate, comprising the steps of:
(a) forming a MISFET over the main surface of the semiconductor substrate;
(b) forming a first insulating film over the semiconductor region;
(c) forming, in the first insulating film, an electric conductor including silicon, that electrically connects to the source or drain regions of the MISFET;
(d) forming a second insulating film over the first insulating film;
(e) forming an opening in the second insulating film to expose part of the electric conductor on the bottom of the opening;
(f) forming a barrier film comprised of titanium nitride on the surface of the first electric conductor in the opening;
(g) forming, in the opening, a lower electrode of the capacitor element comprised of ruthenium;
(h) forming, over the ruthenium film, a dielectric film of the capacitor element; and
(i) forming, over the dielectric film, an upper electrode of the capacitor element.

30. A method of producing a semiconductor integrated circuit device having a memory cell that includes a MISFET and a capacitor element over a main surface of a semiconductor, comprising the steps of:

(a) forming a MISFET over the main surface of the semiconductor substrate;
(b) forming a first insulating film over the semiconductor region;
(c) forming, in the first insulating film, a first electric conductor including silicon, that electrically connects to a source or drain region of the MISFET;
(d) forming a second insulating film over the first insulating film;
(e) forming a first opening in the second insulating film to expose a part of the first electric conductor;
(f) forming a ruthenium silicide film on the first electric conductor;
(g) forming a second electric conductor comprised of ruthenium in the first opening;
(h) forming a third insulating film over the second insulating film;
(i) forming a second opening in the third insulating film to expose a part of the second electric conductor;
(j) forming, in the second opening, a lower electrode of the capacitor element comprised of ruthenium;
(k) forming, over the lower electrode, a dielectric film of the capacitor element; and
(l) forming, over the dielectric film, an upper electrode of the capacitor element.

31. A method of producing a semiconductor integrated circuit device according to claim 30 wherein step(f) includes the steps of:
(f1) forming a ruthenium film on the first electric conductor by a directive sputtering method; and
(f2) conducting a heat treatment to form the ruthenium silicide.

32. A method of producing a semiconductor integrated circuit device according to claim 30, wherein the second electric conductor is formed by a chemical vapor disposition method in the step (g).

* * * * *